(12) United States Patent
Takahashi et al.

(10) Patent No.: US 11,056,463 B2
(45) Date of Patent: Jul. 6, 2021

(54) ARRANGEMENT OF PENETRATING ELECTRODE INTERCONNECTIONS

(71) Applicant: SONY CORPORATION, Tokyo (JP)

(72) Inventors: Hiroshi Takahashi, Kanagawa (JP); Tomofumi Arakawa, Tokyo (JP); Minoru Ishida, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/528,883

(22) PCT Filed: Dec. 11, 2015

(86) PCT No.: PCT/JP2015/084760
§ 371 (c)(1),
(2) Date: May 23, 2017

(87) PCT Pub. No.: WO2016/098691
PCT Pub. Date: Jun. 23, 2016

(65) Prior Publication Data
US 2017/0317061 A1    Nov. 2, 2017

(30) Foreign Application Priority Data

Dec. 18, 2014 (JP) ............................. JP2014-256047
Dec. 3, 2015 (JP) ............................. JP2015-236452

(51) Int. Cl.
*H01L 21/768* (2006.01)
*H01L 23/48* (2006.01)
(Continued)

(52) U.S. Cl.
CPC .......... *H01L 25/0657* (2013.01); *G06F 12/00* (2013.01); *G11C 5/00* (2013.01);
(Continued)

(58) Field of Classification Search
CPC ............ H01L 21/76898; H01L 23/481; H01L 23/528; H01L 25/0657; H01L 27/14634;
(Continued)

(56) References Cited

U.S. PATENT DOCUMENTS 5,304,812 A * 4/1994 Tani .................. G05B 19/0423
250/551
8,563,403 B1 * 10/2013 Farooq ............. H01L 21/76898
438/459
(Continued)

FOREIGN PATENT DOCUMENTS

CN       102959417        3/2013
JP       2009-295750 A    12/2009
(Continued)

OTHER PUBLICATIONS

International Search Report prepared by the Japan Patent Office dated Feb. 15, 2016, for International Application No. PCT/JP2015/084760.

(Continued)

*Primary Examiner* — Eduardo A Rodela
*Assistant Examiner* — Christopher M Roland
(74) *Attorney, Agent, or Firm* — Sheridan Ross P.C.

(57) ABSTRACT

The present technology relates to a semiconductor apparatus, a production method, and an electronic apparatus that enable semiconductor apparatuses to be laminated and the laminated semiconductor apparatuses to be identified. A semiconductor apparatus that is laminated and integrated with a plurality of semiconductor apparatuses, includes a first penetrating electrode for connecting with the other semiconductor apparatuses and a second penetrating electrode that connects the first penetrating electrode and an internal device, the second penetrating electrode being arranged at a position that differs for each of the laminated (Continued)

semiconductor apparatuses. The second penetrating electrode indicates a lamination position at a time of lamination. An address of each of the laminated semiconductor apparatuses in a lamination direction is identified by writing using external signals after lamination. The present technology is applicable to a memory chip and an FPGA chip.

20 Claims, 27 Drawing Sheets

(51) Int. Cl.
| | |
|---|---|
| H01L 23/528 | (2006.01) |
| H01L 25/10 | (2006.01) |
| H01L 23/485 | (2006.01) |
| H01L 25/065 | (2006.01) |
| H01L 25/18 | (2006.01) |
| G11C 5/00 | (2006.01) |
| G11C 29/00 | (2006.01) |
| G11C 5/02 | (2006.01) |
| H01L 25/07 | (2006.01) |
| G06F 12/00 | (2006.01) |
| G11C 7/16 | (2006.01) |
| H01L 27/146 | (2006.01) |
| H04N 5/378 | (2011.01) |
| H01L 25/11 | (2006.01) |
| G11C 5/06 | (2006.01) |
| G11C 7/10 | (2006.01) |
| G11C 8/10 | (2006.01) |
| H01L 27/118 | (2006.01) |
| H03K 19/0175 | (2006.01) |
| H04N 5/907 | (2006.01) |
| H04N 5/225 | (2006.01) |
| H04N 5/77 | (2006.01) |
| H01L 23/482 | (2006.01) |
| H01L 25/075 | (2006.01) |
| H01L 25/04 | (2014.01) |

(52) U.S. Cl.
CPC ............... *G11C 5/02* (2013.01); *G11C 5/025* (2013.01); *G11C 5/06* (2013.01); *G11C 7/1012* (2013.01); *G11C 7/16* (2013.01); *G11C 8/10* (2013.01); *G11C 29/00* (2013.01); *G11C 29/70* (2013.01); *H01L 21/76898* (2013.01); *H01L 23/481* (2013.01); *H01L 23/528* (2013.01); *H01L 25/07* (2013.01); *H01L 25/117* (2013.01); *H01L 25/18* (2013.01); *H01L 27/118* (2013.01); *H01L 27/146* (2013.01); *H01L 27/14634* (2013.01); *H01L 27/14636* (2013.01); *H03K 19/017581* (2013.01); *H04N 5/378* (2013.01); *H04N 5/907* (2013.01); H01L 21/76897 (2013.01); H01L 23/48 (2013.01); H01L 23/485 (2013.01); H01L 23/4824 (2013.01); H01L 23/4825 (2013.01); *H01L 25/04* (2013.01); *H01L 25/043* (2013.01); *H01L 25/0756* (2013.01); *H01L 2225/06541* (2013.01); *H01L 2225/06544* (2013.01); *H01L 2225/06565* (2013.01); *H01L 2924/0002* (2013.01); *H04N 5/772* (2013.01); *H04N 2005/2255* (2013.01)

(58) Field of Classification Search
CPC ..... H01L 27/14636; H01L 2225/06541; H01L 23/48; H01L 23/4824; H01L 23/485; H01L 25/043; H01L 25/0756; H01L 25/117; H01L 2225/06544; H03K 19/017581; G11C 5/02; G11C 5/06; G11C 7/1012
See application file for complete search history.

(56) References Cited

U.S. PATENT DOCUMENTS

| | | | | |
|---|---|---|---|---|
| 2002/0180030 | A1* | 12/2002 | Oyama | H01L 23/5382 257/700 |
| 2009/0001602 | A1* | 1/2009 | Chung | H01L 21/76898 257/777 |
| 2009/0014891 | A1* | 1/2009 | Chang | H01L 21/6835 257/777 |
| 2010/0182041 | A1* | 7/2010 | Feng | H01L 21/76898 326/38 |
| 2010/0225002 | A1* | 9/2010 | Law | H01L 21/76898 257/774 |
| 2010/0276572 | A1* | 11/2010 | Iwabuchi | H01L 23/481 250/208.1 |
| 2011/0016266 | A1 | 1/2011 | Asano et al. | |
| 2011/0186936 | A1 | 8/2011 | Iwamatsu et al. | |
| 2012/0241981 | A1* | 9/2012 | Hirano | H01L 23/522 257/777 |
| 2013/0135004 | A1* | 5/2013 | Hashimoto | G01R 31/318513 324/762.03 |
| 2014/0049280 | A1* | 2/2014 | Kim | H01L 23/481 324/754.19 |
| 2014/0062587 | A1* | 3/2014 | Koyanagi | H01L 24/48 327/595 |
| 2015/0270307 | A1 | 9/2015 | Umebayashi et al. | |

FOREIGN PATENT DOCUMENTS

| | | |
|---|---|---|
| JP | 2011-159889 A | 8/2011 |
| JP | 2012-146784 | 8/2012 |
| JP | 2014-099582 A | 5/2014 |

OTHER PUBLICATIONS

Official Action (with English translation) for Chinese Patent Application No. 201580063785.X, filed Dec. 20, 2018, 16 pages.
Official Action (no English translation available) for Japanese Patent Application No. 2016-564822, dated Dec. 19, 2019, 5 pages.
Official Action (with English translation) for Chinese Patent Application No. 201580063785.X, dated Sep. 25, 2019, 18 pages.

* cited by examiner

ARRANGEMENT OF PENETRATING ELECTRODE INTERCONNECTIONS

CROSS REFERENCE TO RELATED APPLICATIONS

This application is a national stage application under 35 U.S.C. 371 and claims the benefit of PCT Application No. PCT/JP2015/084760 having an international filing date of 11 Dec. 2015, which designated the United States, which PCT application claimed the benefit of Japanese Patent Application No. 2014-256047 filed 18 Dec. 2014, and Japanese Patent Application No 2015-236452 filed 3 Dec. 2015, the disclosures of which are incorporated herein by reference in their entirety.

TECHNICAL FIELD

The present technology relates to a semiconductor apparatus, a production method, and an electronic apparatus, more particularly, to a semiconductor apparatus obtained by laminating and integrating devices such as a memory, a logic circuit, and an FPGA (Field-Programmable Gate Array), a production method, and an electronic apparatus.

BACKGROUND ART

Semiconductor apparatuses such as a memory are desired to be made compact in view of yields and package sizes, and a semiconductor device obtained by electrically connecting and integrating segmentalized semiconductor chips is already mass-produced.

Such a semiconductor apparatus is realized as a developed variation of mainly a package technology, and a method of connecting via an electrode on a chip side wall, a method of connecting via a silicon interposer, a method of connecting via a penetrating electrode, and the like are exemplified as an application example.

In a case where chips are electrically connected via an external input/output terminal, a method of laminating after measurement and good-product sorting can be taken, so a yield of an integrated product can be prevented from lowering. However, since an impedance of the input/output terminal and protection device is large, lowering of a velocity and an increase of power consumption become a problem. Moreover, since a layout area is also large, a chip area to become a waste also increases.

Also in a case of bonding chips, mount for which highly-accurate positioning has been performed needs to be performed for the number of times obtained by multiplying the number of products by the number of laminations. Therefore, there is a possibility that an assembling throughput may be lowered and costs may be increased.

On the other hand, in recent years, a method of attaching wafers and integrating them to obtain a product is being used (e.g., Patent Literature 1). The greatest advantage in attaching wafers is that by performing highly-accurate positioning at the time of attachment, positioning accuracy of all chips existing within the same wafer is guaranteed.

CITATION LIST

Patent Literature

Patent Literature 1: Japanese Patent Application Laid-open No. 2013-251511

DISCLOSURE OF INVENTION

Technical Problem

However, when there is a defective item in the laminated chips in the case of attaching wafers, there is no method of removing only the defective chip after the lamination. As a result, the entire integrated chips become a defective item.

Generally in a case where wafers are laminated in multilayers, wafers having different mask sets and functions are laminated, and positions and functions of connection through-holes of the wafers are used as specific power supplies and signal lines.

In the case of such a custom design, an optimal design can be made in accordance with functions to be realized, so it is possible to realize a reduction of a device area and an increase of an operation velocity.

However, the custom design device is limited in usage, so it is difficult for many and unspecified users to use the same device for different purposes. For example, in the case of 3-layer lamination, there is a need to create 3 types of mask sets, form device structures that respectively use them in respective wafers, and attach and integrate the wafers. It is difficult to use these mask sets for different purposes. Accordingly, costs of mask sets in device development occupy a large ratio, and thus a reduction of costs is desired.

The present technology has been made in view of the circumstances as described above and aims at enabling array devices that are the same to be created using the same mask set and a 3D network in which the array devices are electrically connected to one another to be realized.

Solution to Problem

A first semiconductor apparatus according to an aspect of the present technology is a semiconductor apparatus that is laminated and integrated with a plurality of semiconductor apparatuses, including: a first penetrating electrode for connecting with the other semiconductor apparatuses; and a second penetrating electrode that connects the first penetrating electrode and an internal device, the second penetrating electrode being arranged at a position that differs for each of the laminated semiconductor apparatuses.

The second penetrating electrode may indicate a lamination position at a time of lamination.

An address of each of the laminated semiconductor apparatuses in a lamination direction may be identified by writing using external signals after lamination.

An address in a lamination direction may be written by external signals using a combination of a fuse or anti-fuse device of the semiconductor apparatus and the second penetrating electrode.

The semiconductor apparatus may be laminated in a wafer state and segmentalized after the first penetrating electrode and the second penetrating electrode are formed.

The semiconductor apparatus may be a memory, and a bit position may be identified by a combination of a Z address indicating a lamination position of each of the laminated semiconductor apparatuses and an XY address used in the memory.

A storage area and a redundant area may be shared by the plurality of laminated semiconductor apparatuses.

The semiconductor apparatus may be an FPGA (Programmable Logic Array), and an arrangement of logic elements for writing a circuit function may be specified by an XY address for specifying a position in the semiconductor apparatus and a Z address for specifying a position among the semiconductor apparatuses.

Wiring arrays in a lamination direction may be connected via a penetrating electrode to which a programmable selection switch is added, and a network connection in a 3D direction may be configured in a logic element unit.

A switch that controls a flow of signals within the semiconductor apparatus and a switch that controls a flow of signals among the laminated semiconductor apparatuses may further be included.

The semiconductor apparatus may be laminated with a semiconductor apparatus in which an external connection terminal and a protection device are formed, the laminated semiconductor apparatuses may be mutually connected by the first penetrating electrode, and the external connection terminal and the protection device may be shared by the plurality of laminated semiconductor apparatuses.

An image pickup device may be laminated, the semiconductor apparatus may be a memory that stores data of signals captured by the image pickup device, the memory may be laminated plurally below the image pickup device, and a processing unit that processes signals from the memories may be laminated below the memories.

A second semiconductor apparatus according to an aspect of the present technology is a semiconductor apparatus including a plurality of planar configurable logic arrays laminated in a direction orthogonal to the plane, the configurable logic arrays each including a logic element, a unit wiring arranged in a longitudinal direction and a lateral direction within the plane, and a first switch that connects and disconnects the unit wiring arranged in the longitudinal direction and the lateral direction, a repeating unit including the logic element, the unit wiring, and the first switch is repetitively arranged in the longitudinal direction and the lateral direction within the plane, in the repeating unit, the configurable logic array further includes a second switch that connects and disconnects the unit wiring in the repeating unit and the unit wiring in the repeating unit, that is included in another configurable logic array adjacent to the configurable logic array in the orthogonal direction, and a logic circuit is configured in a 3D direction constituted of the plane direction and the orthogonal direction via both the first switch and the second switch.

A production method according to an aspect of the present technology is a production method for producing a semiconductor apparatus that is laminated and integrated with a plurality of semiconductor apparatuses, the method including the step of forming a first penetrating electrode for connecting with the other semiconductor apparatuses and a second penetrating electrode that connects the first penetrating electrode and an internal device, the second penetrating electrode being formed at a position that differs for each of the laminated semiconductor apparatuses.

An electronic apparatus according to an aspect of the present technology is an electronic apparatus including a semiconductor apparatus that is laminated and integrated with a plurality of semiconductor apparatuses, the semiconductor apparatus including a first penetrating electrode for connecting with the other semiconductor apparatuses; and a second penetrating electrode that connects the first penetrating electrode and an internal device, the second penetrating electrode being arranged at a position that differs for each of the laminated semiconductor apparatuses.

A third semiconductor apparatus according to an aspect of the present technology is a semiconductor apparatus including: a plurality of laminated semiconductor apparatuses; a data signal line used to transmit/receive data to/from the semiconductor apparatuses; and a control signal line used to transmit/receive an address to/from the semiconductor apparatuses, the data signal line and the control signal line being multiplexed, and a multiplex degree of the data signal line being lower than that of the control signal line.

A chip designation signal line used to transmit/receive a selection signal for selecting a semiconductor apparatus to perform data transmission/reception out of the plurality of semiconductor apparatuses may be further included, the chip designation signal line may be multiplexed, and a multiplex degree of the chip designation signal line may be equal to or lower than that of the control signal line.

Each of the plurality of semiconductor apparatuses may store an address in a lamination direction allocated thereto, and the chip designation signal line may be used to transmit/receive the decoded address in the lamination direction.

The semiconductor apparatus may be a memory, the memory may be laminated in 8 layers, the memories may each be multiplexed by 4, and the memories of 2 layers out of the memories of 8 layers may be driven at the same time.

The semiconductor apparatus may further include, for the data signal line, a first penetrating electrode for connecting with the other semiconductor apparatuses, and a second penetrating electrode for connecting with the first penetrating electrode, the second penetrating electrode being arranged at a position that differs for each of the semiconductor apparatuses to which different data are supplied.

The first semiconductor apparatus according to the aspect of the present technology is a semiconductor apparatus that is laminated and integrated with a plurality of semiconductor apparatuses, including: a first penetrating electrode for connecting with the other semiconductor apparatuses; and a second penetrating electrode that connects the first penetrating electrode and an internal device, the second penetrating electrode being arranged at a position that differs for each of the laminated semiconductor apparatuses.

The second semiconductor apparatus according to the aspect of the present technology is a semiconductor apparatus including a plurality of planar configurable logic arrays laminated in a direction orthogonal to the plane, the configurable logic arrays each including a logic element, a unit wiring arranged in a longitudinal direction and a lateral direction within the plane, and a first switch that connects and disconnects the unit wirings in the longitudinal direction and the lateral direction, a repeating unit including the logic element, the unit wirings, and the first switch is repetitively arranged in the longitudinal direction and the lateral direction within the plane, in the repeating unit, the configurable logic array further includes a second switch that connects and disconnects the unit wirings in the repeating unit and the unit wirings in the repeating unit, that are included in another configurable logic array adjacent to the configurable logic array in the orthogonal direction, and a logic circuit is configured in a 3D direction constituted of the plane direction and the orthogonal direction via both the first switch and the second switch.

The first semiconductor apparatus is produced by the production method.

The electronic apparatus is configured to include the first semiconductor apparatus.

The third semiconductor apparatus according to the aspect of the present technology is a semiconductor apparatus including: a plurality of laminated semiconductor apparatuses; a data signal line used to transmit/receive data to/from the semiconductor apparatuses; and a control signal line used to transmit/receive an address to/from the semiconductor apparatuses, the data signal line and the control signal line being multiplexed, and a multiplex degree of the data signal line being lower than that of the control signal line.

Advantageous Effects of Invention

According to the aspect of the present technology, array devices that are the same can be created using the same mask set, and a 3D network in which the array devices are electrically connected to one another can be realized.

It should be noted that the effects described herein are not necessarily limited, and any effect described in the present disclosure may be obtained.

MODES FOR CARRYING OUT THE INVENTION

Figure 1:
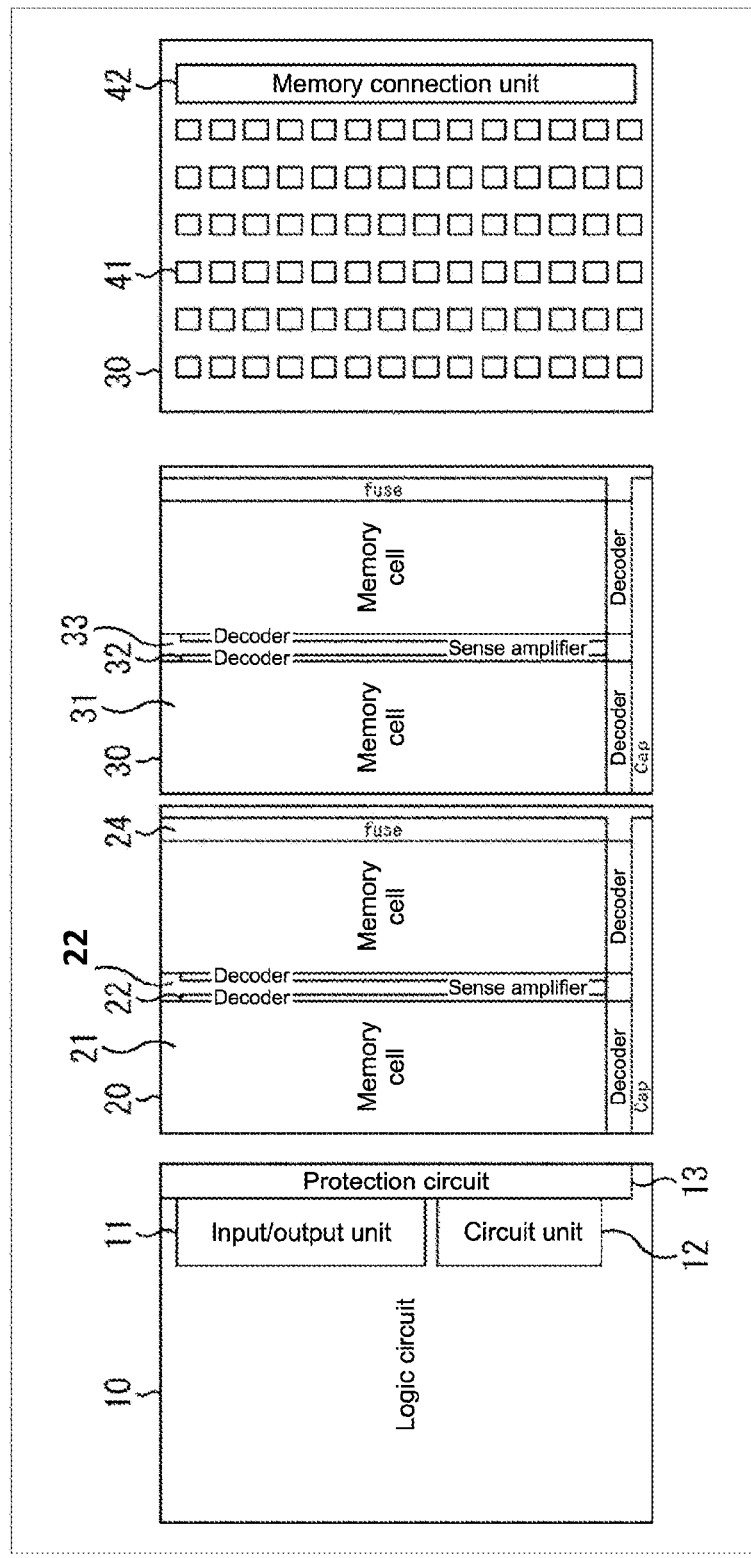
FIG. 1 A diagram for explaining a configuration of a chip to be laminated.

Hereinafter, a mode for embodying the present technology (hereinafter, referred to as embodiment) will be described. It should be noted that descriptions will be given in the following order.
1. Regarding laminated structure
2. Regarding penetrating electrodes
3. Regarding layer discrimination method
4. Regarding address writing
5. Regarding sharing of redundant area
6. Regarding FPGA structure
7. Regarding 3D network
8. Regarding application example
9. Regarding application example (memory)
10. Regarding electronic apparatus
11. Regarding usage example of image pickup apparatus <Regarding Laminated Structure>

According to the present technology, it is possible to provide, in a semiconductor device in which array devices that are the same are created using the same mask set and are electrically connected to one another, a semiconductor apparatus whose arrangement address in a longitudinal (Z-axis) direction of a laminated device is identified by writing of potentials using external signals.

A structure of a device including an array arrangement, such as a memory and a gate array, can use its multilayer structure for scale expansion. Therefore, the same mask set can be shared and used by a plurality of device sets. Here, descriptions will be given while taking a semiconductor apparatus including such a device structure as an example.

Figure 2:
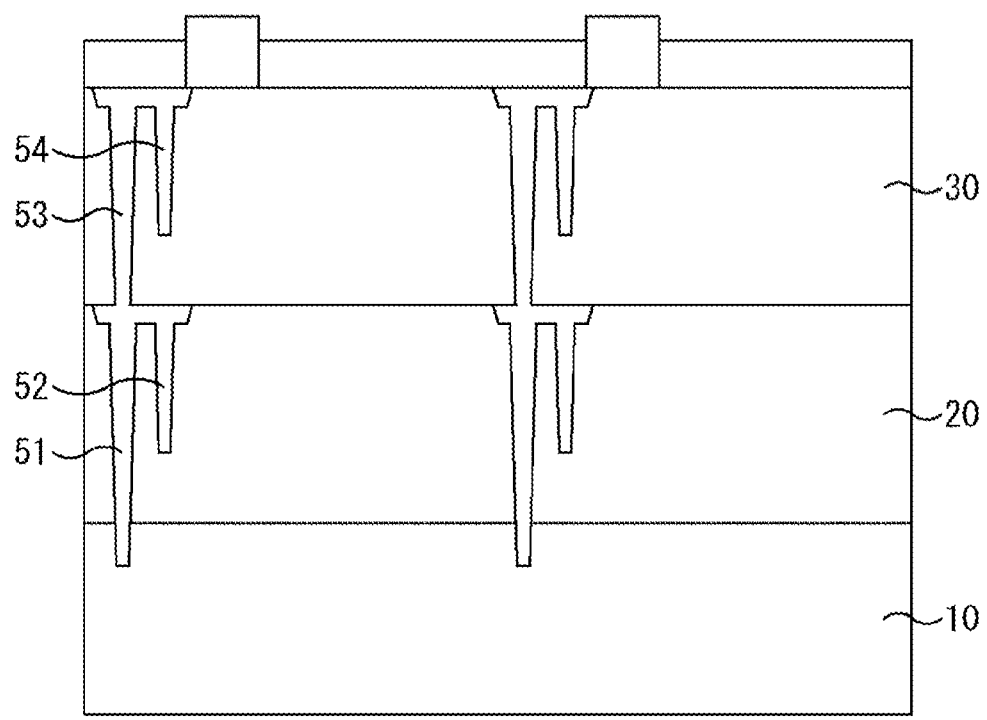
FIG. 2 A diagram for explaining penetrating electrodes.

Referring to FIGS. 1 and 2, a semiconductor apparatus including the device structure described above will be described while taking a case where 3 chips are laminated as an example. As shown in FIG. 1, a logic circuit chip 10, a memory chip 20, and a memory chip 30 are laminated as shown in FIG. 2. An input/output unit 11, a circuit unit 12, an a protection circuit 13, for example, are mounted on the logic circuit chip 10.

The memory chip 20 and the memory chip 30 are each a memory chip such as a DRAM. Memory cells 21 and decoders 22 that read out data from the memory cells 21 are mounted on the memory chip 20, and the decoders 22 are respectively arranged in vertical and horizontal directions as shown in FIG. 1. The memory cells 21 are also provided on left- and right-hand sides in the figure, and the decoders 22 are respectively provided in correspondence with the memory cells 21.

Further, a redundancy fuse device 24 is also mounted on the memory chip 20. A data and control signal writing/reading line of the memory chip 20 is drawn from an external chip via penetrating electrodes (FIG. 2).

The memory chip 20 and the memory chip 30 are chips that have the same configuration and are generated by the same mask. As shown on the right-hand side of FIG. 1, a bump 41 and a memory connection unit 42 are provided on a back surface of the memory chip 30. The bump 41 is provided plurally on the back surface. A processing unit (not shown) is connected via the bumps 41.

Assuming that memory capacities of the memory chip 20 and the memory chip 30 are 500 Mbit per chip, for example, 1 Gbit is obtained when 2 chips are laminated, and 2 Gbit is obtained when 4 chips are laminated. In this way, it is possible to vary the number of layers in accordance with a product specification so as to set a mounting capacity to a desired capacity.

An input/output terminal, a protection circuit of the input/output unit, a test circuit, an address control circuit that controls an address of a laminated chip, and the like are incorporated into a wafer different from the memory (or on back surface of top layer memory), and the wafer of these circuits and the memory body are electrically connected to each other via the penetrating electrodes.

In the examples shown in FIGS. 1 and 2, the memory chip 20 and the memory chip 30 are taken as an example of a case where one mask set can be shared and used by a plurality of device sets.

Such a configuration may be designed by separating it into a wafer in which an input/output terminal and protection device are incorporated, a wafer in which a function unique to a product is incorporated, a wafer in which a plurality of extensible array devices are laminated, and the like.

The input/output wafer and the wafer in which a function unique to a product is incorporated need to be varied in specification for each product and created using different mask sets, but once the size of the semiconductor chip is fixed, the array device portions can all be produced using the same mask set.

The circuit wafer and the memory wafer are formed by different wafer processes, and an electrical connection unit is formed after being attached and integrated.

There is a problem to be solved for realizing a device having such a configuration. In a case where wafers created using the same mask set are laminated, a plurality of addresses of the array devices cannot be discriminated from outside so as to write data, and this problem therefore needs to be solved. Hereinafter, the present technology that solves this problem will be described.

<Regarding Penetrating Electrodes>

Referring back to FIG. 2, in the case of laminating a plurality of chips, penetrating electrodes are provided, and the chips are electrically connected to one another via the penetrating electrodes.

A penetrating electrode 51 and a penetrating electrode 53 are provided in the memory chip 20 and the memory chip 30, respectively. Due to the connection of the penetrating electrode 51 and the penetrating electrode 53, the logic circuit chip 10, the memory chip 20, and the memory chip 30 are connected to one another so as to be capable of exchanging data and transferring power.

It should be noted that functions such as data exchange and power transfer are respectively allocated to the penetrating electrodes. Here, unless stated otherwise, descriptions will be given while assuming the penetrating electrode for data exchange.

In the memory chip 20, a penetrating electrode 52 connected to the penetrating electrode 51 is provided for outputting an output from the memory chip 20 to the logic circuit chip 10 or outputting an output from the logic circuit chip 10 to the memory chip 20.

Similarly, in the memory chip 30, a penetrating electrode 53 connected to the penetrating electrode 52 is provided for outputting an output from the memory chip 30 to the logic circuit chip 10 or outputting an output from the logic circuit chip 10 to the memory chip 30.

The penetrating electrodes as described above are provided plurally in the memory chip 20 and the memory chip 30 so as to enable data to be exchanged among the laminated chips.

<Regarding Layer Discrimination Method>

As shown in FIG. 2, in the case of laminating a plurality of chips, there is a need to identify to which chip the data is to be output or from which chip the data is from. In this regard, in the present technology, the penetrating electrodes as will be described below are formed on the chips.

Figure 3:
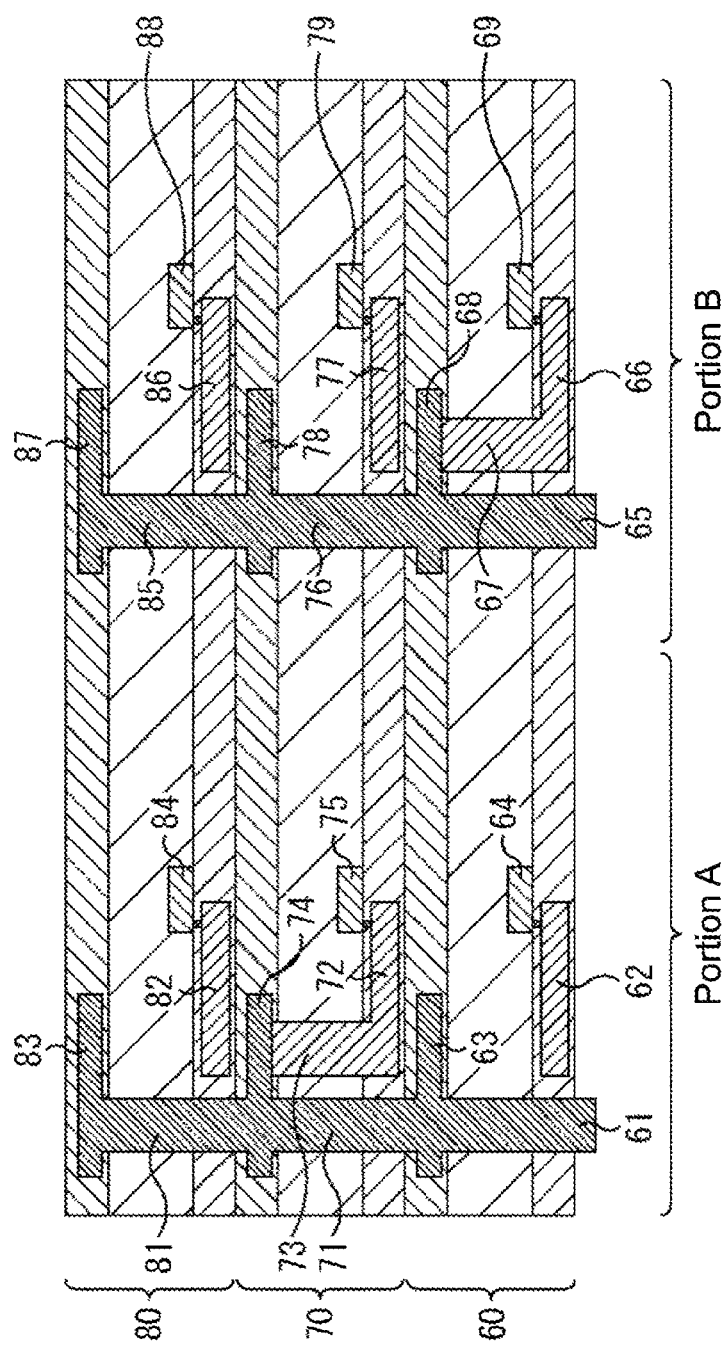
FIG. 3 A diagram for explaining the penetrating electrodes.

FIG. 3 shows a case where 3 chips are laminated. In the example shown in FIG. 3, a chip 60, a chip 70, and a chip 80 are laminated. The chip 60, the chip 70, and the chip 80 are each a chip corresponding to the memory chip 20 shown in FIG. 1, an FPGA chip 222 (FIG. 9A) to be described later, and the like, for example.

In the chip 60, a penetrating electrode 61 and a penetrating electrode 65 that penetrate the chip 60 in a longitudinal direction (vertical direction in figure) are provided at different positions. Also in the chip 60, a surface wiring 62 and a surface wiring 66 that are connected to devices 64 and 69 provided in the chip 60, such as a protection diode and a selection MOS, are provided in a lateral direction (horizontal direction in figure).

The surface wiring 62 and the surface wiring 66 are connected to a back-surface wiring 63 or a back-surface wiring 68 depending on their positions. Although the surface wiring 62 is not connected to the back-surface wiring 63 in the example shown in FIG. 3, the surface wiring 66 is connected to the back-surface wiring 68 via a penetrating electrode 67.

Similarly, in the chip 70, a penetrating electrode 71 and a penetrating electrode 76 that penetrate the chip 70 in the longitudinal direction are provided at different positions. The penetrating electrode 71 provided in the chip 70 is connected to the penetrating electrode 61 provided in the chip 60, and the penetrating electrode 76 is connected to the penetrating electrode 65.

Also in the chip 70, a surface wiring 72 and a surface wiring 77 that are connected to a device 75 or 79 provided in the chip 70 are provided in the lateral direction. The surface wiring 72 is connected to a back-surface wiring 74 via a penetrating electrode 73, and the surface wiring 77 is not connected to a back-surface wiring 78.

Similarly, in the chip 80, a penetrating electrode 81 and a penetrating electrode 85 that penetrate the chip 80 in the longitudinal direction are provided at different positions. The penetrating electrode 81 provided in the chip 80 is connected to the penetrating electrode 71 provided in the chip 70, and the penetrating electrode 85 is connected to the penetrating electrode 76.

By connecting the penetrating electrode 81, the penetrating electrode 71, and the penetrating electrode 61, a penetrating electrode that penetrates the respective layers is formed. Similarly, by connecting the penetrating electrode 85, the penetrating electrode 76, and the penetrating electrode 65, a penetrating electrode that penetrates the respective layers is formed.

Also in the chip 80, a surface wiring 82 and a surface wiring 86 that are connected to a device 84 or 88 provided in the chip 80 are provided in the lateral direction. The surface wiring 82 is not connected to a back-surface wiring 83, and the surface wiring 86 is not connected to a back-surface wiring 87.

In this way, the penetrating electrode connected to the back-surface wiring differs among the layers. In the example shown in FIG. 3, when counting the layers as a first layer, a second layer, and a third layer from the bottom, the penetrating electrode 67 is provided in a portion B (right-hand side of figure) in the first-layer chip 60. Due to the penetrating electrode 67, the device 69, the surface wiring 66, the penetrating electrode 67, the back-surface wiring 68, and the penetrating electrode 65 are connected.

For example, in a case where the logic circuit chip 10 (not shown in FIG. 3) is laminated as a lower layer of the chip 60, data from the device 69 can be output to the logic circuit chip 10 connected to the penetrating electrode 65.

Further, the second-layer chip 70 or the third-layer chip 80 is not connected to the penetrating electrode 65 provided in the portion B. Therefore, a structure in which it is possible to realize that data obtained via the penetrating electrode 65 provided in the portion B is from the first-layer chip 60 on a data reception side is obtained.

Similarly, the penetrating electrode 73 is provided in a portion A (left-hand side of figure) in the second-layer chip 70. Due to the penetrating electrode 73, the device 75, the surface wiring 72, the penetrating electrode 73, the back-surface wiring 74, and the penetrating electrode 71 are connected.

With such a configuration, for example, data from the device 75 can be output to the logic circuit chip 10 (not shown in FIG. 3) or the like connected to the penetrating electrode 71.

Further, the first-layer chip 60 or the third-layer chip 80 is not connected to the penetrating electrode 71 provided in the portion A. Therefore, a structure in which it is possible to realize that data obtained via the penetrating electrode 71 provided in the portion A is from the second-layer chip 70 on the data reception side is obtained.

In this way, by providing a penetrating electrode (second penetrating electrode) such as the penetrating electrode 67, that connects the device provided on the chip and the penetrating electrode that penetrates each layer (first penetrating electrode) such as the penetrating electrode 65 and providing the second penetrating electrodes at different positions among the layers, it becomes possible to discriminate the layers on the basis of that position.

Moreover, as will be described later, even in the case of chips arranged in different layers, the second penetrating electrodes of chips to which the same data is supplied are provided at the same position in the chips to which the same data is supplied. By providing the second penetrating electrodes at the same position, data that has flown to the first penetrating electrodes connected to those second penetrating electrodes can be supplied to the plurality of chips at the same time.

By providing the second penetrating electrodes at different positions among the layers as described above, it becomes possible to discriminate each layer from that position and enable, by providing them at the same position in the chips to which the same data is to be supplied, the same data to be supplied.

The penetrating electrodes that connect the laminated chips shown in FIG. 3, such as the penetrating electrodes 61, 71, and 81, are opened from the back surface of the wafers toward the front surface of the wafers by a lithography technology and dry etching technology as a wafer process.

It should be noted that for reducing an opening size of the back-surface penetrating connection electrodes and shortening an opening time, it is desirable for a wafer thickness of a memory substrate (e.g., chip 60) to be made as thin as possible within a range where characteristics are not deteriorated.

At this time, the first penetrating electrode connected to the back-surface wiring of the lower-layer wafer and the second penetrating electrode connected to the surface wiring of the relevant wafer are created using different masks and processed into two types of electrodes having different depths. At this time, the mask for forming the first penetrating electrode can be used in common by the wafers to be laminated. Regarding the mask for forming the second penetrating electrode, a common mask can be used for portions excluding the penetrating electrodes for identifying layers and penetrating electrodes connected to devices to which different data are to be supplied.

Both electrodes are filled with a conductive material such as copper and connected to each other by the back-surface wiring. By this method, an electrical connection between the lower-layer wafer and the relevant wafer is realized, and the arrangement of the second penetrating electrode can be switched for each of the attached layers. As a result, which layer the device incorporated in each wafer exists in can be written as information.

An area of the memory wafer that becomes a connection path of the first penetrating electrode and the second penetrating electrode as described above is designed such that the device structures that cause a connection failure do not overlap. The first penetrating electrode is configured to be connected to the back-surface wiring of the lower-layer wafer, and the second penetrating electrode is configured to be connected to the wiring within the memory wafer.

<Regarding Address Writing>

To form connection paths of all signal lines per laminated chip, the connection position of the second penetrating electrodes needs to be prepared in the number obtained by multiplying only by the number of laminated layers, but connection through-holes provided for forming the penetrating electrodes are drawn in an extremely large size as compared to a normal contact hole. Therefore, a loss of the layout area may become large.

Figure 4:
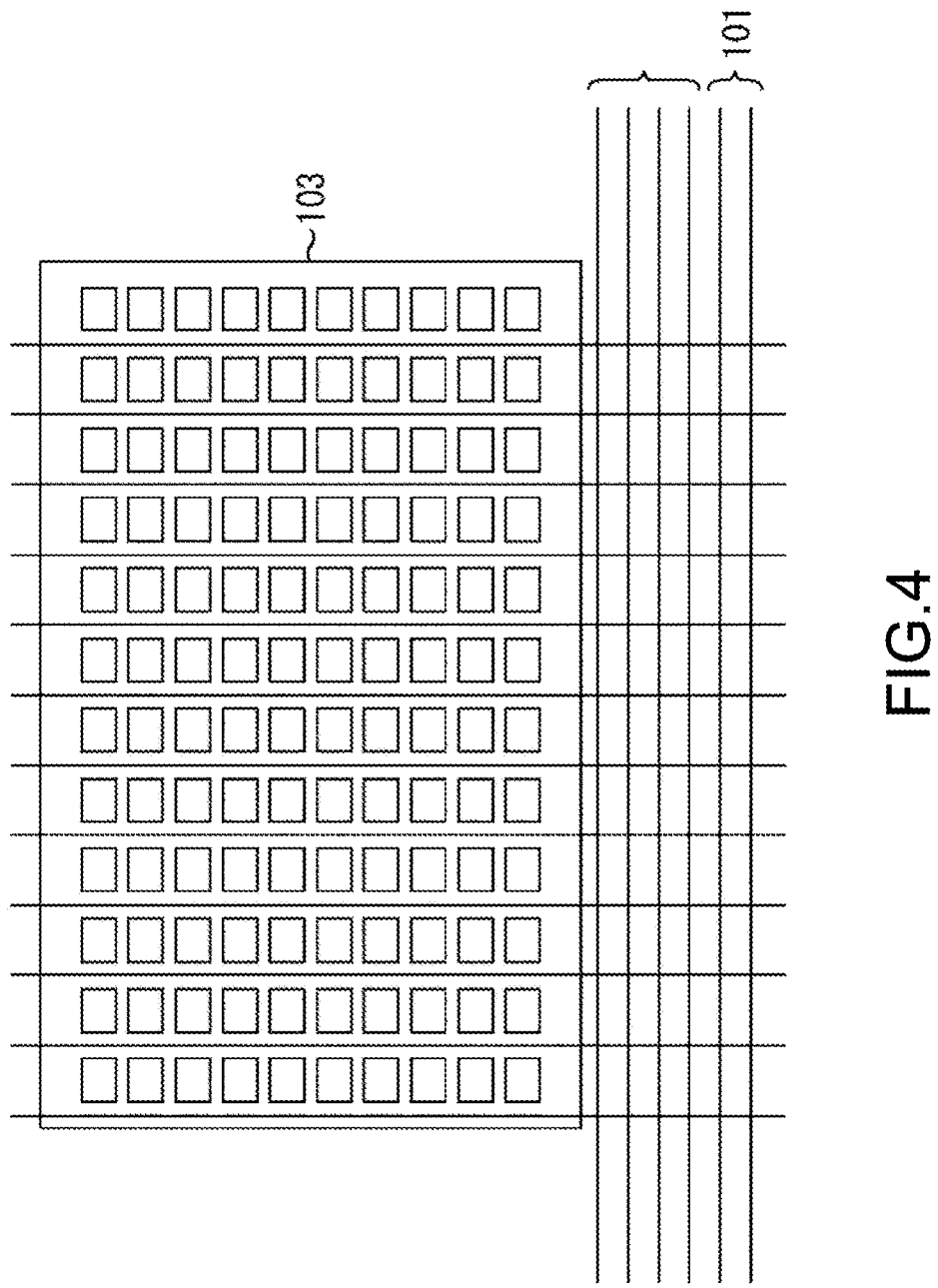
FIG. 4 A diagram for explaining address writing.

In this regard, as shown in FIG. 4, only chip address writing paths are formed for each laminated chip 103, and connection paths of other data lines are laid out while overlapping them at the same positions.

A chip selection address is a selection address of a data line of a decoder for selecting which layer the lamination position is, and a 2-bit chip address decode line 101 becomes necessary in the case where memory chips of 4 layers are connected.

At a time all the wafer processes are ended and the electrical connections and forming of an external input/output terminal with respect to all the laminated wafers are ended, a chip decode address is written in the device in each layer. This writing will be described later with reference to FIG. 5 and subsequent figures.

It should be noted that regarding only the chip selection address writing path, the arrangement of the second penetrating electrode needs to be varied for each wafer. When an address writing circuit is driven and a selection transistor located at a position corresponding to the address line is turned ON, information is written in a fuse circuit corresponding to the decode address.

At this time, a structure in which, while information is written in the fuse of the wafer corresponding to the address, that is, the fuse device 24 in the case of the memory chip 20 shown in FIG. 1, for example, information is not written in the fuse of the wafer not corresponding to the address is necessary. Accordingly, masks may be created such that the penetrating electrode is opened at a position corresponding to the address in only the writing portion of the fuse, and the penetrating electrode is not opened at other portions.

Once data is written in the chip address decode line, the chip address is permanently recognized after that, and discrimination on whether it is a chip in/from which data is to be written/deleted is realized by performing data comparison with the chip address decode line.

By writing address information of the laminated chip in advance by such a method, it becomes possible to access arbitrary XY addresses of the plurality of chips at the same time so as to be capable of coping with high-velocity parallel processing, sharing of a redundant area, and the like, which becomes a great advantage in constructing a laminated chip system.

Figure 5:
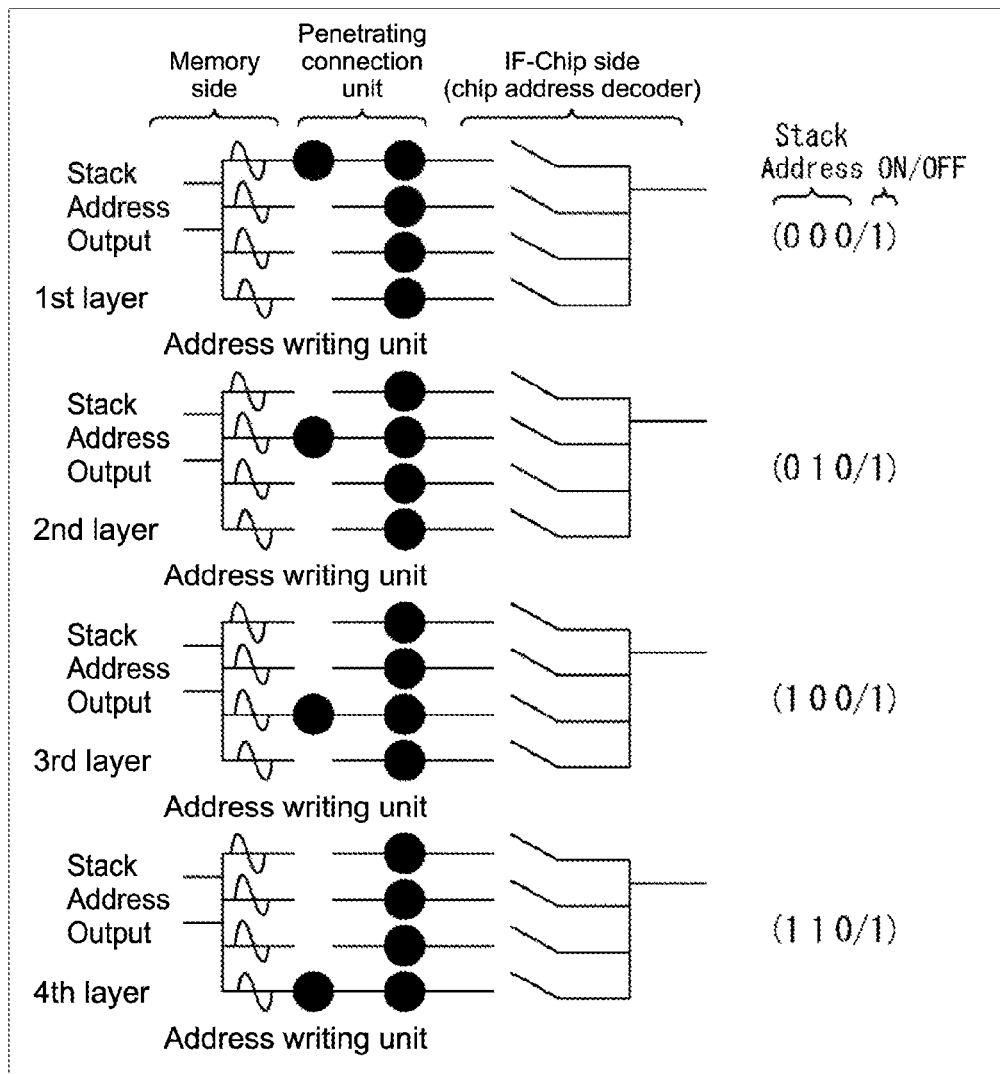
FIG. 5 A diagram for explaining address writing.

FIG. 5 is a diagram for explaining a principle with which an address in a Z direction (connection layer position) is written in each wafer. In descriptions made with reference to FIG. 5, a case where 4 chips are laminated in 4 layers is taken as an example.

A signal for controlling an address of the laminated chip is supplied from a device (hereinafter, referred to as chip address decoder) that exists in a layer different from the wafers where the array devices such as the chips 60, 70, and 80 shown in FIG. 2 are formed.

An address writing device (fuse, anti-fuse, etc.) is incorporated in each layer while being coupled to the laminated chip address decoder. Since the position of the fuse device to write address information is switched by varying the arrangement of the second penetrating electrode for each layer as described above, when an address signal is switched by the control chip, the address writing device corresponding to the address signal is driven.

For example, in the laminated chips where the penetrating electrodes are provided as shown in FIG. 3, the penetrating electrode 65 (corresponding to first penetrating electrode) and the penetrating electrode 67 (corresponding to second penetrating electrode) provided in the portion B are connected in the first-layer chip 60. The penetrating electrode 65 and the chip address decoder are coupled, and the address writing device is incorporated in the penetrating electrode 65. Specifically, the address writing device is incorporated in the device 69 connected to the penetrating electrode 67, that is connected to the penetrating electrode 65, via the surface wiring 66.

In a case where the address signal is switched on the control chip side, specifically, switched to the address signal corresponding to the first-layer chip 60, for example, the address writing device corresponding to that address signal, which is the address writing device incorporated in the first-layer chip 60 in this case, is driven.

By executing the address signal switch, the drive of the address writing device, and the address writing as described above for each layer, an address indicating in which layer the chip is laminated is written in each of the laminated chips.

For example, as shown in FIG. 5, (00) is written as an address in a first-layer chip. Of (000/1) shown in FIG. 5, (00) is a stack address (Stack Address), and (0/1) takes a value of 1 in an ON state and a value of 0 in an OFF state. The stack address is an address of a chip in a lamination direction (Z-axis direction). ON/OFF information is information for causing information to be written in a fuse circuit corresponding to a decode address at a time a selection transistor located at a position corresponding to the address line is turned ON as described above.

Similarly, (01) is written as a stack address in a second-layer chip, (10) is written as a stack address in a third-layer chip, and (11) is written as a stack address in a fourth-layer chip. It should be noted that although a 2-bit stack address is used in the case of 4 layers, a bit count of the stack address is set in accordance with the number of laminated chips.

In this way, the address information of the laminated chips is written permanently in the respective chips. In operations after the address writing as described above, by comparing the laminated chip address information written in the chips and the address information of the chip in which data is to be written, data at a correct address position can be transferred to each chip without passing a specific penetrating electrode (through-hole).

By writing a layer identification address in each chip on the basis of such a principle, it becomes possible to carry out batch processing for transmitting data through a plurality of paths or create a direct path for directly transferring data among the array devices without passing through the control chip, to thus result in a great advantage in an increase in the device velocity and lower power consumption.

<Regarding Sharing of Redundant Area>

As described above, by writing an address indicating which layer the chip is laminated in, in each of the laminated chips, sharing of a redundant area described below becomes possible, for example. First, with reference to FIG. 6, replacement of a row having a defect by another row will be described.

Figure 6:
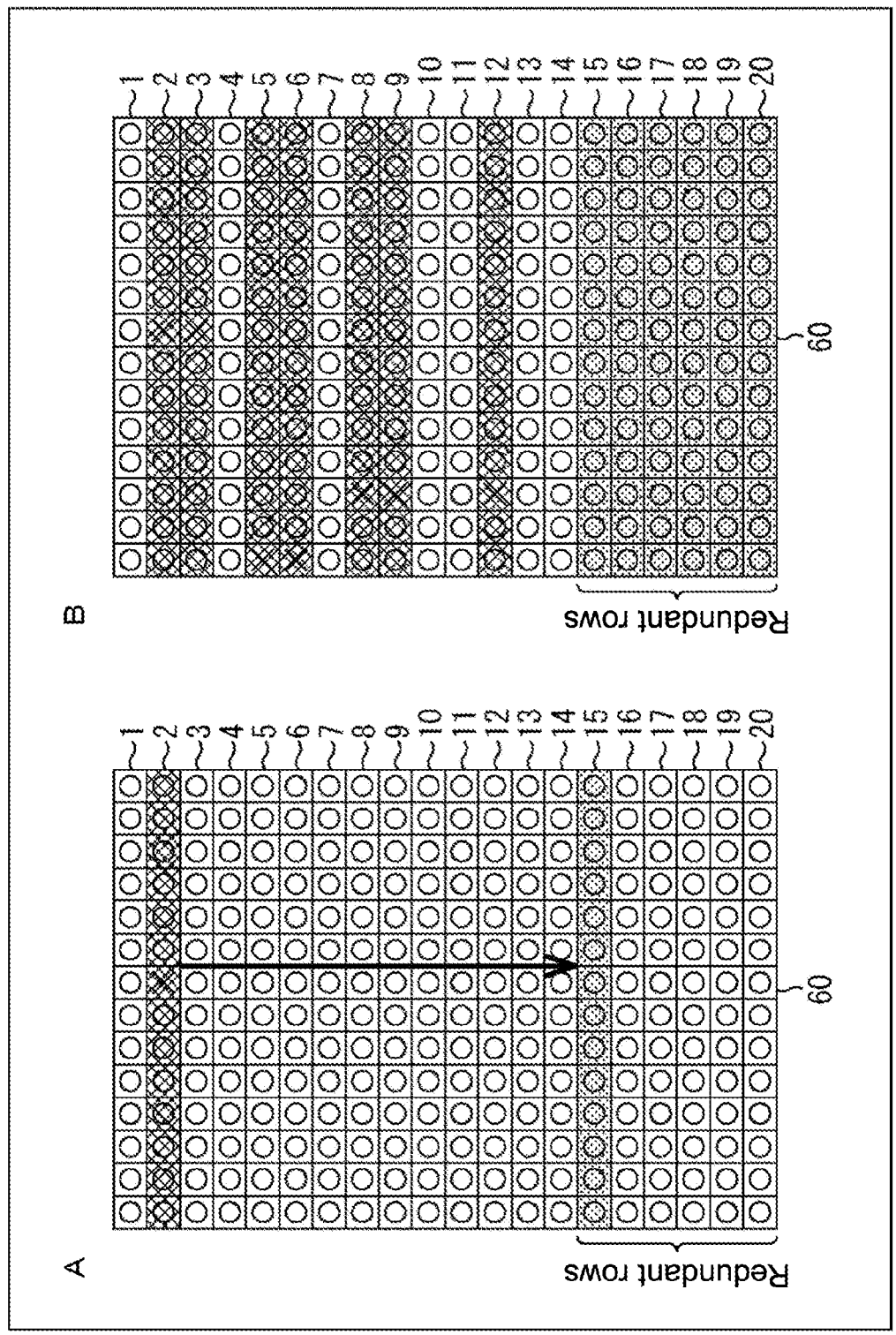
FIG. 6 Diagrams for explaining a salvation of a redundant area.

FIG. 6 each show the chip 60, for example, and the chip 60 is assumed to be a memory. Of the chip 60, a 2nd row includes a defect (x-mark in figure represents defect), so the 2nd row is invalidated as a defective row. In the chip 60, 15th to 20th rows are set as redundant rows which are substitution rows for such a defective row.

The 15th row set as the redundant row is validated in place of the 2nd row invalidated as the defective row. In this way, in the case of detecting a defective row, a redundant row is validated in place of that row to thus replace the defective row.

The state shown in FIG. 6B is a state where 7 rows are detected as defective rows. The 2nd row, the 3rd row, the 5th row, the 6th row, the 8th row, the 9th row, and the 12th row, that is, the total of 7 rows are detected as the defective rows. The redundant rows are 6 rows which are the 15th row to the 20th row.

In such a state, the 2nd row is replaced by the 15th row, the 3rd row is replaced by the 16th row, the 5th row is replaced by the 17th row, the 6th row is replaced by the 18th row, the 8th row is replaced by the 19th row, and the 9th row is replaced by the 20th row. However, since there is no redundant row to replace the 12th row by, the 12th row cannot be replaced.

In such a case, the chip 60 itself is handled as a defect. Moreover, when a plurality of chips are laminated and the defective chip 60 is included in the laminated chips, all of the laminated chips are handled as a defect without the address writing (means for discriminating layer) as describe above.

Specifically, because a replacement redundant address can only be recognized within the same chip in general, it has been difficult to perform redundancy salvation across the laminated chips. However, if the laminated chip selection address (Z address, corresponding to stack address described above) is written in the chip in advance as described above, it becomes possible to perform the test/redundancy salvation on the laminated chips in parallel, and if there is even one unused salvation redundant row in the chips laminated above and below a relevant chip, that redundant row can be used for the replacement, which brings a great advantage in the improvement of a yield of the laminated chips.

This will be described with reference to FIG. 7. The chip 60 is shown on the left-hand side of FIG. 7, and the chip 70 is shown on the right-hand side. Further, the chip 60 and the chip 70 are chips laminated as shown in FIG. 3.

Figure 7:
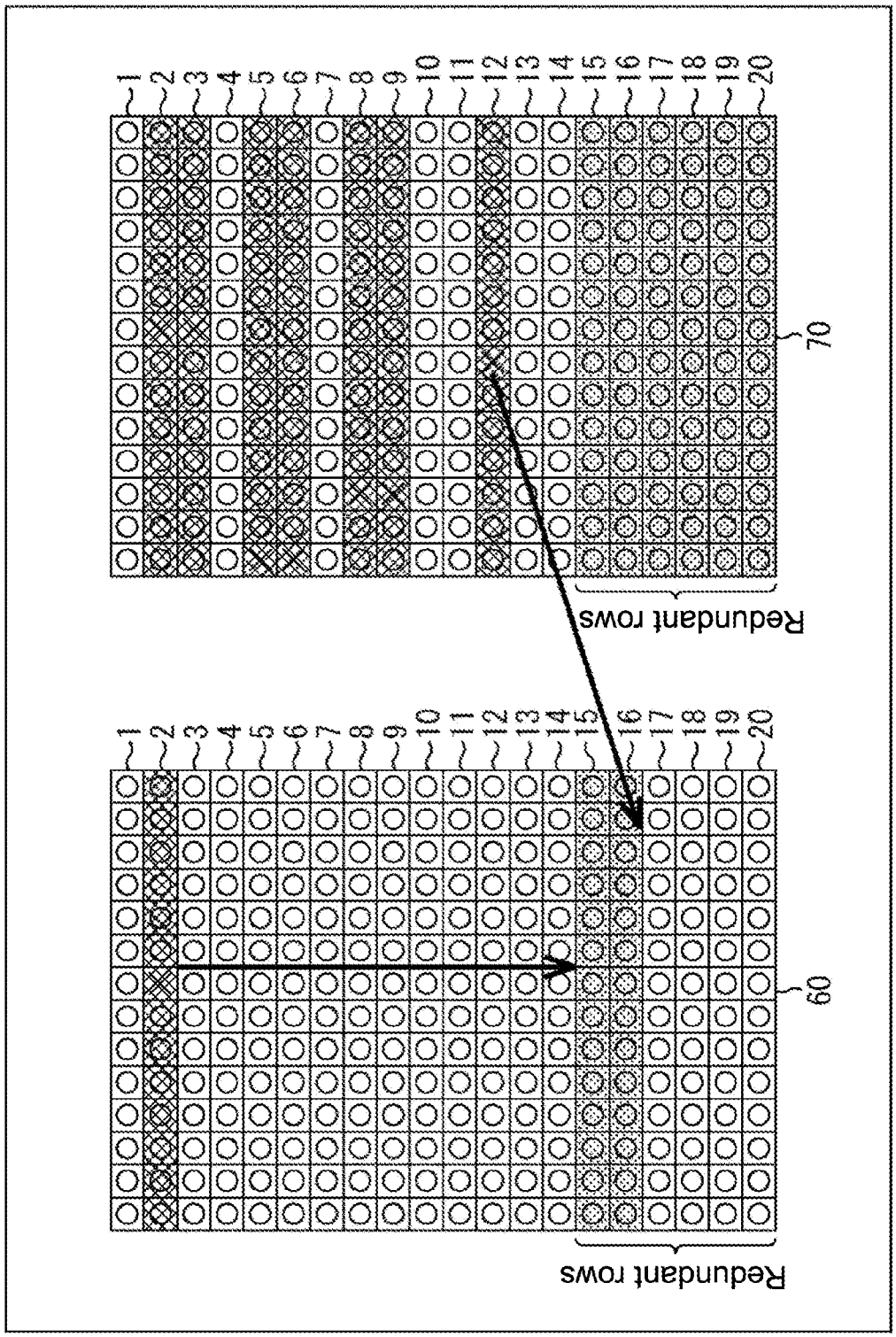
FIG. 7 A diagram for explaining the salvation of a redundant area.

The chip 60 shown in the left-hand diagram of FIG. 7 is in a state where, as in the chip 60 shown in FIG. 6A, the 2nd row is detected as a defective row and replaced by the 15th row. The chip 70 shown in the right-hand diagram of FIG. 7 is in a state where, as in the chip 60 shown in FIG. 6B, the 2nd row detected as a defective row is replaced by the 15th row, the 3rd row is replaced by the 16th row, the 5th row is replaced by the 17th row, the 6th row is replaced by the 18th row, the 8th row is replaced by the 19th row, and the 9th row is replaced by the 20th row.

Although the 12th row is further detected as the defective row in the chip 70 shown in the right-hand diagram of FIG. 7, since the redundant rows provided in the chip 70 are already used for other defective rows, there is no redundant row left to replace the 12th row.

While all the redundant rows are used in the chip 70, 16th to 20th rows are still left as the unused redundant rows in the chip 60. Because the laminated chips can be identified as described above according to the present technology, the defective row that cannot be allocated within the chip 70 can be allocated to the redundant rows in the chip 60.

In this regard, the 12th row of the chip 70 is replaced by the 16th row of the chip 60. After that, for example, data to be written in the 12th row of the chip 70 is written in the replaced 16th row of the chip 60.

In this way, even in the case where salvation has been impossible when the number of defective rows exceeds the number of redundant rows within each wafer according to the technology of the past, salvation becomes possible according to the present technology.

Specifically, according to the present technology, by performing a test across a plurality of wafers laminated above and below, it becomes possible to allocate a redundant area. Accordingly, it becomes possible to minimize a yield loss due to lamination of chips and realize lowering of chip costs.

<Regarding FPGA Structure>

Next, a case of creating an FPGA (Programmable Logic Array) by applying the present technology will be described. First, for explaining a difference between a case where the present technology is applied and a case where the present technology is not applied, the unapplied case will be described with reference to FIG. 8.

Figure 8:
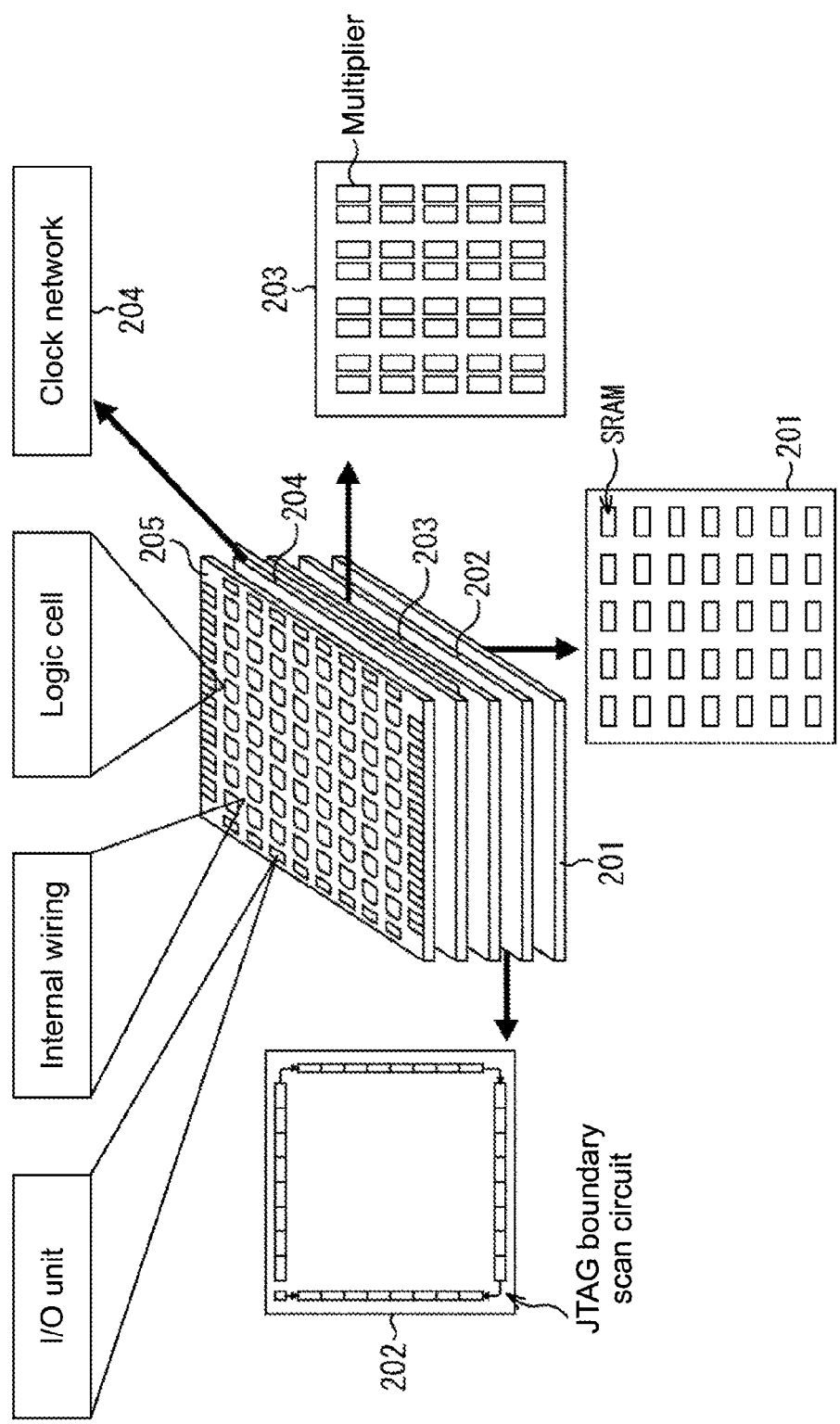
FIG. 8 A diagram for explaining an FPGA structure.

A laminated chip shown in FIG. 8 is obtained by laminating chips 201 to 205. A plurality of SRAMs (Static Random Access Memory) are arranged on the chip 201, a plurality of JTAGs (Joint Test Action Group) are arranged on the chip 202, and a plurality of multipliers are arranged on the chip 203. A clock network is formed on the chip 204. An I/O unit, an internal wiring, and a logic cell are arranged at predetermined positions on the chip 205.

Of the laminated chips 201 to 205, logic elements are arranged in an array and are configured by a lookup table (Look up table) and a memory unit for writing a logic function. Each FPGA chip has its main portion being configured by an internal wiring for connecting the logic elements on the array, and a clock network for adjusting timings, an input/output unit, and the like are formed. Outputs of the elements are connected to a flip-flop synchronized by a clock, and calculation data of each timing is transmitted to a subsequent stage.

By a function program written in the logic elements and a connection program for switching a connection destination of the internal connection wirings, a general FPGA is capable of reading a large-scale logic circuit and operating while deleting.

Figure 9:
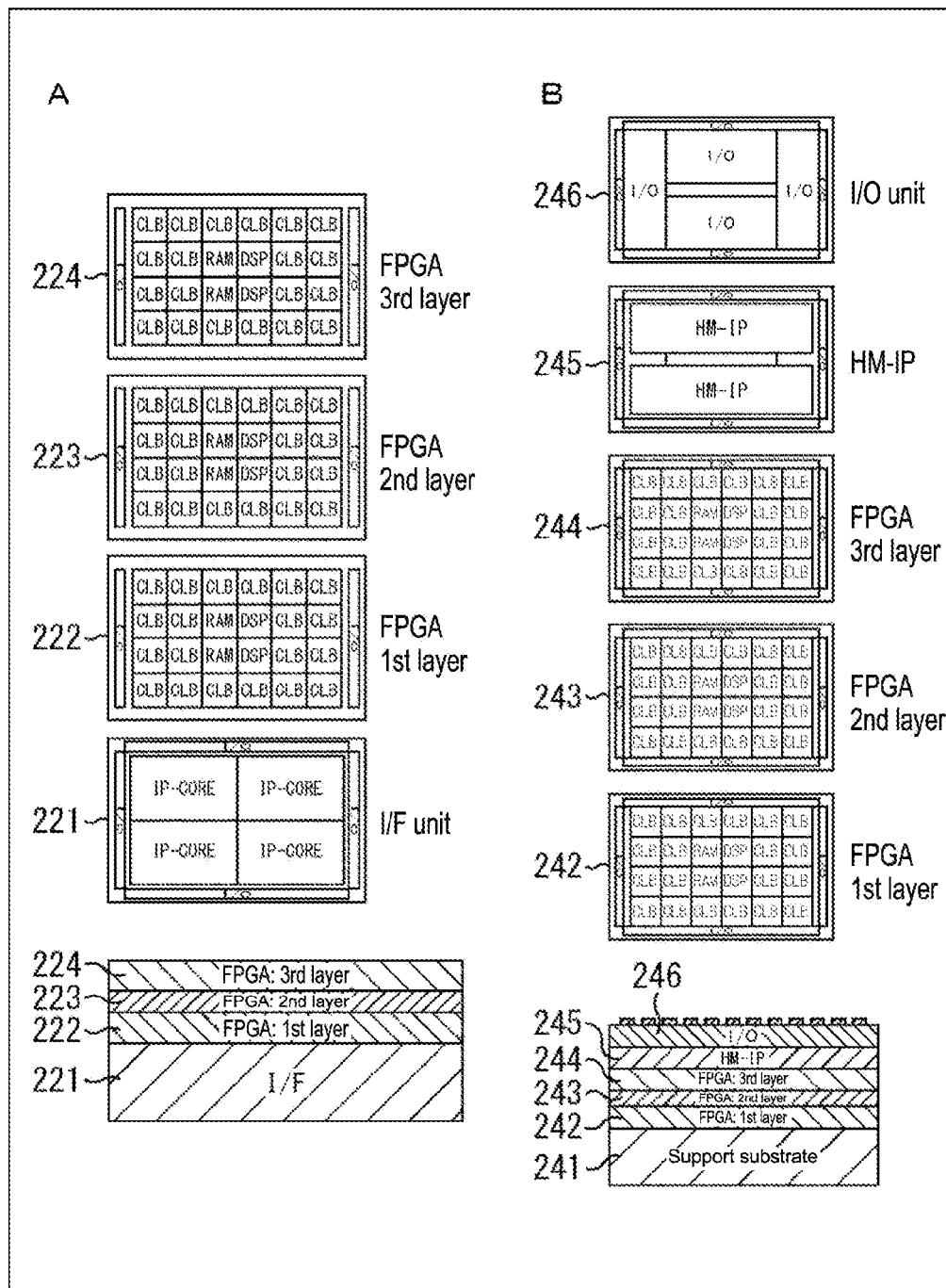
FIG. 9 Diagrams for explaining the FPGA structure.

FIGS. 9A and 9B each schematically show an example where a programmable logic array is created using the principle of the present technology. In a laminated chip shown in FIG. 9A, FPGA chips 222 to 224 are laminated on an I/F chip 221 in which an I/F unit is formed. In each of the FPGA chips 222 to 224, a plurality of CBLs (Configurable Logic Blocks), RAMs, DSPs (Digital Signal Processors), and the like are arranged, and interfaces (I/O units) for exchanging data with the respective layers are arranged.

In a laminated chip shown in FIG. 9B, FPGA chips 242 to 244 are laminated on a support substrate 241. Further, an HM-IP (hard macro IP) chip 245 and an I/O chip 246 are laminated on the FPGA chip 244. The FPGA chips 242 to 244 have configurations similar to that of the FPGA chip 222 (FIG. 9A). An HM-IP unit is formed on the HM-IP chip 245. An I/O unit is formed on the I/O chip 246. A penetrating electrode (TSV) is formed in each layer, and the layers are connected by the TSVs.

In the laminated chip shown in FIG. 9A, the layers are supported by the I/F chip 221, and data exchange with other processing units is carried out via this I/F chip 221. In the laminated chip shown in FIG. 9A, assuming that the I/F chip 221 is a bottom layer, data from the FPGA chips 222 to 224 as the upper layers is output via the I/F chip 221. In this case, data flows from the upper layer to the lower layer.

In the laminated chip shown in FIG. 9B, the layers are supported by the support substrate 241. Assuming that the support substrate 241 is a bottom layer, data exchange with other processing units is carried out via the I/O chip 246 positioned at the top. In the laminated chip shown in FIG. 9B, data from the FPGA chips 242 to 245 as the lower layers is output via the I/O chip 246 as the upper layer. In this case, data flows from the lower layer to the upper layer.

As described above, the applicable range of the present technology is not limited by how data from the layers is extracted. By laminating only the array portions in multilayers as shown in FIGS. 9A and 9B, the number of logic elements to be mounted can be varied. Moreover, a configuration in which the input/output portion and the core logic IP portion are formed in wafers different from those of the array portions becomes possible.

<Regarding 3D Network>

As described above, according to the present technology, it becomes possible to laminate a plurality of chips and identify which layer each chip is positioned at. For example, it becomes possible to laminate a plurality of FPGA chips and handle the plurality of FPGA chips as one chip. In other words, by laminating the plurality of FPGA chips, the chips can be handled as one chip capable of 3-dimensionally transmitting/receiving signals in the longitudinal and lateral directions.

Figure 10:
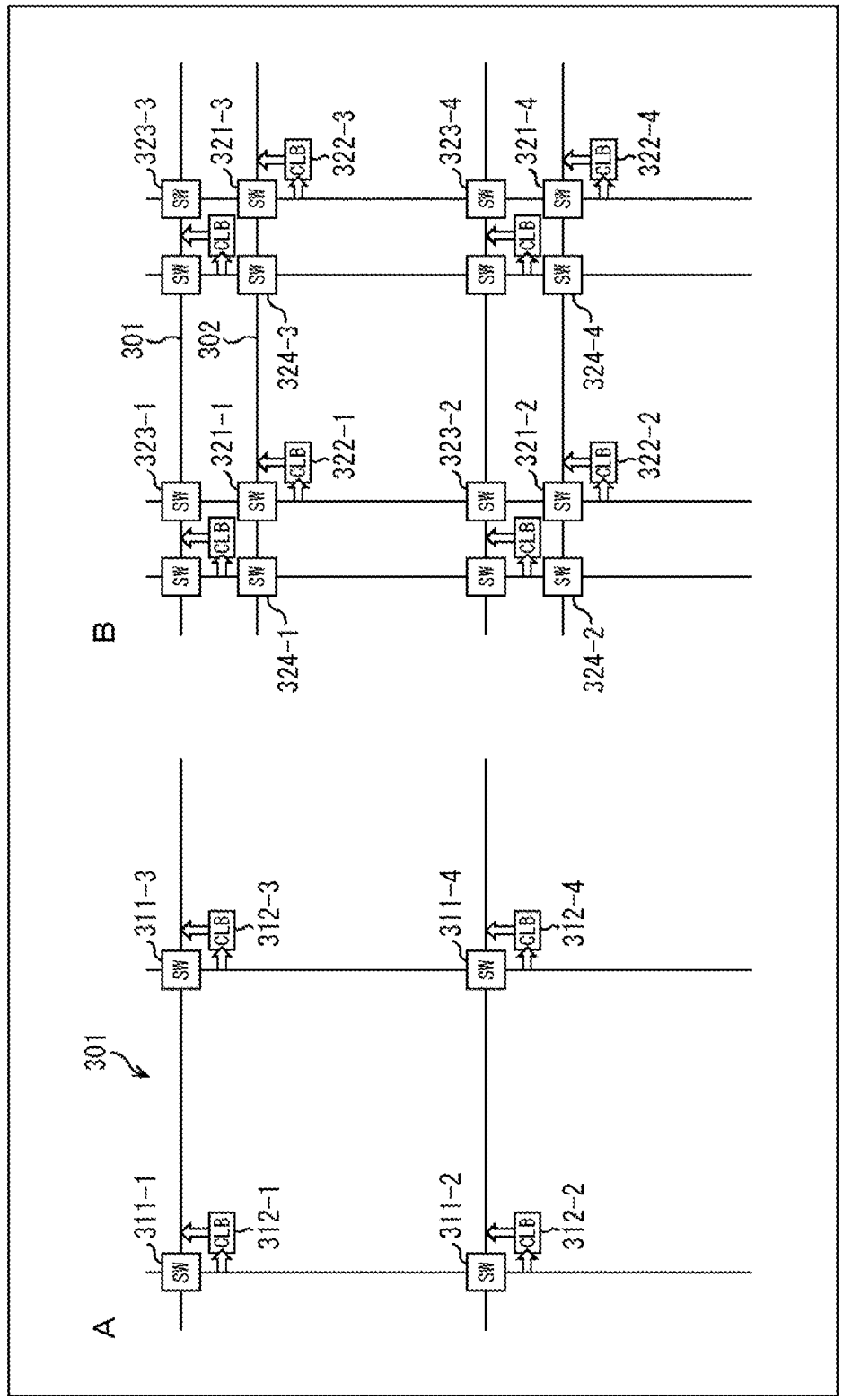
FIG. 10 Diagrams for explaining a 3D network.

Here, a method of realizing FPGAs 3-dimensionally connected to a network will be described. FIG. 10A is a diagram showing a partial configuration of a first-layer FPGA chip 301. A large number of logical blocks called CBLs are arranged in the FPGA chip 301 in a planar direction. In FIG. 10A, 4 CBLs 312-1 to 312-4 are illustrated.

Figure 13:
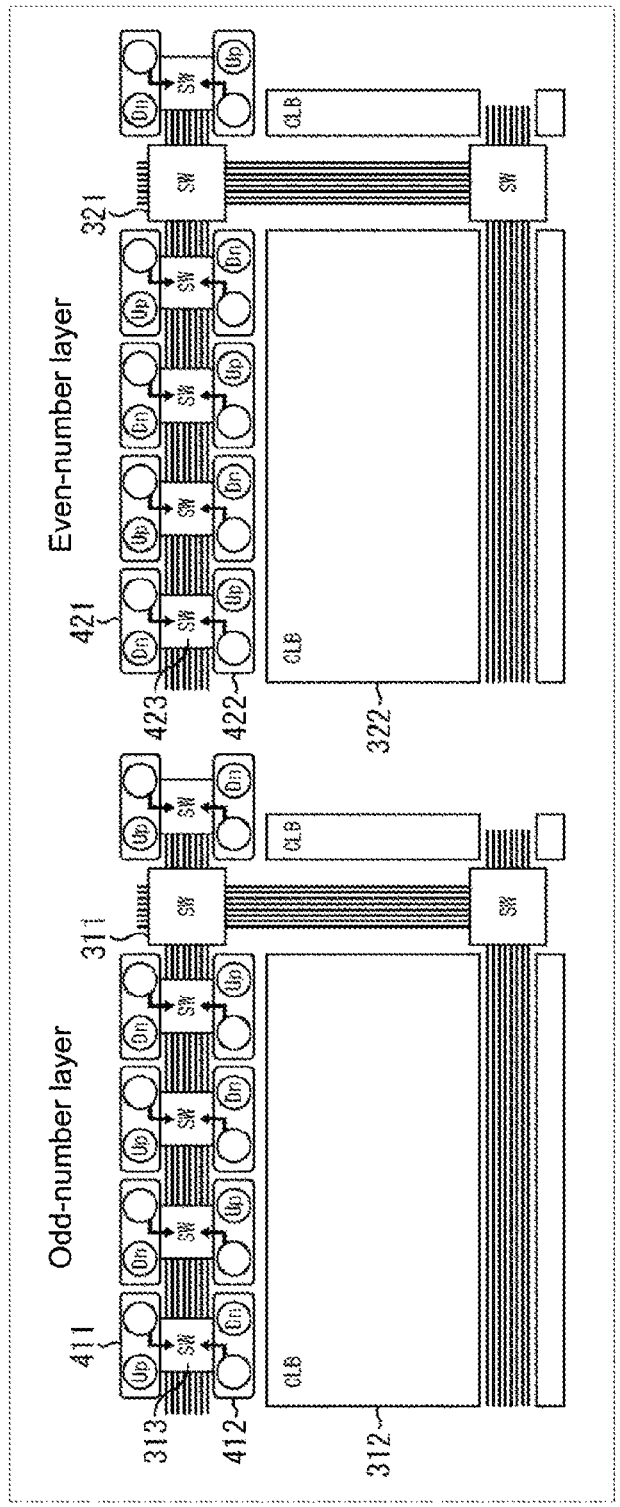
FIG. 13 A diagram for explaining the 3D network.

The logical blocks (CBLs 312) are connected by a wiring group. Although FIG. 10A illustrates the connections by one line, the connections are made by a plurality of lines as shown in FIG. 13. Moreover, selection switches (SW) 311-1 to 311-4 are also provided among the CBLs 312. For example, by a switch of the selection switch 311-4, an output from the CBL 312-4 is supplied to the CBL 312-2 provided leftward in the figure or supplied to the CBL 312-3 provided upward in the figure.

By providing the wirings and selection switches in the first-layer FPGA chip 301, data can be moved in the longitudinal and lateral directions within that layer. Here, the lateral direction within the same layer is referred to as X-axis direction, and the longitudinal direction is referred to as Y-axis direction. The FPGA chips of the respective layers, which are 4 layers herein, each include the configuration as shown in FIG. 10A.

FIG. 10B is a logic synthesis diagram of first and second layers in a case where two chips, that is, the FPGA chip 301 and an FPGA chip 302, are laminated. The FPGA chip 302 is also configured to include selection switches 321-1 to 321-4 and CBLs 322-1 to 322-4 as in the FPGA chip 301.

Further, when laminated, selection switches for connecting the CBLs of the respective layers are also provided. Hereinafter, the lamination direction is referred to as Z-axis direction. The Z-axis direction is a direction vertical to a plane where the CBLs are formed. In the case where a plurality of FPGA chips are laminated, selection switches for transferring signals also in the Z-axis direction are also provided. In the example shown in FIG. 10B, selection switches 323-1 to 323-4 and selection switches 324-1 to 324-4 are provided as the selection switches for transferring signals in the Z-axis direction.

In this way, there are selection switches for transferring signals within a chip and selection switches for transferring signals to/from chips laminated above and below a chip. Hereinafter, the selection switches for transferring signals to/from chips laminated above and below a chip will be referred to as Z-axis direction selection switches for distinguishing them from the selection switches for transferring signals within a chip.

As shown in FIG. 10B, while the same patterns of the first and second layers actually overlap on a plane in the case where two chips are laminated, by connecting them via the Z-axis direction selection switches, connections as if the density has been doubled can be realized.

Figure 11:
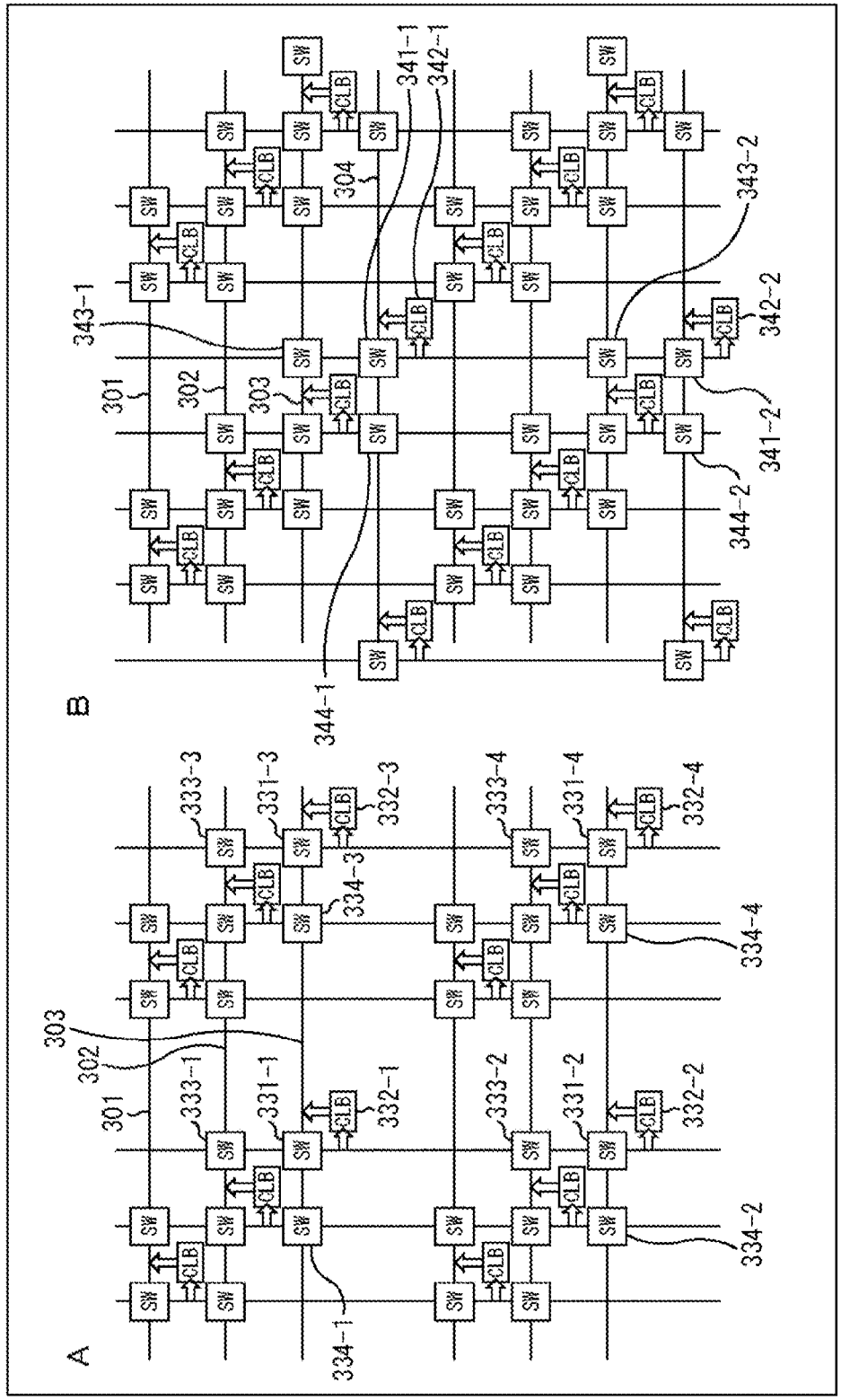
FIG. 11 Diagrams for explaining the 3D network.

FIG. 11A is a logic synthesis diagram of first to third layers in a case where an FPGA chip 303 is additionally laminated on the laminated chip obtained by laminating two chips, that is, the FPGA chip 301 and the FPGA chip 302.

The FPGA chip 303 is also configured to include selection switches 331-1 to 331-4 and CBLs 332-1 to 332-4 like the FPGA chip 301. In the case where three chips are laminated, Z-axis direction selection switches are provided as in the case where two chips are laminated. In the case of the 3-layer lamination shown in FIG. 11A, Z-axis direction selection switches 333-1 to 333-4 and Z-axis direction selection switches 334-1 to 334-4 are additionally provided as compared to the 2-layer lamination shown in FIG. 10B.

FIG. 11B is a logic synthesis diagram of a state where 4 layers are laminated by additionally laminating an FPGA chip 304 on the 3-layer lamination shown in FIG. 11A where the FPGA chips 301 to 303 are laminated. The FPGA chip 304 is also configured to include, as in the FPGA chip 301, selection switches 341-1 to 341-4 (selection switches 341-1 and 341-2 are illustrated in FIG. 11B) and CBLs 342-1 to 342-4 (CBLs 342-1 and 342-2 are illustrated in FIG. 11B).

In the case where 4 chips are laminated, the Z-axis direction selection switches are provided as in the case where two chips are laminated and the case where three chips are laminated. In the case of the 4-layer lamination shown in FIG. 11B, Z-axis direction selection switches 343-1 to 343-4 (Z-axis direction selection switches 343-1 and 343-2 are illustrated in FIG. 11B) and Z-axis direction selection switches 344-1 to 344-4 (Z-axis direction selection switches 344-1 and 344-2 are illustrated in FIG. 11B) are additionally provided as compared to the 3-layer lamination shown in FIG. 11A.

In the case where 4 layers are laminated, a circuit having a CLB pitch of ½ and a density of 4 times can be obtained. By laminating the FPGA chips in this way, the density can be increased for the number of laminated chips, like twice in the case of two layers and 4 times in the case of 4 layers.

In this way, among the internal wirings that connect the logic elements of each layer on an array, electrical connections are formed with respect to a wiring layer of an immediately-above or immediately-below (Z-axis direction) wafer via the selection switches and penetrating electrodes.

Regarding coordinates of the logic elements, positions can be specified by row and column decoders and chip address decoders. The logic elements within the same layer are connected to one another via selection switches capable of switching connection directions of the internal connection wirings in a grid, that is, the selection switches 321, for example. Further, the Z-axis direction selection switches, for example, the selection switches 323 are provided for switching connection directions among layers.

Operations of the selection switches and the Z-axis direction selection switches will additionally be described with reference to FIG. 12. The present technology connects the internal connection wirings of the FPGA chip via throughholes and switches the connection directions with respect to the upper and lower layers by the Z-axis direction selection switches.

2-bit data is written in the Z-axis direction selection switches for switching to the wirings in the longitudinal direction (Z-axis direction), and which input signal is to be used for an input of a relevant address or which direction an output signal is to be transmitted in can be individually selected by information (0, 0) (0, 1), (1, 0), (1, 1) written in the Z-axis direction selection switches.

Figure 12:
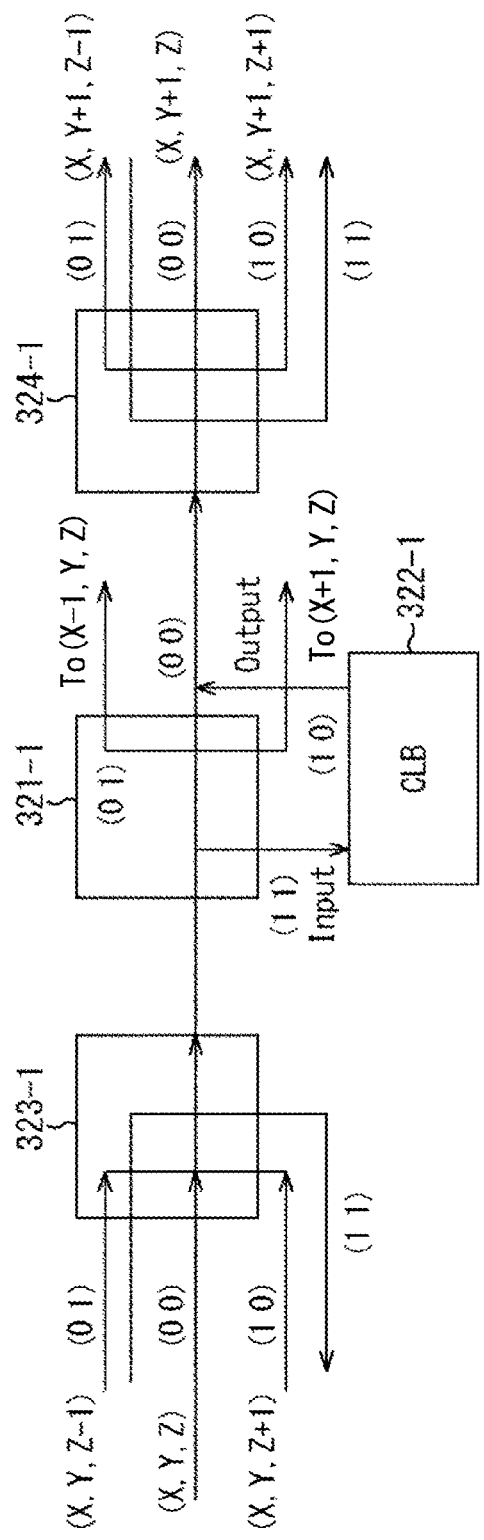
FIG. 12 A diagram for explaining the 3D network.

FIG. 12 shows the CLB 322-1 arranged on the FPGA chip 302 out of the FPGA chips shown in FIG. 11A (11B), the selection switch 321-1 related to the CLB 322-1, the Z-axis direction selection switch 323-1, and the Z-axis direction selection switch 324-1.

The selection switch 321-1 is a selection switch for controlling transmission/reception of signals within the FPGA chip 302. The Z-axis direction selection switch 323-1 and the Z-axis direction selection switch 324-1 are selection switches for controlling transmission/reception of signals to/from other chips arranged in the Z-axis direction, which are the FPGA chip 301 and the FPGA chip 303 in this case.

Further, one of the Z-axis direction selection switch 323-1 and the Z-axis direction selection switch 324-1 controls an input (IN) of signals from an FPGA chip of another layer, and the other controls an output (OUT) to the FPGA chip of another layer. Here, descriptions will be made assuming that the Z-axis direction selection switch 323-1 is the selection switch for controlling an input of signals from the FPGA chip 301 or the FPGA chip 303. Further, descriptions will be made assuming that the Z-axis direction selection switch 324-1 is the selection switch for controlling an output of signals to the FPGA chip 301 or the FPGA chip 303.

In the descriptions made with reference to FIG. 12, it is assumed that the FPGA chip 301 is arranged below the FPGA chip 302, and the FPGA chip 303 is arranged above the FPGA chip 302. As described above, 2-bit data is written in each of the Z-axis direction selection switch 323-1 and the Z-axis direction selection switch 324-1.

Referring to the Z-axis direction selection switch 323-1 shown in FIG. 12, in a case where (0, 0) is written with respect to 2-bit data (D1, D2) of the Z-axis direction selection switch 323-1, the Z-axis direction selection switch 323-1 is connected to the wirings of (X, Y, Z), that is, the wirings within the same layer, which is the FPGA chip 302 in this case. In the case of such a state, signals input to the Z-axis direction selection switch 323-1 are output to the selection switch of the same layer, that is, the selection switch 321-1, for example.

In a case where (0, 1) is written with respect to the data (D1, D2) of the Z-axis direction selection switch 323-1, the Z-axis direction selection switch 323-1 is connected to the wirings of (X, Y, Z−1), that is, the wirings of the lower layer, which is the FPGA chip 301 in this case. In the case of such a state, signals input to the Z-axis direction selection switch 323-1 are output to the FPGA chip 301 as the lower layer.

In a case where (1, 0) is written with respect to the data (D1, D2) of the Z-axis direction selection switch 323-1, the Z-axis direction selection switch 323-1 is connected to the wirings of (X, Y, Z+1), that is, the wirings of the upper layer, which is the FPGA chip 303 in this case. In the case of such a state, signals input to the Z-axis direction selection switch 323-1 are output to the FPGA chip 303 as the upper layer.

In a case where (1, 1) is written with respect to the data (D1, D2) of the Z-axis direction selection switch 323-1, the Z-axis direction selection switch 323-1 is connected to the wirings of (X, Y, Z−1) and (X, Y, Z+1), that is, the wirings of the lower and upper layers, which are wirings of the FPGA chip 301 and the wirings of the FPGA chip 303 in this case. In the case of such a state, signals input to the Z-axis direction selection switch 323-1 from the FPGA chip 301 as the lower layer are output to the FPGA chip 303 as the upper layer, and signals input from the FPGA chip 303 as the upper layer are output to the FPGA chip 301 as the lower layer.

Also for the Z-axis direction selection switch 324-1 shown in FIG. 12, the connection destination is determined by written data (D1, D2) similar to the Z-axis direction selection switch 323-1. In this way, the connection destination is determined by the data (D1, D2) written in the Z-axis direction selection switch, and input signals are output to the determined connection destination.

It should be noted that D1 (Z)≠1 is set for a layer having no upper-layer FPGA chip, that is, the FPGA chip 304 in the example shown in FIG. 11B, for example. Moreover, D2 (Z)≠1 is set for a layer having no lower-layer FPGA chip, that is, the FPGA chip 301 in the example shown in FIG. 11B, for example. Furthermore, D1 of (X, Y, Z) and D2 of (X, Y, Z+1) are set so as to satisfy D1 (Z)=D2(Z+1) with respect to all combinations of (X, Y, Z).

In this way, whether data is written is judged by referencing the address information in the Z direction, that has been written in the fuse, for the array structures.

Although the example where 2-bit data is used for switch control is used for describing FIG. 12, the present technology is also applicable to a case where the bit count of selection switches and the number of penetrating electrodes (connection ports) are increased. By increasing them, it becomes possible to arbitrarily set the number of connections that can be switched. However, it is necessary to set the connection information of the immediately-above (Z+1) and immediately-below (Z−1) chips and the connection information of the relevant chip (Z) such that they do not contradict.

It should be noted that the Z-axis direction selection switches of the present technology are designed for an array device. Therefore, the bottom-layer FPGA chip cannot select a connection switch in a downward direction, and the top-layer FPGA chip cannot select a connection switch in an upward direction.

FIG. 13 is a diagram for explaining a specific structure of the connection through-holes (penetrating electrodes) arranged in a set with the Z-axis direction selection switches. A penetrating electrode used for connecting to the upper-layer-side Z-axis direction selection switch and a penetrating electrode used for connecting to the lower-layer-side Z-axis direction selection switch are coupled to a Z-axis direction selection switch of a layer to which a logic element targeted for data write is connected.

Referring to FIG. 13, descriptions will be made while exemplifying the FPGA chip 301 as a chip of an odd-number layer, that is, the first layer, and the FPGA chip 302 as a chip of an even-number layer, that is, the second layer, for example. The CLBs 312 and the selection switches 311 that control inputs/outputs of signals within the chip are formed on the FPGA chip 301. Further, the Z-axis direction selection switches 313 that control inputs/outputs of signals among the chips are also formed. Furthermore, penetrating electrodes 411 and penetrating electrodes 412 connected to the Z-axis direction selection switches 313 are also formed.

Similarly, on the FPGA chip 302, the CLBs 322, the selection switches 321 that control inputs/outputs of signals within the chip, the Z-axis direction selection switches 323 that control inputs/outputs of signals among the chips, and penetrating electrodes 421 and penetrating electrodes 422 connected to the Z-axis direction selection switches 323 are formed.

Here, the penetrating electrodes 411 and the penetrating electrodes 412 connected to the Z-axis direction selection switches 313 will be focused. Of the penetrating electrodes 411 and the penetrating electrodes 412 connected to the Z-axis direction selection switches 313, the penetrating electrodes 411 are penetrating electrodes connected to the selection switches of the upper-layer FPGA chip 302, and the penetrating electrodes 412 are penetrating electrodes connected to the selection switches of the lower-layer FPGA chip (when there is no FPGA chip in lower layer, predetermined terminals of logic circuit chip etc. in lower layer, for example).

In the case where the penetrating electrodes 411 and the penetrating electrodes 412 connected to the Z-axis direction selection switches 313 are set (designed) in this way, the penetrating electrodes 421 and the penetrating electrodes 422 connected to the Z-axis direction selection switches 323 of the upper-layer FPGA chip 302 are set (designed) as follows.

Specifically, since the penetrating electrodes 411 are penetrating electrodes with respect to the upper layer (Up-direction penetrating electrodes), the penetrating electrodes 421 connected to the penetrating electrodes 411 are penetrating electrodes with respect to the lower layer (Down-direction penetrating electrodes).

Moreover, since the penetrating electrodes 412 are penetrating electrodes with respect to the lower layer (Down-direction penetrating electrodes), the penetrating electrodes 422 connected to the penetrating electrodes 412 are penetrating electrodes with respect to the upper layer (Up-direction penetrating electrodes).

In this way, because paths connecting the Z−1 layer and the Z layer and paths connecting the Z+1 layer and the Z layer need to be electrically separated, the arrangements are changed alternately in the odd-number layers and even-number layers. In a case where masks for portions excluding the penetrating electrodes are to be used in common, the connection information can be realized by performing a switch of them by calculation processing with a Z address.

When designing such an FPGA chip, if the mechanism of wirings by a CAD tool is optimized on the basis of such a design rule, for example, the 3D network connection of FPGAs becomes possible.

According to the present technology, it becomes possible to perform design as if distances among arrays or the number of wirings are virtually increased in the same chip area and dramatically improve area use efficiency.

By the method as described above, it becomes possible to realize FPGA chips 3-dimensionally connected to a network. As a result, longitudinal (among laminated chips) paths are added to that where the logic elements are connected only by the wirings in the lateral direction, to thus enable wiring resources to be used more efficiently.

According to the present technology as described above, it is possible to laminate wafers formed using the same mask and form common input/output terminals after forming electrical connections, to produce a device in which segmentalized chips are integrated. Further, a function that has been realized in an independent wafer can also be similarly realized in laminated wafers.

It becomes possible to share the memory areas and redundant areas in the lamination direction in the memory device. Accordingly, it becomes possible to significantly improve a yield.

It becomes possible to realize a 3-dimensional network connection in a logic element unit in the FPGA device. Accordingly, it becomes possible to significantly improve wiring resource use efficiency.

It should be noted that the embodiment described above while taking the memory chip as an example is also applicable to an FPGA chip, and the embodiment described above while taking the FPGA chip as an example is also applicable to a memory chip.

<Regarding Application Example>

Figure 14:
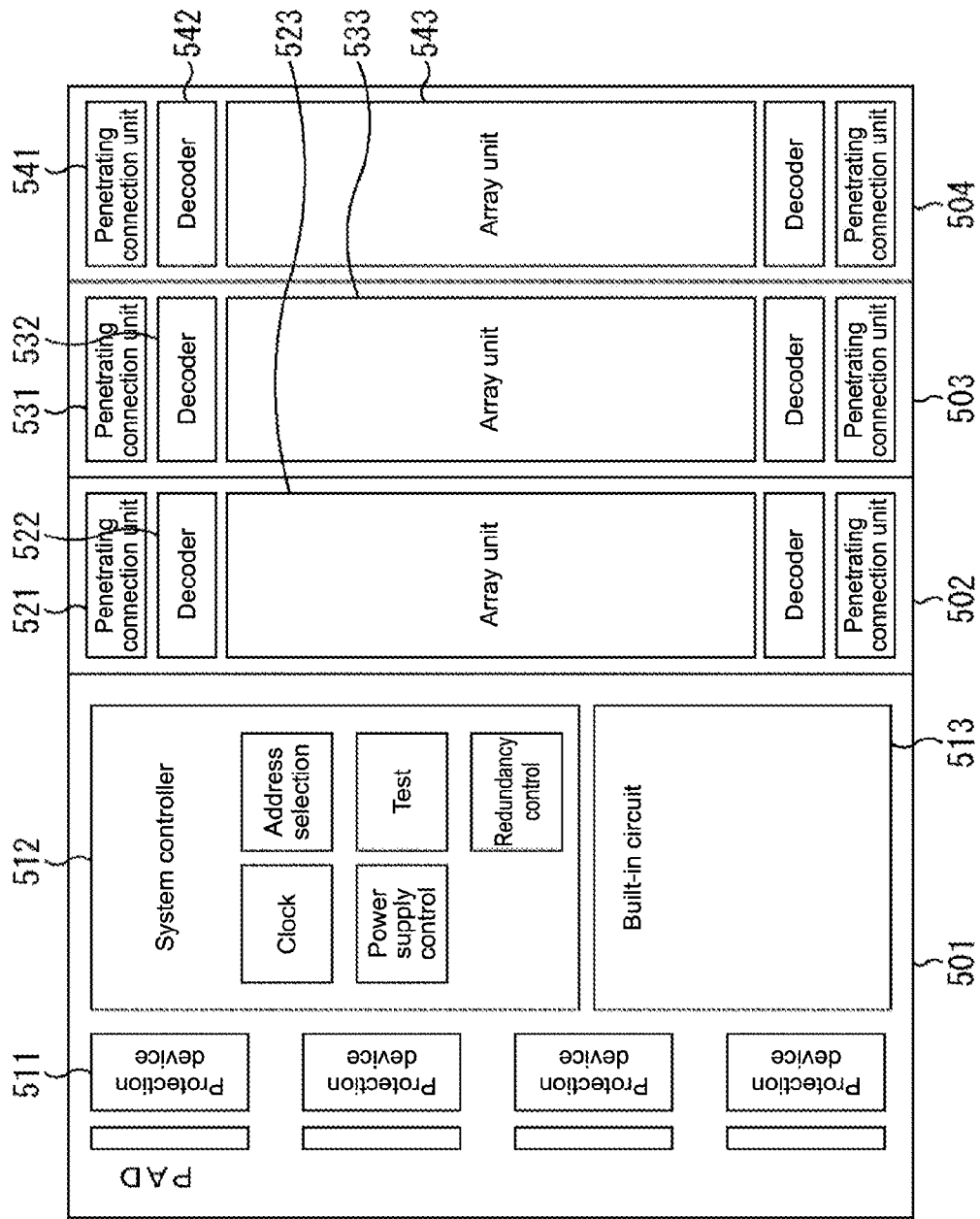
FIG. 14 A diagram for explaining an application example.

With reference to FIG. 14, a device arrangement to which the embodiment described above is applied will be described.

Protection devices 511, a system controller 512, a built-in circuit 513, and the like are arranged on a wafer 501. The system controller 512 includes clock generation unit that generates clocks for controlling respective units, an address selection unit that controls data reading/writing addresses, a power supply control unit that controls power supply with respect to the respective units, a test unit that carries out operation tests and the like, a redundancy control unit that carries out processing of replacing a defective row by a redundant row and the like, and the like. External connection terminals (PADs) are also formed on the wafer 501.

Penetrating connection units 521, decoders 522, and an array unit 523 are formed on a wafer 502. Wafers 503 and 504 have configurations similar to that of the wafer 502. In other words, the wafers 502 to 504 are wafers that can be produced using the same mask.

In a case where the wafers 502 to 504 are each a memory, a chip including 3 layers of memories is obtained. Moreover, although 3 layers of memories are obtained, since an address for identifying a layer is assigned and a defective row can be replaced by not only a redundant row of the same layer but by a redundant row of multiple layers, the memories can be handled as if they are a memory of one layer.

For not making a useless free space at the time of chip segmentation, it is desirable for the circuit chip of the wafer 501 and the array chip of the wafers 502 to 504 to be configured in the same chip size.

Figure 15:
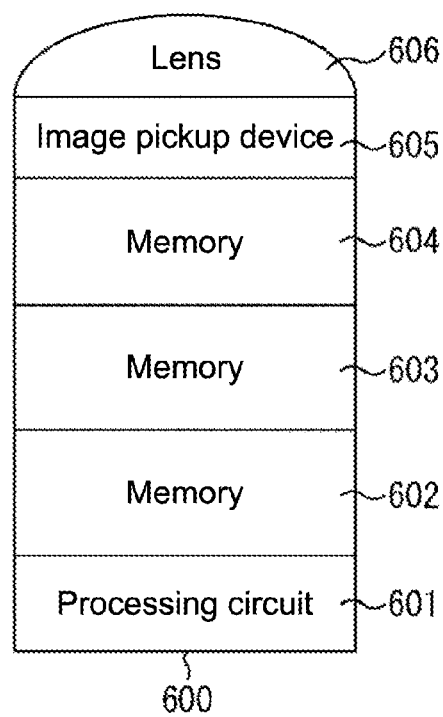
FIG. 15 A diagram for explaining an application example.

FIG. 15 is a diagram showing a configuration of an image sensor to which the embodiment described above is applied. In an image sensor 600 shown in FIG. 15, 3 layers of memories 602 to 604 are laminated on a processing circuit 601. An image pickup device 605 is further laminated on the memory 604, and an on-chip lens 606 is laminated on the image pickup device 605.

In the image sensor 600, data of signals received by the image pickup device 605 is written in the memories 602 to 604, and the processing circuit 601 processes the data written in the memories 602 to 604.

The memories 602 to 604 each include the penetrating electrodes described with reference to FIGS. 1 to 7, for example, and addresses for identifying the respective layers are written so that the memories can be handled as if they are a single memory.

By applying the embodiment described above to realize the function of writing addresses of upper and lower layers in the memory wafers (memories 602 to 604), the number of memory wafers can be increased/decreased. By this method, the capacity of the memory to be mounted can be changed to multiple-folds without changing the circuit functions or the specification of the image sensor.

In the image sensor 600 shown in FIG. 15, the image pickup device is laminated on a device structure obtained by laminating a plurality of array devices. A light reception unit (image pickup device 605) requisite for the image sensor is formed at a top layer on a side where a color filter provided between the image pickup device 605 and the on-chip lens 606 is formed. It should be noted that although FIG. 15 shows the example where the on-chip lens 606 is laminated, a structure in which the on-chip lens 606 is not provided may be adopted instead.

The image sensor 600 shown in FIG. 15 has a structure in which the plurality of memory wafers (memories 602 to 604) are laminated on the control circuit wafer (processing circuit 601) as an example of the lower-layer structure of the image pickup device 605.

Since the image sensor 600 having such a structure becomes an image sensor having the memories 602 to 604 incorporated therein, processing of compression, correction, and the like can be carried out on stored image data without passing through an output of an interface, and thus low-power-consumption and high-velocity image processing becomes possible.

It is desirable for the memory capacity to be mounted at this time to become variable in accordance with a recording time of a moving image or a processing content, but it may be difficult to change the planar scale in view of the chip size described above. However, in the present technology, by laminating a plurality of memory substrates for use, it becomes possible to change the memory capacity to be mounted to multiple-folds even when using the same image sensor and circuit wafer and enable a memory mounting capacity corresponding to a cost to be selected in accordance with a pixel count and a circuit size, to thus widen an application range.

Figure 16:
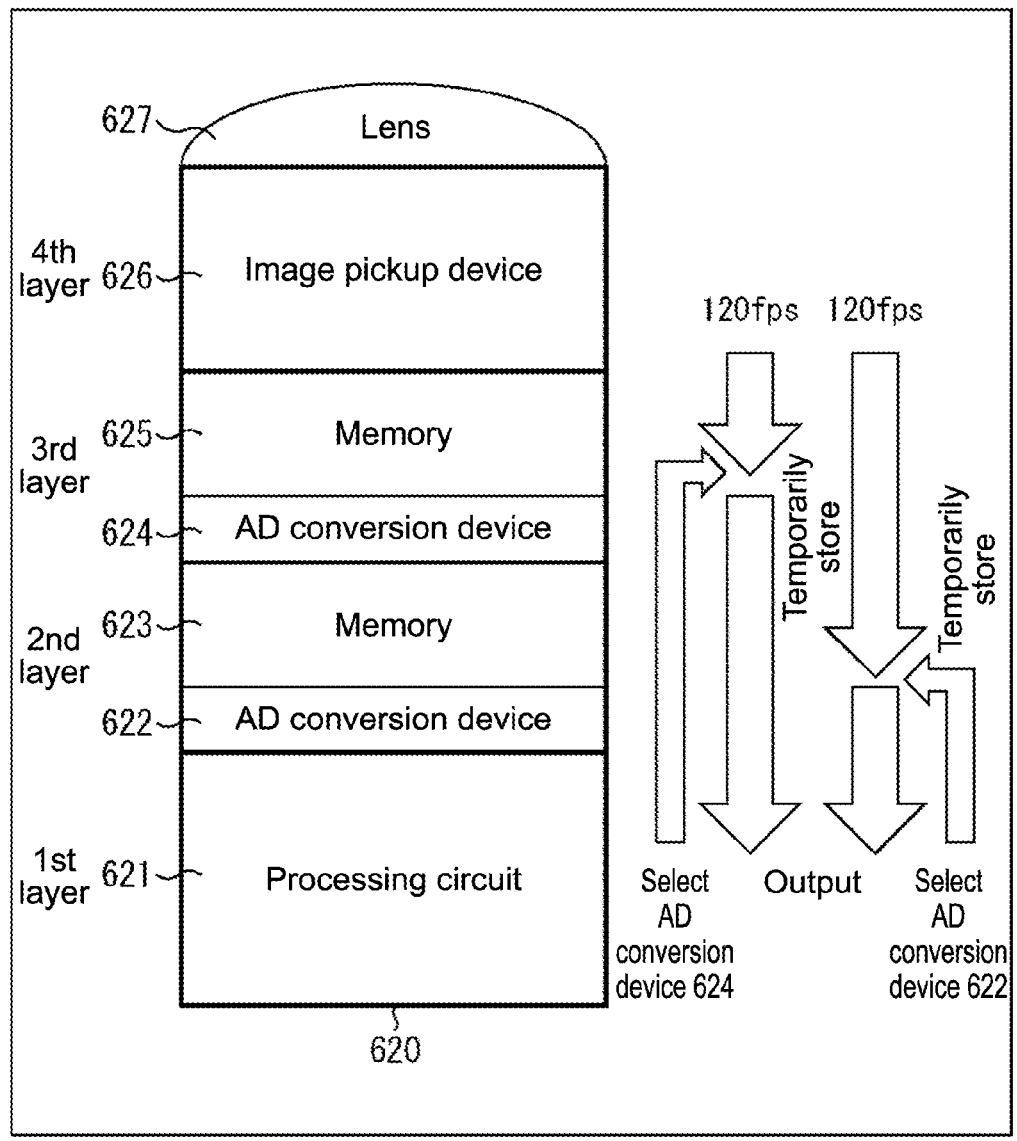
FIG. 16 A diagram for explaining an application example.

Further, as shown in FIG. 16, it is also possible to provide 2 layers of memories in an image sensor 620 to raise a conversion velocity. In the image sensor 620 shown in FIG. 16, when a bottom layer is set as a first layer, a processing circuit 621 is laminated in the first layer, an AD conversion device 622 and memory 623 are laminated in a second layer, an AD conversion device 624 and memory 625 are laminated in a third layer, an image pickup device 626 is laminated in a fourth layer, and a lens 627 is laminated in a fifth layer.

Each of the layers includes the penetrating electrodes described with reference to FIGS. 1 to 7, for example, so that data exchange can be performed via the penetrating electrodes.

The second and third layers have the same configuration and each include the AD conversion device and the memory. With such a configuration, processing as shown in the right-hand diagram of FIG. 16 becomes possible, for example. For example, signals of an image captured by the image pickup device 626 are processed by the AD conversion device 624 of the third layer, and the processing result is temporarily stored in the memory 625. Alternatively, signals of an image captured by the image pickup device 626 are processed by the AD conversion device 624 of the third layer and then output to the processing circuit 621, and the processing result processed by the processing circuit 621 is temporarily stored in the memory 625.

While the processing as described above is carried out in the third layer, similar processing is carried out in the second layer. Specifically, while a result of the conversion by the AD conversion device 624 of the third layer or a result of the processing by the processing circuit 621 is stored in the memory 625, a result of the conversion by the AD conversion device 622 of the second layer or a result of the processing by the processing circuit 621 is stored in the memory 623. The processing results are temporarily stored in the memory 623 or the memory 625 while processing proceeds in the processing circuit 621.

As a result, a processing velocity can be raised.

Figure 17:
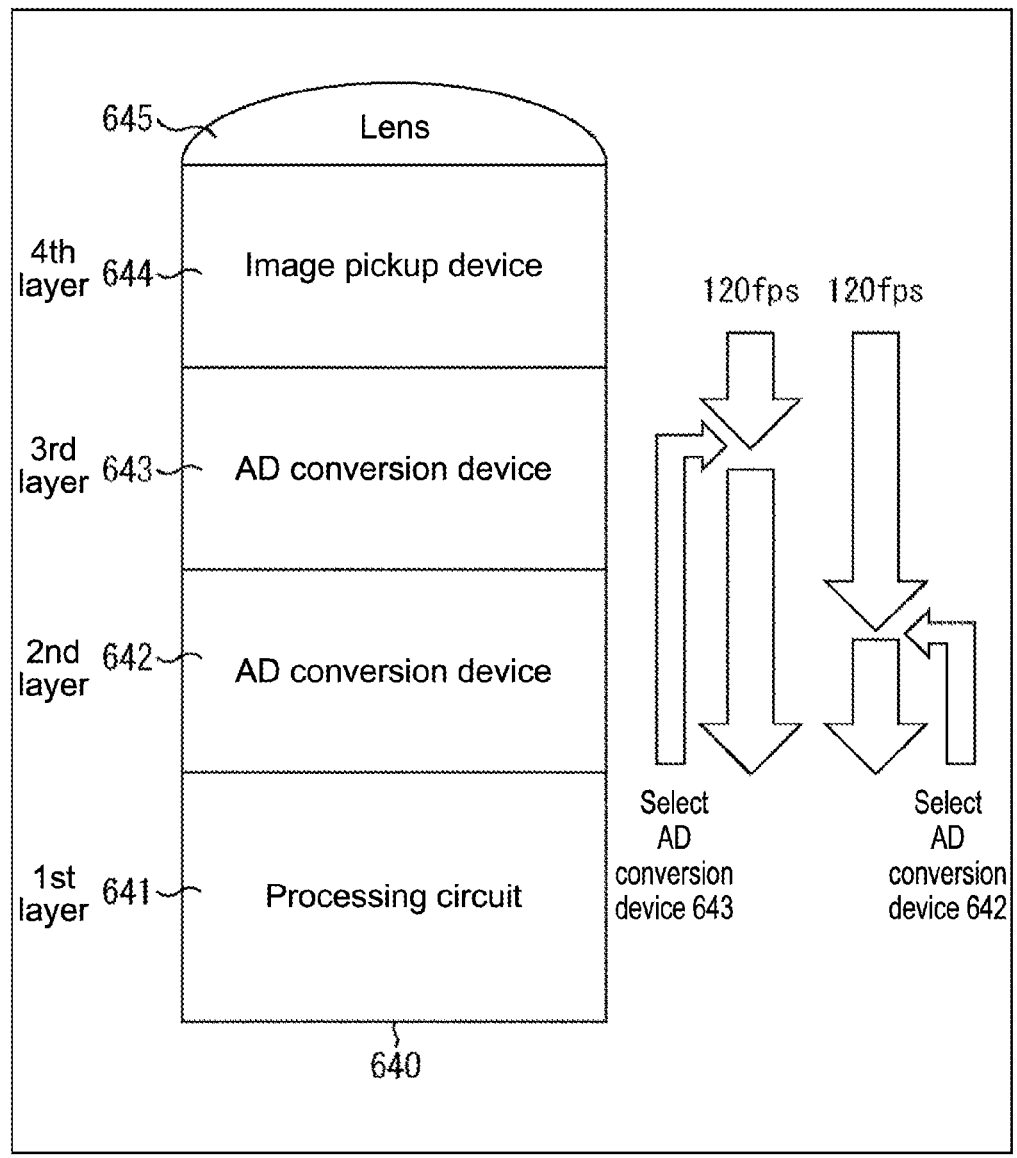
FIG. 17 A diagram for explaining an application example.

Further, by configuring the image sensor as shown in FIG. 17, the processing velocity can be raised. In an image sensor 640 shown in FIG. 17, when a bottom layer is set as the first layer, a processing circuit 641 is laminated in the first layer, an AD conversion device 642 is laminated in the second layer, an AD conversion device 643 is laminated in the third layer, an image pickup device 644 is laminated in the fourth layer, and a lens 645 is laminated in the fifth layer.

Also in this case, each of the layers includes the penetrating electrodes described with reference to FIGS. 1 to 7, for example, so that data exchange can be performed via the penetrating electrodes.

The second and third layers have the same configuration and each include the AD conversion device. With such a configuration, processing as shown in the right-hand diagram of FIG. 17 becomes possible, for example. For example, signals of an image captured by the image pickup device 644 are processed by the AD conversion device 643 of the third layer, and the processing result is output to the processing circuit 621 to be processed.

While the processing as described above is carried out in the third layer, similar processing is carried out in the second layer. Specifically, while a result of the conversion by the AD conversion device 624 of the third layer is output to the processing circuit 641, a conversion is executed by the AD conversion device 642 of the second layer. For example, in a case where the image pickup device 644 captures an image at 120 fps, the processing circuit 641 can process at 240 ftp since the AD conversion device 642 of the second layer and the AD conversion device 643 of the third layer can each process 120 fps.

Specifically, with such a configuration, the AD conversion device 642 and the AD conversion device 643 can alternately output 120 ftp each time to the processing circuit 641 so as to realize twice the conversion velocity.

It should be noted that instead of carrying out the same processing in the AD conversion device 642 and the AD conversion device 643, it is also possible for the AD conversion device 642 to process signals from pixels having a long exposure and the AD conversion device 643 to process signals from pixels having a short exposure and thus process signals from pixels having different exposure times.

Moreover, the AD conversion device 642 may perform a conversion for generating a still image, and the AD conversion device 643 may perform a conversion for generating a moving image, and thus generate different images.

Figure 18:
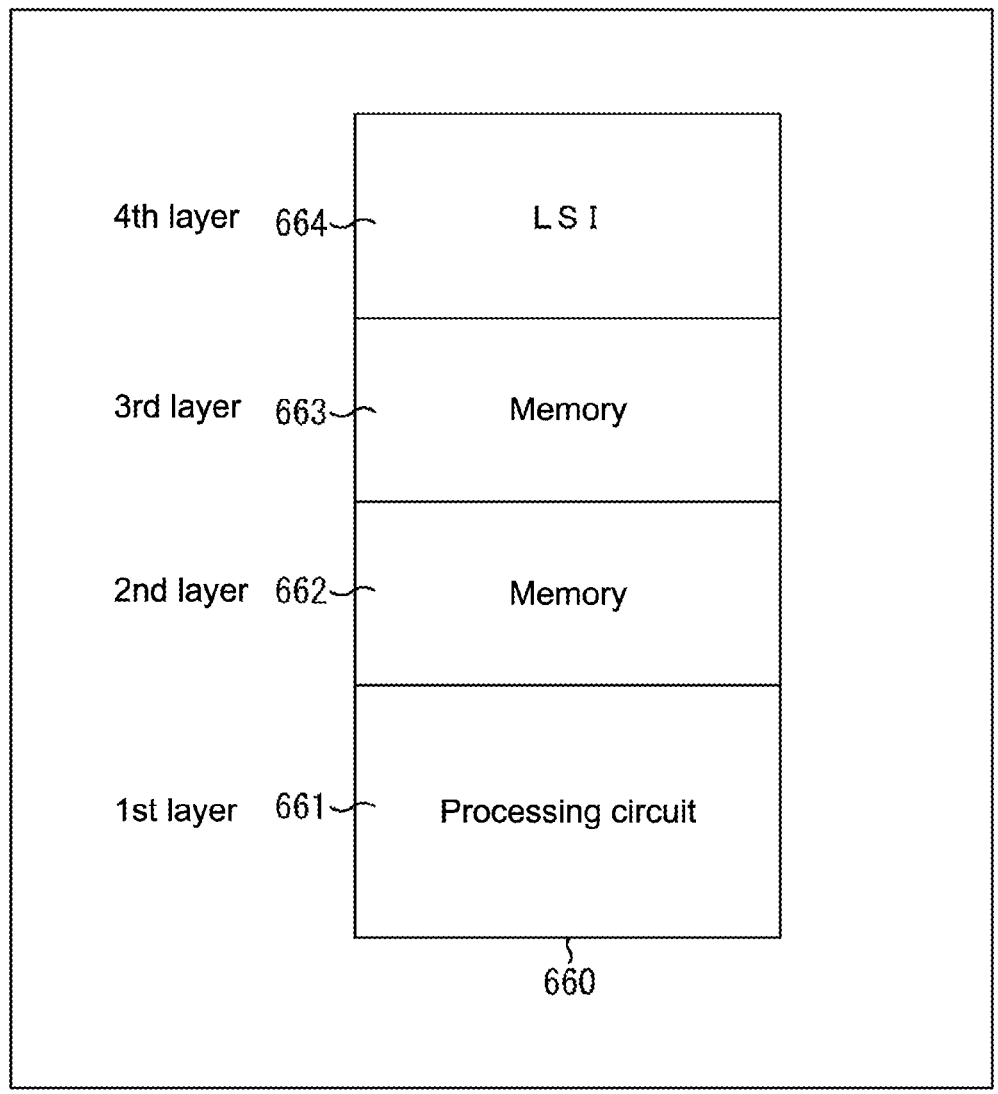
FIG. 18 A diagram for explaining an application example.

The application range of the present technology is not limited to the image sensor, and the present technology is also applicable to an apparatus as shown in FIG. 18, for example.

An apparatus 660 shown in FIG. 18 includes a processing circuit 661 in a first layer, a memory 662 in a second layer, a memory 663 in a third layer, and an LSI (Large-Scale Integration) 664 in a fourth layer. Data to be processed and data processed by the LSI 664 are temporarily stored in the second-layer memory 662 or the third-layer memory 663.

The LSI 664 is an RF chip for high-velocity communication, for example, and may be a circuit that cannot be mounted on the same substrate as the processing circuit 661. With the structure that enables the LSI 664 and the memories 662 and 663 to exchange data without passing through I/O (Input/output), that is, with the structure that enables the memories to be laminated in multilayers and data to be exchanged with the LSI 664 without passing through I/O, the number of components can be reduced, and additional miniaturization and an increase of the processing velocity can be expected.

Also in this case, each of the layers includes the penetrating electrodes described with reference to FIGS. 1 to 7, for example, so that data exchange can be performed via the penetrating electrodes.

<Regarding Application Example (Memory)>

As another application example that uses the wiring connection structure of the present technology, an embodiment in which the wiring connection structure of the present technology is applied to a laminated memory structure in which a plurality of memory devices (i.e., memory chips or memory dies) are laminated will be described.

In the embodiment described with reference to FIGS. 1 to 7, the case where an address (stack address) for identifying which layer each of the memory chips of the respective layers is laminated in is stored to perform writing and reading of data has been exemplified. In contrast, in this application example (structure of first to fifth laminated memories described below), a case where the memory chips of the respective layers store such addresses and perform processing and a case where they do not store such addresses and perform processing will be taken as an example to explain a case where a memory is additionally laminated.

In the embodiment below, a case where memories are laminated in 8 layers will be taken as an example. Moreover, a 16-bit DDR3 memory is taken as an example of the memory used in the embodiment below. First, the case where the memory chips of the respective layers do not store an address and perform processing will be described.

(Structure of First Laminated Memory)

A structure of a first laminated memory is a laminated memory structure obtained by laminating a plurality of memory chips and a control chip that controls operations of the plurality of memory chips. In the first laminated memory structure, signal lines that transmit data to be written in the memories or data read out from the memories are independently connected to the respective memory chips included in the laminated memory structure.

A signal line that transmits control signals for transmitting an address, a command, and the like that are requisite for controlling a writing operation and reading operation with respect to the memories is shared (multiplexed) by the memory chips included in the laminated memory structure. A signal line that transmits a signal for designating or specifying a memory to carry out the writing operation or the reading operation is shared (multiplexed) by the memory chips included in the laminated memory structure.

Figure 19:
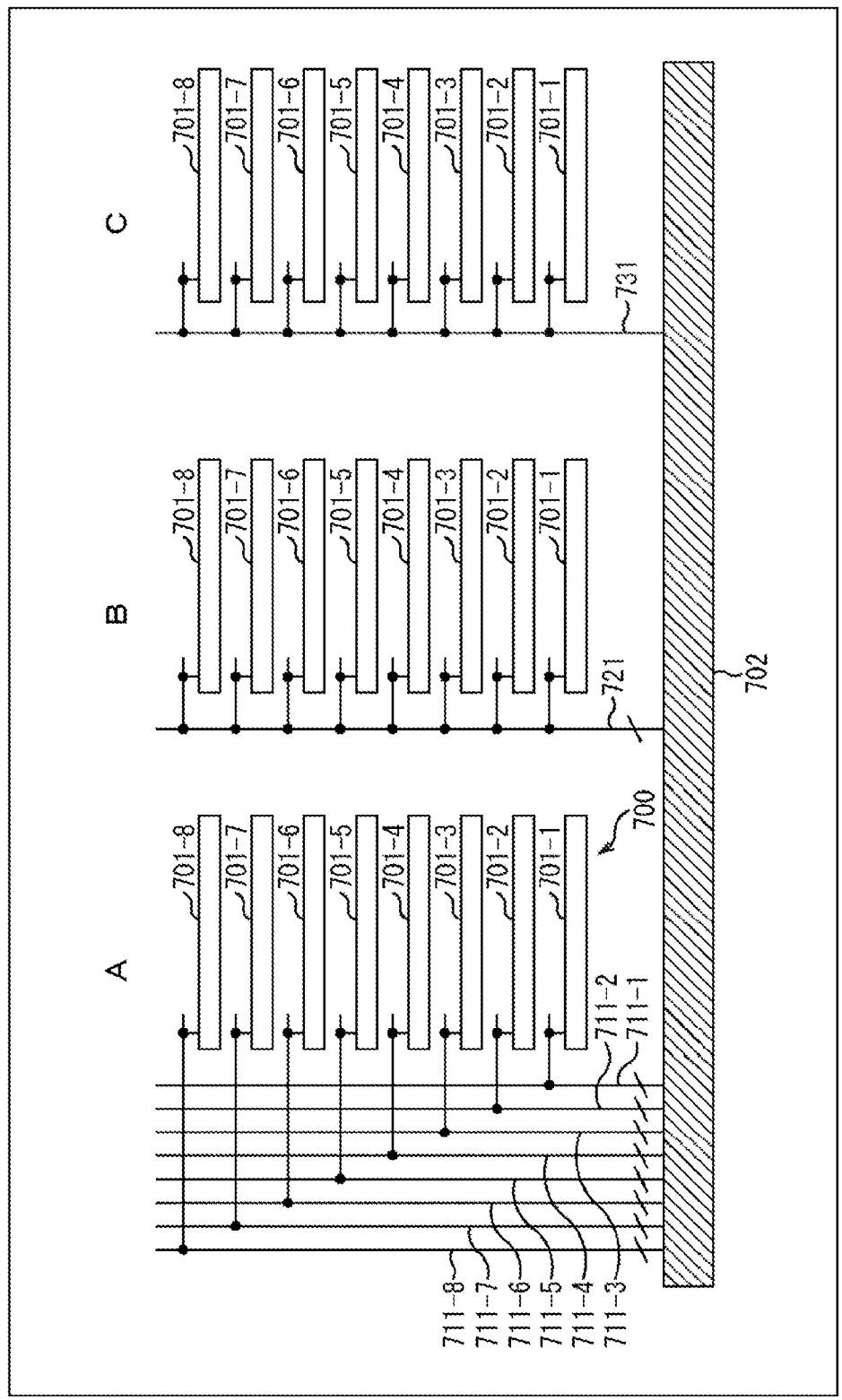
FIG. 19 Diagrams for explaining an application example with respect to a laminated memory.

FIG. 19 are schematic diagrams each showing a connection structure of wirings with respect to the memory chips in a laminated memory structure 700. Here, FIG. 19 are diagrams showing a configuration of the laminated memory in a case where data signal lines for transmitting/receiving data are not multiplexed.

It should be noted that "data signal lines are not multiplexed" expresses a structure in which data lines connected to the memory chips in the laminated memory structure are wired independently for each memory chip.

In the laminated memory structure 700 shown in FIG. 19, 8 memory chips 701-1 to 701-8 are laminated. FIG. 19A shows the wiring structure of the data signal lines, FIG. 19B shows a wiring structure of a control signal line for transmitting an address, a command, and the like that are requisite for controlling the writing operation and reading operation with respect to the memories, and FIG. 19C shows a wiring structure of the signal line that transmits a signal for designating or specifying a memory to carry out the writing operation or the reading operation.

It should be noted that as the chip designation signal line for designating or specifying a memory to be operated, a chip designation signal line of the memory or a part of the control signal line can be used, for example.

The laminated memory structure 700 shown in FIG. 19 includes a control chip 702 that controls the data writing operation and reading operation with respect to the memory chips. The data signal lines, the control signal line, and the chip designation signal line shown in FIGS. 19A to 19C are wired between the control chip 702 and the memory chips included in the laminated memory structure 700.

As shown in FIG. 19A, the data signal lines are respectively provided for the memory chips 701-1 to 701-8. In other words, a data signal line 711-1 is connected to the memory chip 701-1, a data signal line 711-2 is connected to the memory chip 701-2, a data signal line 711-3 is connected to the memory chip 701-3, a data signal line 711-4 is connected to the memory chip 701-4, a data signal line 711-5 is connected to the memory chip 701-5, a data signal line 711-6 is connected to the memory chip 701-6, a data signal line 711-7 is connected to the memory chip 701-7, and a data signal line 711-8 is connected to the memory chip 701-8.

In the case where each of the memory chips 701-1 to 701-8 is a 16-bit DDR3, the data signal lines 711-1 to 711-8 are each a signal line for transmitting/receiving 16-bit data, and such signal lines are connected separately to the 8 memories (8 chips). By the structure in which the data signal lines 711-1 to 711-8 are wired in parallel, the laminated memory structure 700 shown in FIG. 19 can simultaneously write or read data of 16*8 bits, that is, 128 bits. With such a configuration, high-velocity communication becomes possible.

The data signal lines 711-1 to 711-8 are provided as the penetrating electrodes described above. In this case, penetrating electrodes (first penetrating electrodes) that configure a part of the data signal lines 711-1 to 711-8 and become one penetrating electrode that penetrates the layers when laminated are provided. Further, penetrating electrodes (second penetrating electrodes) used for connecting with these penetrating electrodes are provided.

In descriptions below, unless there is a need to distinguish the data signal lines 711-1 to 711-8 from one another, the data signal lines will simply be referred to as data signal lines 711. Similarly, unless there is a need to distinguish the memory chips 701-1 to 701-8 from one another, the memory chips will simply be referred to as memory chips 701. The same holds true for other portions.

It should be noted that although the memory chips 701 are illustrated in a square and the data signal lines 711 connecting the memory chips 701 and the control chip 702 are wired outside the memory chips 701 to be connected to the control chip 702 in FIG. 19, such an illustration is made merely for explaining the wiring structure of the data signal lines 711, and the data signal lines 711 are wired inside areas of the memory chips 701 as will be described later with reference to FIG. 20. Moreover, as will be described later with reference to FIG. 21, the memory chips 701 include areas where the first penetrating electrodes and second penetrating electrodes configuring the data signal lines 711 are to be arranged.

Further, although the wiring structures of the control signal line 721 and the chip designation signal line 731 are shown in FIGS. 19B and 19C, those lines are also arranged in the area of the memory chips like the data signal lines 711. Moreover, although the memory chips 701 are illustrated in each of FIGS. 19A, 19B, and 19C, those are illustrated separately merely for the description, and the data signal line 711, the control signal line 721, and the chip designation signal line 731 are arranged in predetermined areas of the same (same layer) memory chip 701.

Referring back to FIG. 19A, one penetrating electrode (corresponding to first penetrating electrodes) that penetrates the memory chips 701-1 to 701-8 is provided as a penetrating electrode of the data signal line 711-1 in the longitudinal direction, for example. Further, a connection is made to the first penetrating electrode by an electrode connected only to the memory chip 701-1 (second penetrating electrode).

It should be noted that in a case where one data signal line 711 performs a 16-bit parallel transmission, the 16-bit parallel transmission is realized by providing 16 first penetrating electrodes and second penetrating electrodes. Although one first penetrating electrode and one second penetrating electrode (data signal line 711 including first penetrating electrode and second penetrating electrode) are illustrated in the figure, 16 electrodes are provided for performing the 16-bit parallel transmission.

For example, in a case where the memory chip 701-1 corresponds to the chip 60 shown in FIG. 3, the first penetrating electrode that is provided in the longitudinal direction and configures the data signal line 711-1 is a penetrating electrode corresponding to the penetrating electrode 65 shown in FIG. 3. Referring to FIG. 3, the penetrating electrode 65, the penetrating electrode 76, and the penetrating electrode 85 configure one penetrating electrode in the longitudinal direction, and this penetrating electrode is provided as the electrode that penetrates the chip 60, the chip 70, and the chip 80. In this way, the longitudinal direction of the data signal line 711-1 is provided as one penetrating electrode that penetrates a plurality of chips.

Further, the electrode connected only to the penetrating electrode 65 and the memory chip 701-1 (second penetrating electrode) corresponds to the back-surface wiring 68 in the lateral direction, the penetrating electrode 67, and the surface wiring 66 (corresponds to penetrating electrode 67 in particular) in FIG. 3. While the device 69 in the chip 60 is connected to the penetrating electrode 65 by the back-surface wiring 68, the penetrating electrode 67, and the surface wiring 66, such electrodes (wirings) are provided as wirings configuring a part of the data signal line 711-1.

This will further be described with reference to FIG. 20. FIG. 20 is a diagram for explaining a relationship between the data signal lines 711-1 to 711-8 and the penetrating electrodes, the diagram showing the data signal lines 711-1 to 711-8 in a state where the memory chips 701-1 to 701-8 are laminated.

Figure 20:
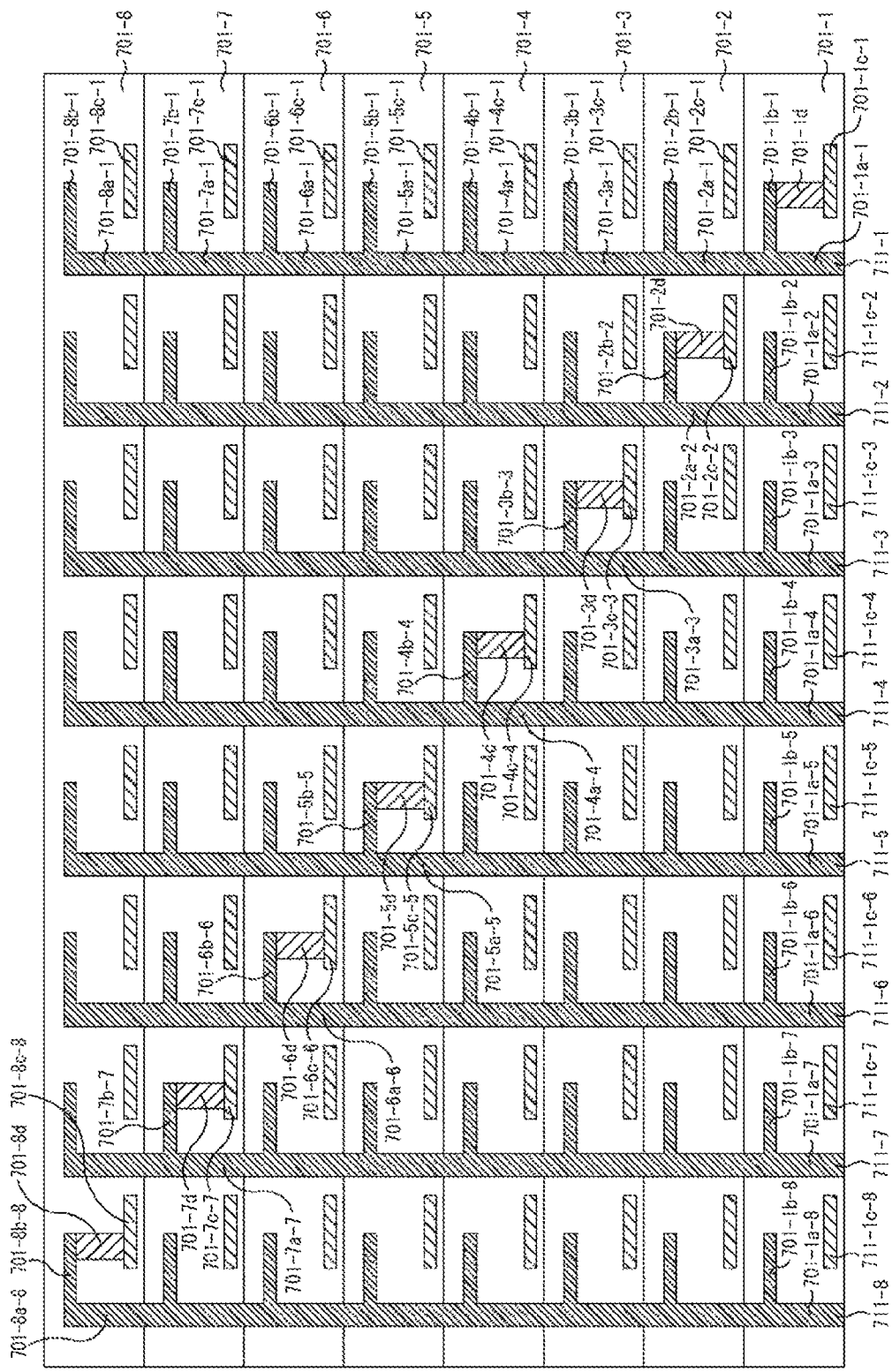
FIG. 20 A diagram for explaining the penetrating electrodes when applied to the laminated memory.

In FIG. 20, portions appended with a symbol "a" correspond to the first penetrating electrodes and correspond to the penetrating electrode 61 and the penetrating electrode 65 shown in FIG. 3, for example. Also in FIG. 20, portions appended with a symbol "b" correspond to the back-surface wirings and correspond to the back-surface wiring 63 and the back-surface wiring 68 shown in FIG. 3, for example.

Also in FIG. 20, portions appended with a symbol "c" correspond to the surface wirings and correspond to the surface wiring 62 and the surface wiring 66 shown in FIG. 3, for example. Also in FIG. 20, portions appended with a symbol "d" correspond to the second penetrating electrodes and correspond to the penetrating electrode 67 and the penetrating electrode 73 shown in FIG. 3, for example.

Penetrating electrodes 701-1a-1 to 701-1a-8, back-surface wirings 701-1b-1 to 701-1b-8, surface wirings 701-1c-1 to 701-1c-8, and a penetrating electrode 701-1d are formed in the memory chip 701-1 configuring the laminated memory structure 700. It should be noted that although a device corresponding to the device 64 shown in FIG. 3, for example, is not illustrated in FIG. 20, the device is also provided and connected to the surface wiring 701-1c.

Similarly, penetrating electrodes 701-2a-1 to 701-2a-8, back-surface wirings 701-2b-1 to 701-2b-8, surface wirings 701-2c-1 to 701-2c-8, and a penetrating electrode 701-2d are formed in the memory chip 701-2. It should be noted that a description of a part of the symbols is omitted in FIG. 20.

Similarly, penetrating electrodes 701-3a-1 to 701-3a-8, back-surface wirings 701-3b-1 to 701-3b-8, surface wirings 701-3c-1 to 701-3c-8, and a penetrating electrode 701-3d are formed in the memory chip 701-3.

Similarly, penetrating electrodes 701-4a-1 to 701-4a-8, back-surface wirings 701-4b-1 to 701-4b-8, surface wirings 701-4c-1 to 701-4c-8, and a penetrating electrode 701-4d are formed in the memory chip 701-4.

Similarly, penetrating electrodes 701-5a-1 to 701-5a-8, back-surface wirings 701-5b-1 to 701-5b-8, surface wirings 701-5c-1 to 701-5c-8, and a penetrating electrode 701-5d are formed in the memory chip 701-5.

Similarly, penetrating electrodes 701-6a-1 to 701-6a-8, back-surface wirings 701-6b-1 to 701-6b-8, surface wirings 701-6c-1 to 701-6c-8, and a penetrating electrode 701-6d are formed in the memory chip 701-6.

Similarly, penetrating electrodes 701-7a-1 to 701-7a-8, back-surface wirings 701-7b-1 to 701-7b-8, surface wirings 701-7c-1 to 701-7c-8, and a penetrating electrode 701-7d are formed in the memory chip 701-7.

Similarly, penetrating electrodes 701-8a-1 to 701-8a-8, back-surface wirings 701-8b-1 to 701-8b-8, surface wirings 701-8c-1 to 701-8c-8, and a penetrating electrode 701-8d are formed in the memory chip 701-8.

The penetrating electrode 701-1a-1 of the memory chip 701-1, the penetrating electrode 701-2a-1 of the memory chip 701-2, the penetrating electrode 701-3a-1 of the memory chip 701-3, the penetrating electrode 701-4a-1 of the memory chip 701-4, the penetrating electrode 701-5a-1 of the memory chip 701-5, the penetrating electrode 701-6a-1 of the memory chip 701-6, the penetrating electrode 701-7a-1 of the memory chip 701-7, and the penetrating electrode 701-8a-1 of the memory chip 701-8 are connected to one another and configure one first penetrating electrode (hereinafter, referred to as first penetrating electrode 711-1 as appropriate).

This first penetrating electrode 711-1 is an electrode that configures a part of the data signal line 711-1.

The data signal line 711-1 is connected to the memory chip 701-1. The penetrating electrode 701-1d is formed in the memory chip 701-1. The penetrating electrode 701-1d corresponds to the second penetrating electrode. The penetrating electrode 701-1d is connected to the back-surface wiring 701-1b-1 and the surface wiring 701-1c-1. The back-surface wiring 701-1b-1 is connected to the penetrating electrode 701-1a-1 (first penetrating electrode 711-1).

Accordingly, the device (not shown) of the memory chip 701-1 connected to the surface wiring 701-1c-1 is connected to the first penetrating electrode 711-1 via the surface wiring 701-1c-1, the penetrating electrode 701-1d, and the back-surface wiring 701-1b-1.

The second penetrating electrode connected to the first penetrating electrode 711-1 is only the penetrating electrode 701-1d in the memory chip 701-1. In other words, of the surface wirings 701-1c-1 to 701-1c-8, only the surface wiring 701-1c-1 is connected to the first penetrating electrode 711-1.

Accordingly, at a time data is transmitted to the data signal line 711-1, the memory chip 701 including the device to which the data is supplied is the memory chip 701-1 having a surface wiring connected to the first penetrating electrode 711-1, and the data is not supplied to the other memory chips 701-2 to 701-8.

Similarly, the penetrating electrode 701-2d is provided in the memory chip 701-2 as the penetrating electrode corresponding to the second penetrating electrode. This penetrating electrode 701-2d is connected to a first penetrating electrode 711-2 (penetrating electrode 701-2a-2 included in first penetrating electrode 711-2) configuring the data signal line 711-2.

Accordingly, at a time data is transmitted to the data signal line 711-2, the memory chip 701 including the device to which the data is supplied is the memory chip 701-2 having a surface wiring connected to the first penetrating electrode 711-2.

Other data signal lines 711-3 to 711-8 are similarly configured by penetrating electrodes (first penetrating electrodes) that each penetrate the plurality of chips and electrodes (second penetrating electrodes, surface wirings, and back surface wirings) for connecting the first penetrating electrodes with the memory chips 701-2 to 701-8, respectively.

The signal lines described below are also similarly configured by the first penetrating electrodes that each penetrate the plurality of chips and the second penetrating electrodes for respectively connecting with the first penetrating electrodes, so descriptions thereof will be omitted.

In each of the memory chips 701, the first penetrating electrode that penetrates the plurality of chips is provided at 8 positions as the data signal line 711 used for transmitting 1-bit data, and the second penetrating electrode connected to the first penetrating electrode is provided at one position. The first penetrating electrodes provided in each of the memory chips 701 are provided at the same positions within the memory chips 701, and the second penetrating electrodes are provided at positions that differ for each of the memory chips 701.

In the case of performing a 16-bit parallel transmission, 128 (16*8) first penetrating electrodes are provided for the data signal lines 711, and 16 second penetrating electrodes are provided in each of the memory chips 701. The 128 first penetrating electrodes provided in each of the memory chips 701 are provided at the same positions in all the memory chips 701, and the 16 second penetrating electrodes are provided at positions that differ for each of the memory chips 701.

Here, with reference to FIG. 21, configurations of the memory chip 701 (memory chip 701-1 is exemplified in FIG. 21) and the control chip 702 will be described.

The configuration of the memory chip 701-1 shown on the right-hand side of FIG. 21 will first be described. The memory chip 701-1 is configured by a memory cell array area 705 where a memory cell array is arranged, a second penetrating electrode arrangement area 706 where a drive circuit of the memory cell array included in the memory chip 701-1 and the second penetrating electrodes are arranged, and a first penetrating electrode arrangement area 707 where the first penetrating electrodes of the memory chip 701-1 are arranged.

In the first penetrating electrode arrangement area 707, 16 penetrating electrodes each corresponding to the penetrating electrode 701-1*a*-1 of FIG. 20 are provided so as to enable a 16-bit parallel transmission to be performed. In other words, as shown in FIG. 21, 16 first penetrating electrodes, that is, penetrating electrodes 701-1*a*-1-1 to 701-1*a*-1-16, are formed in the first penetrating electrode arrangement area 707.

In the memory chip 701-1, the penetrating electrodes 701-1*a*-1-1 to 701-1*a*-1-16 are connected to the second penetrating electrodes, which are also provided at 16 positions to enable the 16-bit parallel transmission to be performed. Specifically, as shown in FIG. 21, 16 second penetrating electrodes 701-1*d*-1 to 701-1*d*-16 are formed in the second penetrating electrode arrangement area 706.

In the memory chip 701-1, the penetrating electrodes 701-1*a*-1-1 to 701-1*a*-1-16 are respectively connected to the penetrating electrodes 701-1*d*-1 to 701-1*d*-16 via back-surface wirings 701-1*b*-1-1 to 701-1*b*-1-16.

In the first penetrating electrode arrangement area 707 of the memory chip 701-1, penetrating electrodes related to the penetrating electrodes 701-1*a*-2 to 701-1*a*-8 are also formed. In other words, penetrating electrodes 701-1*a*-2-1 to 701-1*a*-2-16 configuring a part of the data signal line 711-2 are formed in the first penetrating electrode arrangement area 707.

Similarly, penetrating electrodes 701-1*a*-3-1 to 701-1*a*-3-16 configuring a part of the data signal line 711-3, penetrating electrodes 701-1*a*-4-1 to 701-1*a*-4-16 configuring a part of the data signal line 711-4, and penetrating electrodes 701-1*a*-5-1 to 701-1*a*-5-16 configuring a part of the data signal line 711-5 are formed in the first penetrating electrode arrangement area 707.

In addition, penetrating electrodes 701-1*a*-6-1 to 701-1*a*-6-16 configuring a part of the data signal line 711-6, penetrating electrodes 701-1*a*-7-1 to 701-1*a*-7-16 configuring a part of the data signal line 711-7, and penetrating electrodes 701-1*a*-8-1 to 701-1*a*-8-16 configuring a part of the data signal line 711-8 are formed in the first penetrating electrode arrangement area 707.

In this way, in the case of the memory chip 701-1, the penetrating electrodes 701-1*a*-1 to 701-1*a*-8 corresponding to the first penetrating electrodes are provided in the memory chip 701-1, and each of the penetrating electrodes 701-1*a* is provided at 16 positions so as to enable a 16-bit parallel transmission to be performed. Accordingly, the first penetrating electrode alone is provided at 128 (=8*16) positions.

The first penetrating electrodes wired in the first penetrating electrode arrangement area 707 are all connected to the control chip 702. Referring to the left-hand diagram of FIG. 21, the control chip 702 is configured by a control circuit unit 703 where various circuits mounted on the control chip 702 are arranged and a first penetrating electrode arrangement area 704 where the first penetrating electrodes are arranged.

In the first penetrating electrode arrangement area 704 of the control chip 702, the first penetrating electrodes that are the same as the first penetrating electrodes arranged in the first penetrating electrode arrangement area 707 of the memory chip 701-1 are formed at the same positions.

Further, each of the first penetrating electrodes arranged in the first penetrating electrode arrangement area 704 of the control chip 702 is connected to the control circuit unit 703.

In this way, the first penetrating electrodes are arranged in the control chip 702. Moreover, the first penetrating electrodes and second penetrating electrodes are arranged in the memory chip 701-1.

Also the memory chips 701-2 to 701-8 are each configured by the memory cell array area 705, the second penetrating electrode arrangement area 706, and the first penetrating electrode arrangement area 707 as in the memory chip 701-1.

Figure 21:
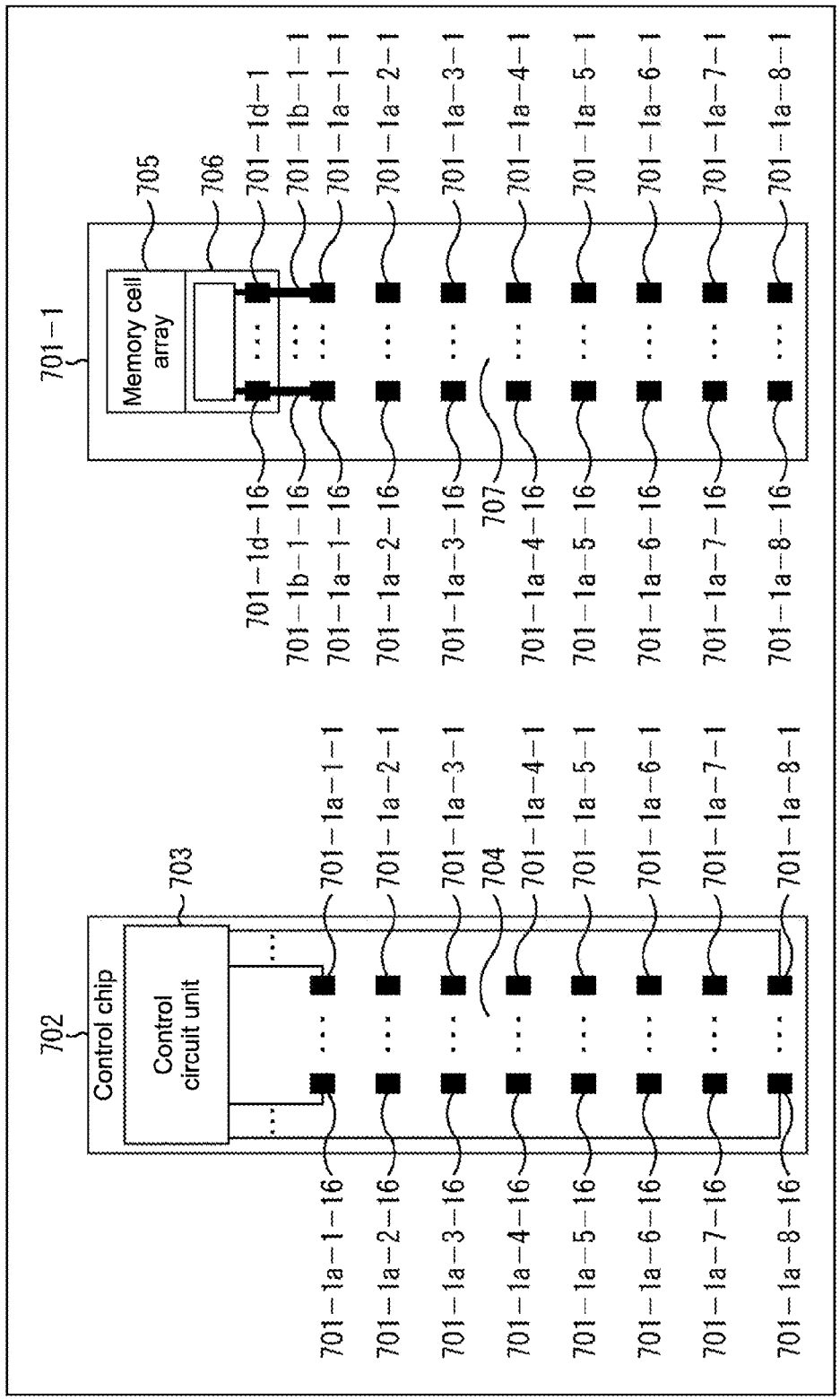
FIG. 21 A diagram for explaining configurations of a control chip and a memory chip.

Although not shown, in the first penetrating electrode arrangement area 707 of the memory chip 701-2, for example, the first penetrating electrodes are arranged at the same positions as the first penetrating electrodes arranged in the first penetrating electrode arrangement area 707 of the memory chip 701-1 shown in FIG. 21. Moreover, penetrating electrodes 701-2*d*-1 to 701-2*d*-16 are arranged in the second penetrating electrode arrangement area 706 of the memory chip 701-2.

The penetrating electrodes 701-2*d*-1 to 701-2*d*-16 arranged in the second penetrating electrode arrangement area 706 are connected to the penetrating electrodes 701-2*a*-1 to 701-2*a*-16 arranged in the first penetrating electrode arrangement area 707 via back-surface wirings 701-2*b*-1-1 to 701-2*b*-1-16.

In this way, in the case of the memory chip 701-1, the penetrating electrodes 701-1*a*-1 to 701-1*a*-8 corresponding to the first penetrating electrodes are provided in the memory chip 701-1, and each of the penetrating electrodes 701-1*a* is provided at 16 positions so as to enable a 16-bit parallel transmission to be performed. Accordingly, the first penetrating electrode alone is provided at 128 (=8*16) positions.

As the penetrating electrode corresponding to the second penetrating electrode, only the penetrating electrode 701-1*d* is provided in the memory chip 701-1. Accordingly, so as to enable a 16-bit parallel transmission to be performed by this penetrating electrode 701-1*d*, the penetrating electrode is provided at 16 positions. Accordingly, in the memory chip 701-1, 128 first penetrating electrodes and 16 second penetrating electrodes, that is, a total of 144 penetrating electrodes are provided for the data signal lines 711.

Also in the other memory chips 701-2 to 701-8, 144 penetrating electrodes are provided for the data signal lines 711.

In this way, by separately forming the positions of the second penetrating electrodes to be connected to the first penetrating electrodes configuring the data signal lines 711, a multilayer semiconductor memory structure for transmitting/receiving signals in parallel can be obtained.

Returning to the explanation of FIG. 19B, referring to FIG. 19B, an address (Address) signal line, a command (Command) signal line, a Vdd signal line, and a Vss signal line are provided as one signal line that is shared by the 8 memory chips 701-1 to 701-8 (hereinafter, referred to as control signal line 721).

The control signal line 721 is a signal line (multiplexed signal line) that is shared by the 8 memory chips 701, and one penetrating electrode (first penetrating electrodes) that penetrates the 8 memory chips 701 and the electrodes that connect that penetrating electrode to the respective memory chips 701 (second penetrating electrodes) are provided at the same positions in all the chips. In other words, the control signal line 721 is provided at two positions, that is, the first penetrating electrode and the second penetrating electrode, and the first penetrating electrode and the second penetrating electrode are provided at the same positions in all the memory chips 701.

It should be noted that the number of penetrating electrodes for the control signal line 721 also differs depending on the bit count of control data to be transmitted in parallel, like the penetrating electrodes of the data signal lines 711. For example, in a case where 8-bit data is transmitted in parallel as the control data, the penetrating electrodes for the control signal line 721 are provided 8 each with respect to the first penetrating electrode and the second penetrating electrode, that is, a total of 16, in one memory chip 701.

In this way, the control signal line 721 is provided as a signal line that is multiplexed by 8 to be shared by the memory chips 701 laminated in 8 layers.

As shown in FIG. 19C, the chip designation signal line 731 that transmits a signal for designating a memory (chip) to write/read data with respect to the memory chips 701-1 to 701-8 is set in common for the memory chips 701-1 to 701-8. Further, the chip designation signal line 731 is a signal line that transmits 1-bit data.

Since the chip designation signal line 731 is a signal line that transmits 1-bit data, one first penetrating electrode and one second penetrating electrode are provided in one memory chip 701.

In a case where "1" is transferred as data to the chip designation signal line 731, for example, writing to the memory chip 701 or reading from the memory chip 701 is carried out.

In the case of the configuration as shown in FIG. 19, the memory chip 701 (chip) selection is not controlled for each chip, and the 8 chips are operated at the same time. In the case where one data signal line 711 performs a 16-bit parallel transmission, by operating the 8 chips at the same time, it becomes possible to perform simultaneous writing or reading of 128 bits (=16*8). Accordingly, high-velocity data writing and reading become possible.

(Structure of Second Laminated Memory)

A structure of a second laminated memory is a laminated memory structure obtained by laminating a plurality of memory chips and a control chip that controls operations of the plurality of memory chips. In the second laminated memory structure, signal lines that transmit data to be written in the memories or data read out from the memories are multiplexed and connected to the respective memory chips included in the laminated memory structure.

A signal line that transmits control signals for transmitting an address, a command, and the like that are requisite for controlling a writing operation and reading operation with respect to the memories is shared by the memory chips included in the laminated memory structure. A signal line that transmits a signal for designating or specifying a memory to carry out the writing operation or the reading operation is multiplexed and connected to the memory chips included in the laminated memory structure.

Figure 22:
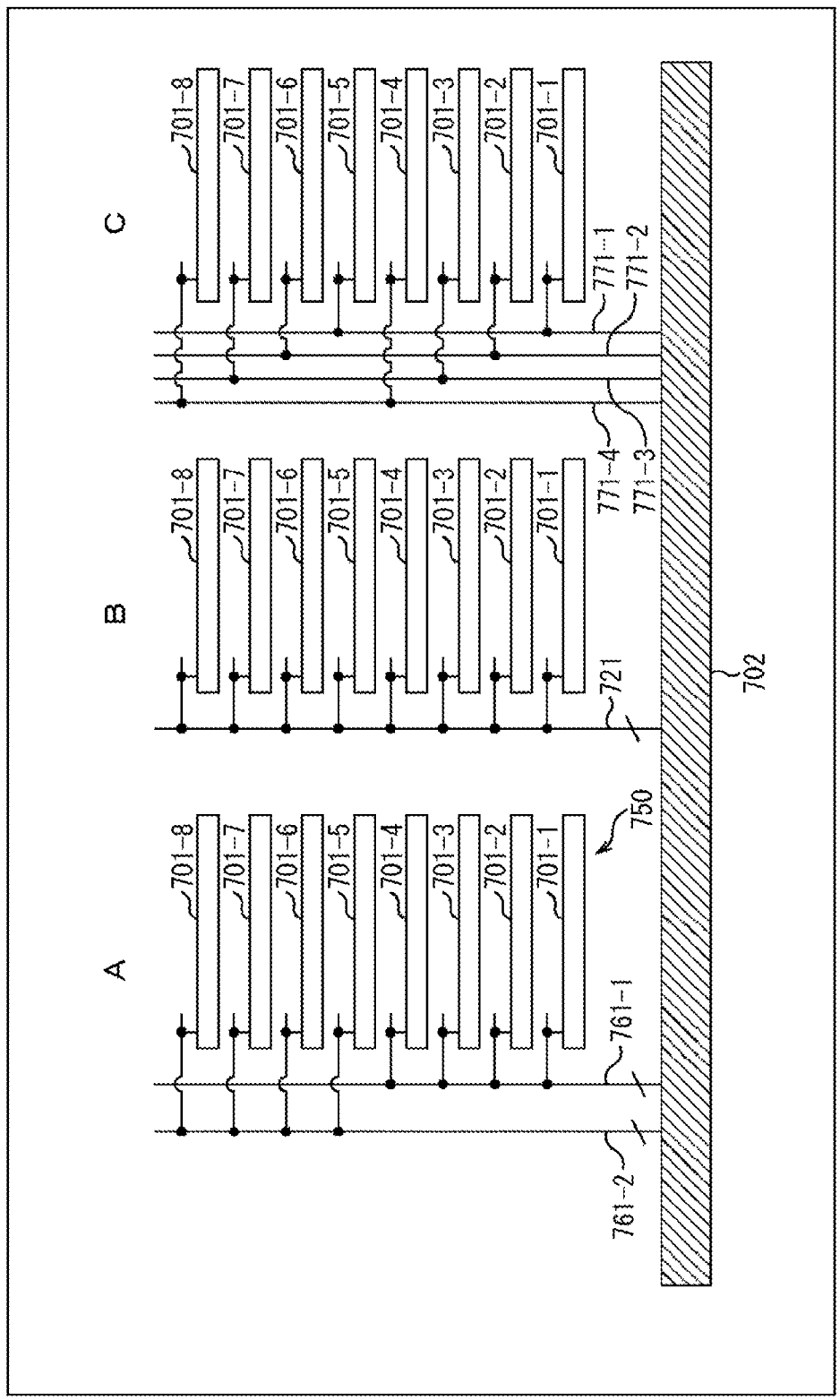
FIG. 22 Diagrams for explaining an application example with respect to the laminated memory.

FIG. 22 are schematic diagrams each showing a connection structure of wirings with respect to the memory chips in a second laminated memory structure 750. FIG. 22 are diagrams showing a configuration of the laminated memory in a case where the data signal lines are multiplexed. FIG. 22A is a diagram showing a wiring structure of the data signal lines. FIG. 22A shows wirings of the data signal lines in a case of multiplexing by 4, that is, one signal line connected to the control chip 702 is split and connected to 4 memory chips.

The memory chips 701-1 to 701-4 are multiplexed, and one data signal line 761-1 is wired with respect to those 4 memory chips 701. Moreover, memory chips 701-5 to 701-8 are multiplexed, and one data signal line 761-2 is wired with respect to those 4 memory chips 701.

In the case where each of the memory chips 701-1 to 701-8 is a 16-bit DDR3, the data signal lines 761-1 and 761-2 are each a signal line for transmitting/receiving 16-bit data, and such signal lines are multiplexed and connected to the 8 memories (8 chips). By the structure in which each of the data signal lines 761-1 and 761-2 is multiplexed to be wired, the second laminated memory structure 750 shown in FIG. 22 is capable of simultaneously writing or reading data of 32 bits, which is a double of 16 bits. With such a configuration, high-velocity communication becomes possible.

16 bits of data D0 to D15 are transmitted to the data signal line 761-1, for example, and 16 bits of data D16 to D31 are transmitted to the data signal line 761-2, for example. Specifically, in this case, data of 32 bits can be simultaneously written or read by the data signal line 761-1 and the data signal line 761-2.

Further, for example, of the 32-bit data, the memory chips 701-1 to 701-4 may store lower-bit data (Data Lower), and the memory chips 701-5 to 701-8 may store high-bit data (Data Upper).

The data signal lines 761 are each configured to include a penetrating electrode that penetrates the plurality of chips and penetrating electrodes for connecting with that penetrating electrode, like the data signal lines 711 shown in FIG. 19A.

For example, one penetrating electrode (referred to as 1-1 penetrating electrode) is provided from the memory chip 701-1 to the memory chip 701-8 as the penetrating electrode of the data signal line 761-1 in the longitudinal direction. In addition, penetrating electrodes (referred to as 2-1 penetrating electrodes) for connecting with the 1-1 penetrating electrode are respectively provided in the memory chips 701-1 to 701-4.

Similarly, one penetrating electrode (referred to as 1-2 penetrating electrode) is provided from the memory chip 701-1 to the memory chip 701-8 as the penetrating electrode of the data signal line 761-2 in the longitudinal direction. In addition, penetrating electrodes (referred to as 2-2 penetrating electrodes) for connecting with the 1-2 penetrating electrode are respectively provided in the memory chips 701-5 to 701-8.

It should be noted that in a case where one data signal line 761 performs a 16-bit parallel transmission, the 16-bit parallel transmission is realized by providing 16 first penetrating electrodes and 16 second penetrating electrodes.

In one chip, that is, the memory chip 701-1 in this case, for example, a total of 3 types of penetrating electrodes, that is, the 1-1 penetrating electrode, the 1-2 penetrating electrode, and the 2-1 penetrating electrodes, are formed for the data signal line 761. Also in each of the memory chips 701-2 to 701-4, a total of 3 types of penetrating electrodes, that is, the 1-1 penetrating electrode, the 1-2 penetrating electrode, and the 2-1 penetrating electrodes, are formed for the data signal line 761 like the memory chip 701-1.

In the case of performing a 16-bit parallel transmission, 16 penetrating electrodes are provided as the 1-1 penetrating electrode, 16 penetrating electrodes are provided as the 1-2 penetrating electrode, and 16 penetrating electrodes are provided as the 2-1 penetrating electrode in the memory chip 701-1. Accordingly, 48 (=16+16+16) penetrating electrodes are provided for each of the data signal lines 761 in the memory chip 701-1.

Similarly, also in the memory chips 701-2 to 701-4, 48 (=16+16+16) penetrating electrodes are provided for each of the data signal lines 761. The 48 penetrating electrodes are provided at the same positions in each of the memory chips 701-1 to 701-4. Accordingly, at the time of production, the 4 memory chips 701-1 to 701-4 can be produced using the same mask, for example.

Similarly, in the memory chips 701-5 to 701-8, a total of 3 types of penetrating electrodes, that is, the 1-1 penetrating electrode, the 1-2 penetrating electrode, and the 2-2 penetrating electrode, are formed for the data signal line 761.

In each of the memory chips 701-5 to 701-8, 16 penetrating electrodes are provided as the 1-1 penetrating electrode, 16 penetrating electrodes are provided as the 1-2 penetrating electrode, and 16 penetrating electrodes are provided as the 2-2 penetrating electrode. Accordingly, 48 (=16+16+16) penetrating electrodes are provided for each of the data signal lines 761 in each of the memory chips 701-5 to 701-8.

Regarding the memory chips 701-5 to 701-8, it is also possible to adopt a configuration in which the 1-1 penetrating electrodes configuring a part of the data signal line 761-1 are not formed. In the case where the 1-1 penetrating electrodes are not formed in the memory chips 701-5 to 701-8, a total of two types of penetrating electrodes, that is, the 1-2 penetrating electrodes and the 2-2 penetrating electrodes, are formed for the data signal lines 761 in the memory chips 701-5 to 701-8.

In this case, 16 penetrating electrodes are provided as the 1-2 penetrating electrodes and 16 penetrating electrodes are provided as the 2-2 penetrating electrodes in each of the memory chips 701-5 to 701-8, so 32 penetrating electrodes are provided for each of the data signal lines 761 in each of the memory chips 701-5 to 701-8.

Referring to FIG. 22B, an address (Address) signal line, a command (Command) signal line, a Vdd signal line, and a Vss signal line are provided as one signal line, and this signal line is provided as the control signal line 721 that is used in common by the 8 memory chips 701-1 to 701-8. Since this configuration is similar to that of the case shown in FIG. 19B, descriptions thereof will be omitted.

In this way, the control signal line 721 is provided as a signal line that is multiplexed by 8 to be shared by the 8 memory chips 701 (8 chips).

In the case where the data signal line 761-1 is multiplexed by 4 as shown in FIG. 22A and the control signal line 721 is multiplexed by 8 as shown in FIG. 22B, chip designation signal lines that transmit selection signals for selecting the memory chips 701-1 to 701-8 to write data or read data are provided as shown in FIG. 22C.

As shown in FIG. 22C, the chip designation signal lines that transmit selection signals for selecting the memory chips 701-1 to 701-8 are each multiplexed by 2 and provided with respect to the memory chips 701-1 to 701-8. In other words, wirings of the chip designation signal lines in which each of the chip designation signal lines connected to the control chip 702 is split to be connected to the two memory chips are shown.

A chip designation signal line 771-1 is connected to the memory chips 701-1 and 701-5, a chip designation signal line 771-2 is connected to the memory chips 701-2 and 701-6, a chip designation signal line 771-3 is connected to the memory chips 701-3 and 701-7, and a chip designation signal line 771-4 is connected to the memory chips 701-4 and 701-8.

The chip designation signal lines 771 are each provided as a signal line shared by the two memory chips 701, are each multiplexed by 2, and enable parallel signals of 4 bits (e.g., 4-bit signals of A0-A3) to be transmitted by the 4 chip designation signal lines 771. For example, data transmitted to the chip designation signal line 771 corresponding to the chip where data writing (reading) is to be performed is set as "1", and data transmitted to the other chip designation signal lines is set as "0".

For example, in a case where data A0 transmitted to the chip designation signal line 771-1 is set as "1" and data A1 to A3 transmitted to the chip designation signal lines 771-2 to 771-4 are set as "0", lower-bit data D0 to D15 are written (read) to (from) the memory chip 701-1, and higher-bit data D16 to D31 are written (read) to (from) the memory chip 701-5.

Also the chip designation signal lines 771 are each configured to include a penetrating electrode that penetrates the plurality of chips and penetrating electrodes for connecting with that penetrating electrode, like the data signal lines 711 shown in FIG. 19A.

For example, one penetrating electrode (referred to as 1-1 penetrating electrode) is provided from the memory chip 701-1 to the memory chip 701-8 as the penetrating electrode of the chip designation signal line 771-1 in the longitudinal direction. In addition, penetrating electrodes (referred to as 2-1 penetrating electrodes) for connecting with the 1-1 penetrating electrode are respectively provided in the memory chips 701-1 and 701-5.

Similarly, one penetrating electrode (referred to as 1-2 penetrating electrode) is provided from the memory chip 701-1 to the memory chip 701-8 as the penetrating electrode of the chip designation signal line 771-2 in the longitudinal direction. In addition, penetrating electrodes (referred to as 2-2 penetrating electrodes) for connecting with the 1-2 penetrating electrode are respectively provided in the memory chips 701-2 and 701-6.

Similarly, one penetrating electrode (referred to as 1-3 penetrating electrode) is provided from the memory chip 701-1 to the memory chip 701-8 as the penetrating electrode of the chip designation signal line 771-3 in the longitudinal direction. In addition, penetrating electrodes (referred to as 2-3 penetrating electrodes) for connecting with the 1-3 penetrating electrode are respectively provided in the memory chips 701-3 and 701-7.

Similarly, one penetrating electrode (referred to as 1-4 penetrating electrode) is provided from the memory chip 701-1 to the memory chip 701-8 as the penetrating electrode of the chip designation signal line 771-4 in the longitudinal direction. In addition, penetrating electrodes (referred to as 2-4 penetrating electrodes) for connecting with the 1-4 penetrating electrode are respectively provided in the memory chips 701-4 and 701-8.

In each of the memory chips 701-1 and 701-5, a total of 5 penetrating electrodes, that is, the 1-1 penetrating electrode, the 1-2 penetrating electrode, the 1-3 penetrating electrode, the 1-4 penetrating electrode, and the 2-1 penetrating electrode are formed for the chip designation signal line 771. Similarly, in each of the memory chips 701-2 and 701-6, a total of 5 penetrating electrodes, that is, the 1-1 penetrating electrode, the 1-2 penetrating electrode, the 1-3 penetrating electrode, the 1-4 penetrating electrode, and the 2-2 penetrating electrode are formed for the chip designation signal line 771.

Similarly, in each of the memory chips 701-3 and 701-7, a total of 5 penetrating electrodes, that is, the 1-1 penetrating electrode, the 1-2 penetrating electrode, the 1-3 penetrating electrode, the 1-4 penetrating electrode, and the 2-3 penetrating electrode are formed for the chip designation signal line 771. Similarly, in each of the memory chips 701-4 and 701-8, a total of 5 penetrating electrodes, that is, the 1-1 penetrating electrode, the 1-2 penetrating electrode, the 1-3 penetrating electrode, the 1-4 penetrating electrode, and the 2-4 penetrating electrode are formed for the chip designation signal line 771.

Since the 1-1 penetrating electrode, the 1-2 penetrating electrode, the 1-3 penetrating electrode, and the 1-4 penetrating electrode are formed in each of the memory chips 701-1 to 701-8, the same mask and the like can be used for forming these first penetrating electrodes.

Regarding the memory chip 701-6, it is also possible to adopt a configuration in which the 1-1 penetrating electrode configuring a part of the chip designation signal line 771-1 is not formed. In the case where the 1-1 penetrating electrode is not formed in the memory chip 701-6, it is also possible to form a total of 4 types of penetrating electrodes, that is, the 1-2 penetrating electrode to the 1-4 penetrating electrode and the 2-2 penetrating electrode, in the memory chip 701-6.

Further, regarding the memory chip 701-7, it is also possible to adopt a configuration in which the 1-1 penetrating electrode and the 1-2 penetrating electrode configuring a part of the chip designation signal line 771-1 and the chip designation signal line 771-2 are not formed. In the case where the 1-1 penetrating electrode and the 1-2 penetrating electrode are not formed in the memory chip 701-7, it is also possible to form a total of 3 types of penetrating electrodes, that is, the 1-3 penetrating electrode, the 1-4 penetrating electrode, and the 2-3 penetrating electrode, in the memory chip 701-7.

Further, regarding the memory chip 701-8, it is also possible to adopt a configuration in which the 1-1 penetrating electrode to the 1-3 penetrating electrode respectively configuring a part of the chip designation signal line 771-1 to the chip designation signal line 771-3 are not formed. In the case where the 1-1 penetrating electrode to the 1-3 penetrating electrode are not formed in the memory chip 701-8, it is also possible to form a total of two types of penetrating electrodes, that is, the 1-4 penetrating electrode and the 2-4 penetrating electrode in the memory chip 701-8.

It should be noted that although the first penetrating electrode and the second penetrating electrode configuring a part of the chip designation signal line 771-2 of the memory chip 701-2 shown in FIG. 22C are illustrated as if they cross over the chip designation signal line 771-1, the penetrating electrodes are arranged and connected while avoiding the chip designation signal line 771-1 in the actual wiring. Similarly, in the case where the 1-1 penetrating electrode is provided in the memory chip 701-6, the penetrating electrode is arranged and connected while avoiding the chip designation signal line 771-1.

Similarly, although the first penetrating electrode and the second penetrating electrode configuring a part of the chip designation signal line 771-3 of the memory chip 701-3 are illustrated as if they cross over the chip designation signal line 771-1 and the chip designation signal line 771-2, the penetrating electrodes are arranged and connected while avoiding the chip designation signal line 771-1 and the chip designation signal line 771-2 in the actual wiring. Similarly, in the case where the 1-1 penetrating electrode is provided in the memory chip 701-7, the penetrating electrode is arranged and connected while avoiding the chip designation signal line 771-1.

Similarly, although the first penetrating electrode and the second penetrating electrode configuring a part of the chip designation signal line 771-4 of the memory chip 701-4 are illustrated as if they cross over the chip designation signal lines 771-1 to 771-3, the penetrating electrodes are arranged and connected while avoiding the chip designation signal lines 771-1 to 771-3 in the actual wiring. Similarly, in the case where the 1-1 penetrating electrode is provided in the memory chip 701-8, the penetrating electrode is arranged and connected while avoiding the chip designation signal line 771-1.

As described above, although the data signal line 761 has a strict AC standard, according to the present technology, even when the memory chips 701 are laminated, the memory chips 701 can be connected by the penetrating electrodes without having to provide a wire bonding pad in each of the memory chips 701, with the result that input/output capacities become small so that the AC standard is satisfied even when the data signal lines 761 are multiplexed.

In the example shown in FIG. 22, the data signal lines 761 are each multiplexed by 4, the control signal line 721 that transmits addresses and commands is multiplexed by 8, and the chip designation signal lines 771 for selecting chips (memory chips 701) are each multiplexed by 2. In this way, the data signal lines 761, the control signal line 721, and the chip designation signal lines 771 have different multiplex degrees, and the multiplex degrees satisfy a relationship of multiplex degree of control signal line>multiplex degree of data signal line>multiplex degree of chip designation signal line.

By multiplexing the data signal line 761, the number of data signal lines 761 can be reduced, and the number of penetrating electrodes for providing the data signal lines 761 can also be reduced. Accordingly, an area required for the wirings can be reduced, and the laminated memory structure 750 can be miniaturized.

Also by multiplexing the data signal lines 761, it becomes possible for the multiplexed memory chips 701 to carry out redundancy processing. For the redundancy processing, the redundancy processing described with reference to FIGS. 6 and 7 can be applied. In other words, a redundant area can be shared by the memory chips 701-1 to 701-4, for example. Moreover, for example, when a defective row occurs in the memory chip 701-1, the shared redundant area, that is, the redundant area of the memory chip 701-2, for example, can be used in place of the defective row of the memory chip 701-1.

Accordingly, as in the case described with reference to FIG. 7, it becomes possible to minimize a yield loss due to lamination of chips and realize lowering of chip costs.

(Structure of Third Laminated Memory)

A structure of a third laminated memory is a laminated memory structure obtained by laminating a plurality of memory chips and a control chip that controls operations of the plurality of memory chips. In the third laminated memory structure, signal lines that transmit data to be written in the memories or data read out from the memories are multiplexed and connected to the respective memory chips included in the laminated memory structure.

A signal line that transmits control signals for transmitting an address, a command, and the like that are requisite for controlling a writing operation and reading operation with respect to the memories is shared by the memory chips included in the laminated memory structure. A signal line that transmits a signal for designating or specifying a memory to carry out the writing operation or the reading operation is multiplexed and connected to the memory chips included in the laminated memory structure.

Figure 23:
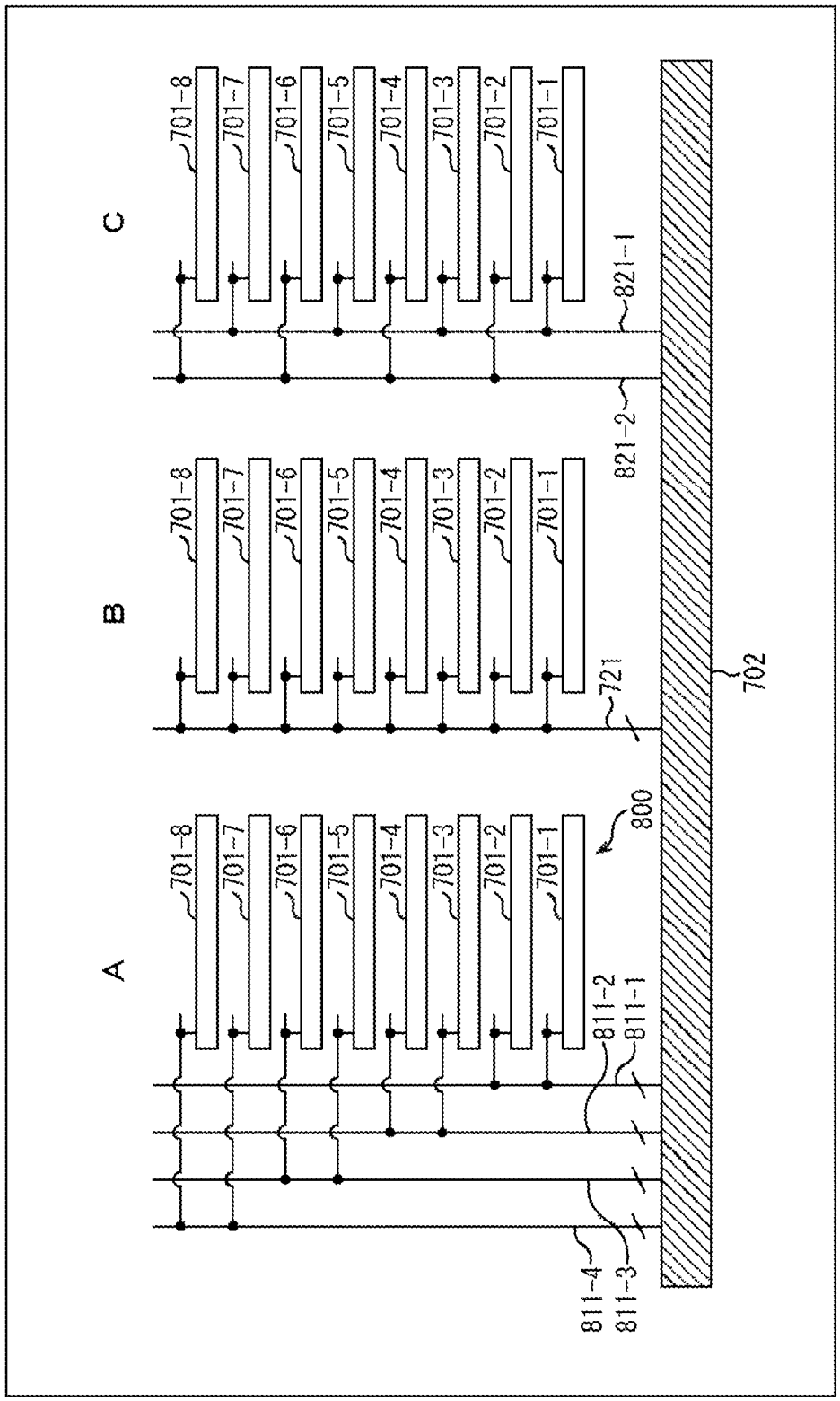
FIG. 23 A diagram for explaining an application example with respect to the laminated memory.

With reference to FIG. 23, the laminated memory in a case where the data signal line is multiplexed by 2 will additionally be described.

FIG. 23 are diagrams showing a configuration of a laminated memory structure 800 in the case where the data signal lines are multiplexed by 2. FIG. 23A is a diagram showing a wiring structure of the data signal lines. FIG. 23A shows wirings of the data signal lines in the case of multiplexing by 2, that is, one signal line connected to the control chip 702 is split and connected to 2 memory chips.

The memory chip 701-1 and the memory chip 701-2 are multiplexed, and one data signal line 811-1 is wired with respect to those 2 memory chips 701. Moreover, the memory chip 701-3 and the memory chip 701-4 are multiplexed, and one data signal line 811-2 is wired with respect to those 2 memory chips 701.

Further, the memory chip 701-5 and the memory chip 701-6 are multiplexed, and one data signal line 811-3 is wired with respect to those 2 memory chips 701. Moreover, the memory chip 701-7 and the memory chip 701-8 are multiplexed, and one data signal line 811-4 is wired with respect to those 2 memory chips 701.

In the case where each of the memory chips 701-1 to 701-8 is a 16-bit DDR3, the data signal lines 811-1 to 811-4 are each a signal line for transmitting/receiving 16-bit data, and such signal lines are multiplexed and connected to the 8 memories (8 chips). By the structure in which each of the data signal lines 811-1 to 811-4 is multiplexed to be wired, the laminated memory structure 800 shown in FIG. 23 is capable of simultaneously writing or reading data of 64 bits, which is a quadruple of 16 bits. With such a configuration, high-velocity communication becomes possible.

For example, 16 bits of data D0 to D15 are transmitted to the data signal line 811-1, 16 bits of data D16 to D31 are transmitted to the data signal line 811-2, 16 bits of data D32 to D47 are transmitted to the data signal line 811-3, and 16 bits of data D48 to D63 are transmitted to the data signal line 811-4. Specifically, in this case, the data signal lines 811-1 to 811-4 function as data signal lines 811 that transmit 64-bit data of the data D0 to D63.

Further, for example, of the 64-bit data, the memory chip 701-1 and the memory chip 701-2 may store lower-bit data (Data Lower), the memory chip 701-3 and the memory chip 701-4 may store mid-lower-bit data (Data Middle Lower), the memory chip 701-5 and the memory chip 701-6 may store mid-higher-bit data (Data Middle Upper), and the memory chip 701-7 and the memory chip 701-8 may store higher-bit data (Data Upper).

The data signal lines 8111 are also each configured to include a penetrating electrode that penetrates the plurality of chips and penetrating electrodes for connecting with that penetrating electrode, like the data signal lines 711 shown in FIG. 19A.

For example, one penetrating electrode (referred to as 1-1 penetrating electrode) is provided from the memory chip 701-1 to the memory chip 701-8 as the penetrating electrode of the data signal line 811-1 in the longitudinal direction. In addition, penetrating electrodes (referred to as 2-1 penetrating electrodes) for connecting with the 1-1 penetrating electrode are respectively provided in the memory chip 701-1 and the memory chip 701-2.

Similarly, one penetrating electrode (referred to as 1-2 penetrating electrode) is provided from the memory chip 701-1 to the memory chip 701-8 as the penetrating electrode of the data signal line 811-2 in the longitudinal direction. In addition, penetrating electrodes (referred to as 2-2 penetrating electrodes) for connecting with the 1-2 penetrating electrode are respectively provided in the memory chip 701-3 and the memory chip 701-4.

Similarly, one penetrating electrode (referred to as 1-3 penetrating electrode) is provided from the memory chip 701-1 to the memory chip 701-8 as the penetrating electrode of the data signal line 811-3 in the longitudinal direction. In addition, penetrating electrodes (referred to as 2-3 penetrating electrodes) for connecting with the 1-3 penetrating electrode are respectively provided in the memory chip 701-5 and the memory chip 701-6.

Similarly, one penetrating electrode (referred to as 1-4 penetrating electrode) is provided from the memory chip 701-1 to the memory chip 701-8 as the penetrating electrode of the data signal line 811-4 in the longitudinal direction. In addition, penetrating electrodes (referred to as 2-4 penetrating electrodes) for connecting with the 1-4 penetrating electrode are respectively provided in the memory chip 701-7 and the memory chip 701-8.

It should be noted that in a case where one data signal line 761 performs a 16-bit parallel transmission, the 16-bit parallel transmission is realized by providing 16 first penetrating electrodes and 16 second penetrating electrodes.

In the memory chip 701-1 and the memory chip 701-2, a total of 5 types of penetrating electrodes, that is, the 1-1 penetrating electrode, the 1-2 penetrating electrode, the 1-3 penetrating electrode, the 1-4 penetrating electrode, and the 2-1 penetrating electrode, are formed for the data signal line 811.

In this case, 16 penetrating electrodes are provided as the 1-1 penetrating electrode, 16 penetrating electrodes are provided as the 1-2 penetrating electrode, 16 penetrating electrodes are provided as the 1-3 penetrating electrode, 16 penetrating electrodes are provided as the 1-4 penetrating electrode, and 16 penetrating electrodes are provided as the 2-1 penetrating electrode in each of the memory chip 701-1 and the memory chip 701-2. Accordingly, 80 (=16+16+16+16+16) penetrating electrodes are provided for the data signal line 811 in each of the memory chip 701-1 and the memory chip 701-2.

Similarly, in the memory chip 701-3 and the memory chip 701-4, a total of 5 types of penetrating electrodes, that is, the 1-1 penetrating electrode, the 1-2 penetrating electrode, the 1-3 penetrating electrode, the 1-4 penetrating electrode, and the 2-2 penetrating electrode, are formed for the data signal line 811. In each of the memory chip 701-3 and the memory chip 701-4, 80 penetrating electrodes are provided for the data signal line 811.

Similarly, in the memory chip 701-5 and the memory chip 701-6, a total of 5 types of penetrating electrodes, that is, the 1-1 penetrating electrode, the 1-2 penetrating electrode, the 1-3 penetrating electrode, the 1-4 penetrating electrode, and the 2-3 penetrating electrode, are formed for the data signal line 811. In each of the memory chip 701-5 and the memory chip 701-6, 80 penetrating electrodes are provided for the data signal line 811.

Similarly, in the memory chip 701-7 and the memory chip 701-8, a total of 5 types of penetrating electrodes, that is, the 1-1 penetrating electrode, the 1-2 penetrating electrode, the 1-3 penetrating electrode, the 1-4 penetrating electrode, and the 2-4 penetrating electrode, are formed for the data signal line 811. In each of the memory chip 701-7 and the memory chip 701-8, 80 penetrating electrodes are provided for the data signal line 811.

Since the 1-1 penetrating electrode, the 1-2 penetrating electrode, the 1-3 penetrating electrode, and the 1-4 penetrating electrode are formed in each of the memory chips

701-1 to 701-8, the same mask and the like can be used for forming these first penetrating electrodes.

Regarding the memory chip 701-3 and the memory chip 701-4, it is also possible to adopt a configuration in which the 1-1 penetrating electrodes configuring a part of the data signal line 811-1 are not formed. In the case where the 1-1 penetrating electrodes are not formed in the memory chip 701-3 and the memory chip 701-4, a total of 4 types of penetrating electrodes, that is, the 1-2 penetrating electrode to the 1-4 penetrating electrode and the 2-2 penetrating electrode, are formed in each of the memory chip 701-3 and the memory chip 701-4 for the data signal line 811.

In this case, since 16 1-2 penetrating electrodes, 16 1-3 penetrating electrodes, 16 1-4 penetrating electrodes, and 16 2-2 penetrating electrodes are provided in each of the memory chip 701-3 and the memory chip 701-4, 64 penetrating electrodes are provided for the data signal line 811 in each of the memory chip 701-3 and the memory chip 701-4. In this case, at the time of production, the memory chip 701-3 and the memory chip 701-4 can be formed using the same mask.

Regarding the memory chip 701-5 and the memory chip 701-6, it is also possible to adopt a configuration in which the 1-1 penetrating electrodes and 1-2 penetrating electrodes configuring a part of the data signal line 811-1 and the data signal line 811-2 are not formed. In the case where the 1-1 penetrating electrodes and 1-2 penetrating electrodes are not formed in the memory chip 701-5 and the memory chip 701-6, a total of 3 types of penetrating electrodes, that is, the 1-3 penetrating electrode, the 1-4 penetrating electrode, and the 2-3 penetrating electrode, are formed in each of the memory chip 701-5 and the memory chip 701-6 for the data signal line 811.

In this case, since 16 1-3 penetrating electrodes, 16 1-4 penetrating electrodes, and 16 2-3 penetrating electrodes are provided in each of the memory chip 701-5 and the memory chip 701-6, 48 penetrating electrodes are provided for the data signal line 811 in each of the memory chip 701-5 and the memory chip 701-6. In this case, at the time of production, the memory chip 701-5 and the memory chip 701-6 can be formed using the same mask.

Regarding the memory chip 701-7 and the memory chip 701-8, it is also possible to adopt a configuration in which the 1-1 to 1-3 penetrating electrodes configuring a part of the data signal lines 811-1 to 811-3 are not formed. In the case where the 1-1 to 1-3 penetrating electrodes are not formed in the memory chip 701-7 and the memory chip 701-8, a total of two types of penetrating electrodes, that is, the 1-4 penetrating electrode and the 2-4 penetrating electrode, are formed in each of the memory chip 701-7 and the memory chip 701-8 for the data signal line 811.

In this case, since 16 1-4 penetrating electrodes and 16 2-4 penetrating electrodes are provided in each of the memory chip 701-7 and the memory chip 701-8, 32 penetrating electrodes are provided for the data signal line 811 in each of the memory chip 701-7 and the memory chip 701-8. In this case, at the time of production, the memory chip 701-7 and the memory chip 701-8 can be formed using the same mask.

Referring to FIG. 23B, an address (Address) signal line, a command (Command) signal line, a Vdd signal line, and a Vss signal line are provided as one signal line, and this signal line is provided as the control signal line 721 that is used in common by the 8 memory chips 701-1 to 701-8. Since this configuration is similar to that of the case shown in FIG. 19B, descriptions thereof will be omitted.

In this way, the control signal line 721 is provided as a signal line that is multiplexed by 8 to be shared by the 8 memory chips 701 (8 chips).

In the case where the data signal lines 711 are each multiplexed by 2 as shown in FIG. 23A and the control signal line 721 is multiplexed by 8 as shown in FIG. 23B, chip designation signal lines that transmit selection signals for selecting the memory chips 701-1 to 701-8 to write data or read data are provided as shown in FIG. 23C.

As shown in FIG. 23C, the chip designation signal lines that transmit selection signals for selecting the memory chips 701-1 to 701-8 are each multiplexed by 4 and provided with respect to the memory chips 701-1 to 701-8. In other words, wirings of the chip designation signal lines in which each of the chip designation signal lines connected to the control chip 702 is split to be connected to the 4 memory chips are shown.

A chip designation signal line 821-1 is connected to the memory chip 701-1, the memory chip 701-3, the memory chip 701-5, and the memory chip 701-7, and a chip designation signal line 821-2 is connected to the memory chip 701-2, the memory chip 701-4, the memory chip 701-6, and the memory chip 701-8.

The chip designation signal lines 821 are each provided as a signal line shared by the 4 memory chips 701, are each multiplexed by 4, and enable parallel signals of 2 bits (e.g., 2-bit signals of data A0 and A1) to be transmitted by the two chip designation signal lines 821. For example, data transmitted to the chip designation signal line 821 corresponding to the memory chip 701 where data writing (reading) is to be performed is set as "1", and data transmitted to the other chip designation signal line is set as "0".

For example, in a case where data A0 transmitted to the chip designation signal line 821-1 is set as "1" and data A1 transmitted to the chip designation signal line 821-2 is set as "0", lower-bit data D0 to D15 are written (read) to (from) the memory chip 701-1, mid-lower-bit data D16 to D31 are written (read) to (from) the memory chip 701-3, mid-higher-bit data D32 to D47 are written (read) to (from) the memory chip 701-5, and higher-bit data D48 to D63 are written (read) to (from) the memory chip 701-7.

Also the chip designation signal lines 821 are each configured to include a penetrating electrode that penetrates the plurality of chips and penetrating electrodes for connecting with that penetrating electrode, like the data signal lines 711 shown in FIG. 19A.

For example, one penetrating electrode (referred to as 1-1 penetrating electrode) is provided from the memory chip 701-1 to the memory chip 701-8 as the penetrating electrode of the chip designation signal line 821-1 in the longitudinal direction. In addition, penetrating electrodes (referred to as 2-1 penetrating electrodes) for connecting with the 1-1 penetrating electrode are respectively provided in the memory chip 701-1, the memory chip 701-3, the memory chip 701-5, and the memory chip 701-7.

Similarly, one penetrating electrode (referred to as 1-2 penetrating electrode) is provided from the memory chip 701-1 to the memory chip 701-8 as the penetrating electrode of the chip designation signal line 821-2 in the longitudinal direction. In addition, penetrating electrodes (referred to as 2-2 penetrating electrodes) for connecting with the 1-2 penetrating electrode are respectively provided in the memory chip 701-2, the memory chip 701-4, the memory chip 701-6, and the memory chip 701-8.

In each of the memory chip 701-1, the memory chip 701-3, the memory chip 701-5, and the memory chip 701-7, a total of 3 types of penetrating electrodes, that is, the 1-1 penetrating electrode, the 1-2 penetrating electrode, and the 2-1 penetrating electrode, are formed for the chip designation signal line 821.

Also in each of the memory chip 701-2, the memory chip 701-4, the memory chip 701-6, and the memory chip 701-8, a total of 3 types of penetrating electrodes, that is, the 1-1 penetrating electrode, the 1-2 penetrating electrode, and the 2-2 penetrating electrode, are formed for the chip designation signal line 821.

Since the 1-1 penetrating electrode and the 1-2 penetrating electrode are formed in each of the memory chips 701-1 to 701-8, the same mask and the like can be used for forming these first penetrating electrodes related to the chip designation signal lines 821.

Regarding the memory chip 701-8, it is also possible to adopt a configuration in which the 1-1 penetrating electrode configuring a part of the chip designation signal line 821-1 is not formed. In the case where the 1-1 penetrating electrode is not formed in the memory chip 701-8, a total of two types of penetrating electrodes, that is, the 1-2 penetrating electrode and the 2-2 penetrating electrode, may be formed in the memory chip 701-6.

It should be noted that although the first penetrating electrodes and the second penetrating electrodes configuring a part of the chip designation signal line 821-2 of the memory chip 701-2, the memory chip 701-4, and the memory chip 701-6 shown in FIG. 23C are illustrated as if they cross over the chip designation signal line 821-1 to be connected, the penetrating electrodes are arranged and connected while avoiding the chip designation signal line 821-1 in the actual wiring.

As described above, although the data signal line 811 has a strict AC standard, according to the present technology, even when the memory chips 701 are laminated, the memory chips 701 can be connected by the penetrating electrodes without having to provide a wire bonding pad in each of the memory chips 701, with the result that input/output capacities become small so that the AC standard is satisfied even when the data signal lines 811 are multiplexed.

In the example shown in FIG. 23, the data signal lines 811 are each multiplexed by 2, the control signal line 721 that transmits addresses and commands is multiplexed by 8, and the chip designation signal lines 821 for selecting chips (memory chips 701) are each multiplexed by 4. In this way, the data signal lines 811, the control signal line 721, and the chip designation signal lines 821 have different multiplex degrees, and the multiplex degrees satisfy a relationship of multiplex degree of control signal line>multiplex degree of chip designation signal line>multiplex degree of data signal line.

By multiplexing the data signal line 811, the number of data signal lines 811 can be reduced, and the number of penetrating electrodes for providing the data signal lines 811 can also be reduced. Accordingly, an area required for the wirings can be reduced, and the laminated memory structure 800 can be miniaturized.

Also by multiplexing the data signal lines 811, it becomes possible for the multiplexed memory chips 701 to carry out redundancy processing. For the redundancy processing, the redundancy processing described with reference to FIGS. 6 and 7 can be applied. In other words, a redundant area can be shared by the memory chips 701-1 and 701-2, for example. Moreover, for example, when a defective row occurs in the memory chip 701-1, the shared redundant area, that is, the redundant area of the memory chip 701-2, for example, can be used in place of the defective row of the memory chip 701-1.

Accordingly, as in the case described with reference to FIG. 7, it becomes possible to minimize a yield loss due to lamination of chips and realize lowering of chip costs.

(Structure of Fourth Laminated Memory)

A structure of a fourth laminated memory is the same as that of the second laminated memory but differs in that the chip designation signal line transmits decoded data.

Figure 24:
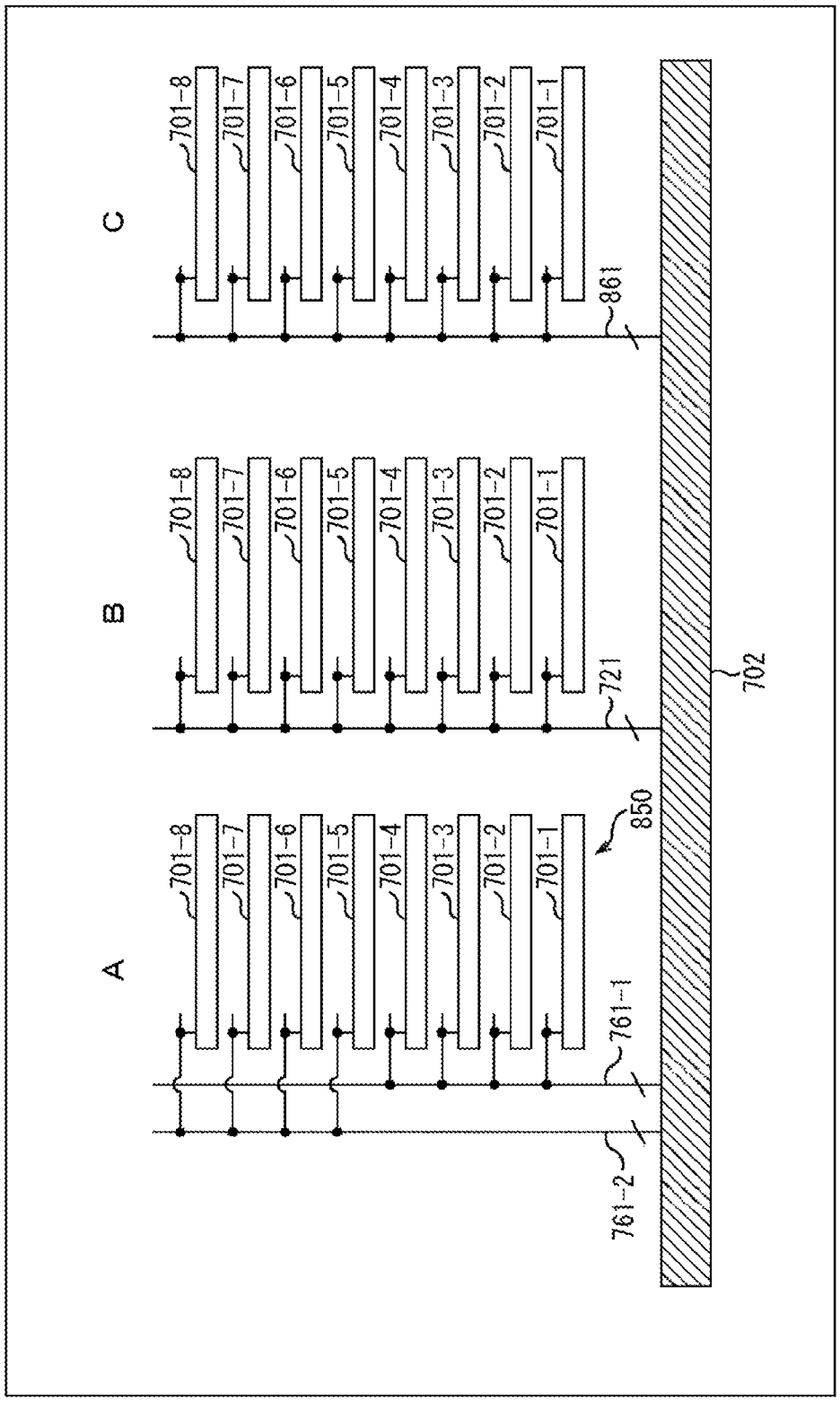
FIG. 24 Diagrams for explaining an application example with respect to the laminated memory.

With reference to FIG. 24, the laminated memory in a case where the data signal line is multiplexed by 4 will additionally be described.

FIG. 24 are similar to the laminated memory structure 750 shown in FIG. 22 in that the diagrams show a configuration of a laminated memory structure 850 in the case where the data signal line is multiplexed by 4, but differ in that the chip designation signal line transmits decoded data.

FIG. 24A is a diagram showing a wiring structure of the data signal lines, but since the wiring structure is the same as the wiring structure of the data signal lines 761 shown in FIG. 22A, descriptions thereof will be omitted. Moreover, since the wiring structure of the control signal line shown in FIG. 24B is the same as the wiring structure of the control signal line 721 shown in FIG. 22B, descriptions thereof will be omitted.

In a case where the data signal lines 711 are multiplexed by 4 as shown in FIG. 24A and the control signal line 721 is multiplexed by 8 as shown in FIG. 24B, a chip designation signal line that transmits a selection signal for selecting the memory chips 701-1 to 701-8 to perform data writing or data reading is provided as shown in FIG. 24C.

As shown in FIG. 24C, the chip designation signal line that transmits a selection signal for selecting the memory chips 701-1 to 701-8 is multiplexed by 8 and provided in common to the memory chips 701-1 to 701-8. In other words, the chip designation signal line 861 is connected to each of the memory chips 701-1 to 701-8.

The chip designation signal line 861 is a signal line that transmits 2-bit decode signals obtained by decoding the data A0 to A3, for example. As described above with reference to FIGS. 4 and 5, data (stack address) for causing each chip (memory chip 701) to recognize which layer it is laminated in is written, and the stack address is transmitted to the chip designation signal line 861.

However, in a case where the data signal lines 761 shown in FIG. 24 are each multiplexed by 4, two of the 8 memory chips 701 are selected, and higher bits and lower bits are respectively written in those two memory chips 701 as described above with reference to FIG. 22, so the same stack address is written (stored) in the two memory chips 701 as a pair of memory chips 701 to which higher and lower bits are to be written.

Accordingly, 2-bit data can be used as the stack address since it is only necessary to distinguish the 4 pairs of memory chips 701. For example, "00" is allocated as the stack address to the memory chip 701-1 and the memory chip 701-5, "01" is allocated as the stack address to the memory chip 701-2 and the memory chip 701-6, "01" is allocated as the stack address to the memory chip 701-3 and the memory chip 701-7, and "11" is allocated as the stack address to the memory chip 701-4 and the memory chip 701-8.

The stack addresses are allocated in this way and written in the memory chips 701 by a fuse as described above with reference to FIG. 5, for example. Further, in a case where "00" is transmitted to the chip designation signal line 861 as the stack address, for example, the memory chip 701-1 and the memory chip 701-5 determine that they have been selected and write signals respectively transmitted by the data signal lines 761-1 and 761-2.

Since the decoded data (stack address) is transmitted to the chip designation signal line 861 in this way, one signal line is enough. Accordingly, an area required for the wirings can be reduced, and the laminated memory structure 850 can be miniaturized.

It should be noted that since the chip designation signal line 861 transmits 2-bit data in this case, the chip designation signal line 861 is two signal lines and configured by two penetrating electrodes. Although 4 chip designation signal lines 771 are provided and 4 penetrating electrodes are thus provided in the example shown in FIG. 22, since the chip designation signal line 861 is configured by two penetrating electrodes in the example shown in FIG. 24, an area required for the wirings can be reduced, and the laminated memory structure 850 can be miniaturized as described above.

In the example shown in FIG. 24, the data signal lines 761 are each multiplexed by 4, the control signal line 721 that transmits addresses and commands is multiplexed by 8, and the chip designation signal line 861 for selecting chips (memory chips 701) is multiplexed by 8. In this way, the data signal lines 811, the control signal line 721, and the chip designation signal line 821 have different multiplex degrees, and the multiplex degrees satisfy a relationship of multiplex degree of control signal line=multiplex degree of chip designation signal line>multiplex degree of data signal line.

By multiplexing the data signal lines 761, it becomes possible for the multiplexed memory chips 701 to carry out redundancy processing. For the redundancy processing, the redundancy processing described with reference to FIGS. 6 and 7 can be applied. In other words, a redundant area can be shared by the memory chips 701-1 to 701-4, for example. Moreover, for example, when a defective row occurs in the memory chip 701-1, the shared redundant area, that is, the redundant area of the memory chip 701-2, for example, can be used in place of the defective row of the memory chip 701-1.

Accordingly, as in the case described with reference to FIG. 7, it becomes possible to minimize a yield loss due to lamination of chips and realize lowering of chip costs.

(Structure of Fifth Laminated Memory)

A structure of a fifth laminated memory is the same as that of the third laminated memory but differs in that the chip designation signal line transmits decoded data.

Figure 25:
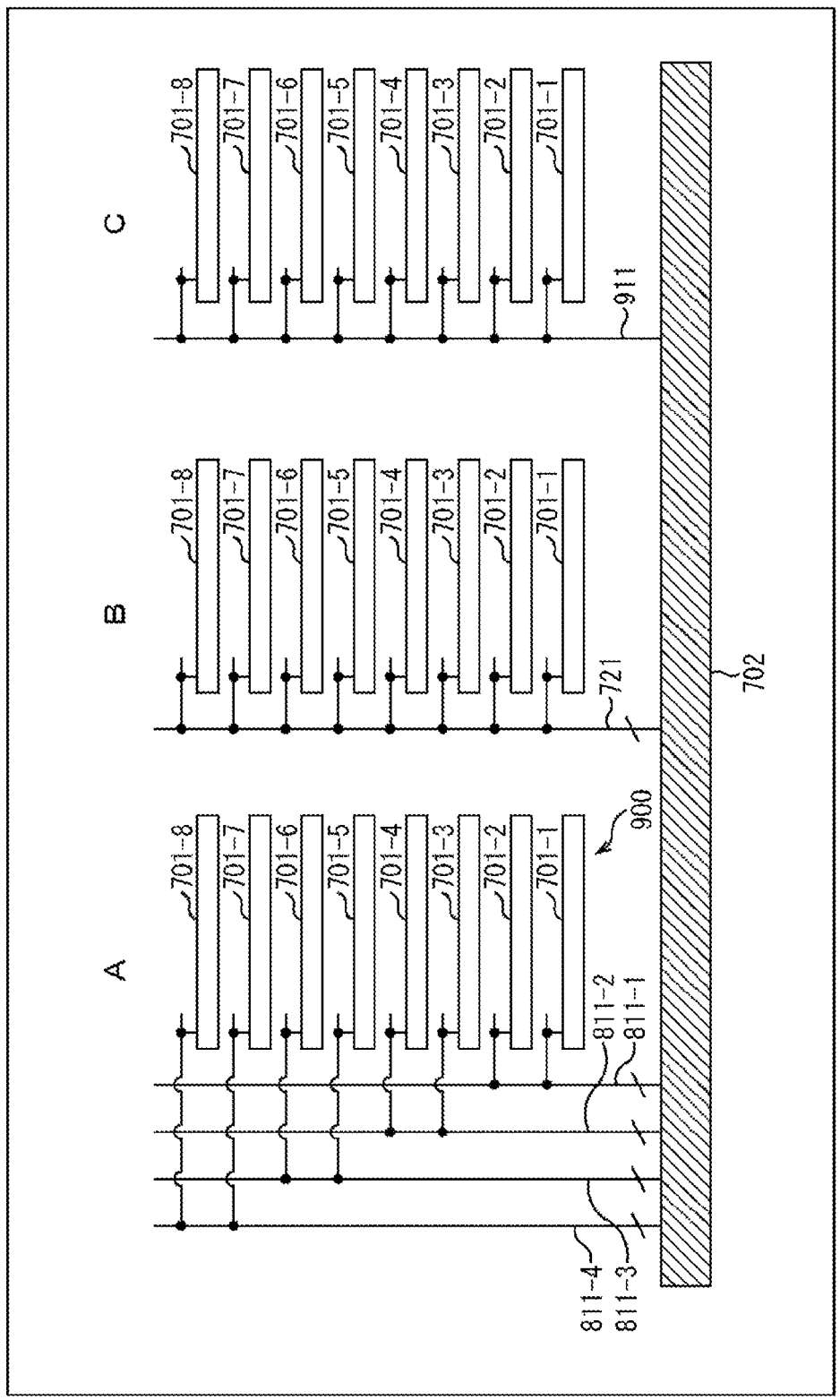
FIG. 25 Diagrams for explaining an application example with respect to the laminated memory.

With reference to FIG. 25, the laminated memory in a case where the data signal line is multiplexed by 2 will additionally be described.

FIG. 25 are similar to the laminated memory structure 800 shown in FIG. 23 in that the diagrams show a configuration of a laminated memory structure 900 in the case where the data signal line is multiplexed by 2, but differ in that the chip designation signal line transmits decoded data.

FIG. 25A is a diagram showing a wiring structure of the data signal lines, but since the wiring structure is the same as the wiring structure of the data signal lines 811 shown in FIG. 23A, descriptions thereof will be omitted. Moreover, since the wiring structure of the control signal line shown in FIG. 25B is the same as the wiring structure of the control signal line 721 shown in FIG. 23B, descriptions thereof will be omitted.

In a case where the data signal lines 811 are each multiplexed by 2 as shown in FIG. 25A and the control signal line 721 is multiplexed by 8 as shown in FIG. 25B, a chip designation signal line that transmits a selection signal for selecting the memory chips 701-1 to 701-8 to perform data writing or data reading is provided as shown in FIG. 25C.

As shown in FIG. 25C, the chip designation signal line 911 that transmits a selection signal for selecting the memory chips 701-1 to 701-8 is multiplexed by 8 and provided in common to the memory chips 701-1 to 701-8. In other words, the chip designation signal line 861 is connected to each of the memory chips 701-1 to 701-8.

The chip designation signal line 911 is a signal line that transmits 1-bit decode signals. As described above with reference to FIGS. 4 and 5, data (stack address) for causing each chip (memory chip 701) to recognize which layer it is laminated in is written, and the stack address is transmitted to the chip designation signal line 911.

However, in a case where the data signal lines 811 shown in FIG. 25 are each multiplexed by 2, 4 of the 8 memory chips 701 are selected, and higher bits, mid-higher bits, mid-lower bits, and lower bits are respectively written as described above with reference to FIG. 23, so the same stack address is written (stored) in the 4 memory chips 701 as a set of memory chips 701 to which higher bits, mid-higher bits, mid-lower bits, and lower bits are to be written.

Accordingly, 1-bit data can be used as the stack address since it is only necessary to distinguish the 2 sets of memory chips 701. For example, "0" is allocated as the stack address to the memory chip 701-1, the memory chip 701-3, the memory chip 701-5, and the memory chip 701-7, and "1" is allocated as the stack address to the memory chip 701-2, the memory chip 701-4, the memory chip 701-6, and the memory chip 701-8.

The stack addresses are allocated in this way and written in the memory chips 701 by a fuse as described above with reference to FIG. 5, for example. Further, in a case where "0" is transmitted to the chip designation signal line 911 as the stack address, for example, the memory chip 701-1, the memory chip 701-3, the memory chip 701-5, and the memory chip 701-7 determine that they have been selected and write signals respectively transmitted by the data signal lines 811-1 to 811-4.

Since the decoded data (stack address) is transmitted to the chip designation signal line 911 in this way, one signal line is enough. Accordingly, an area required for the wirings can be reduced, and the laminated memory structure 900 can be miniaturized.

In the example shown in FIG. 25, the data signal lines 811 are each multiplexed by 2, the control signal line 721 that transmits addresses and commands is multiplexed by 8, and the chip designation signal line 911 for selecting chips (memory chips 701) is multiplexed by 8. In this way, the data signal lines 811, the control signal line 721, and the chip designation signal line 911 have different multiplex degrees, and the multiplex degrees satisfy a relationship of multiplex degree of control signal line=multiplex degree of chip designation signal line>multiplex degree of data signal line.

By multiplexing the data signal lines 811, it becomes possible for the multiplexed memory chips 701 to carry out redundancy processing. For the redundancy processing, the redundancy processing described with reference to FIGS. 6 and 7 can be applied. In other words, a redundant area can be shared by the memory chip 701-1, the memory chip 701-3, the memory chip 701-5, and the memory chip 701-7, for example. Moreover, for example, when a defective row occurs in the memory chip 701-1, the shared redundant area, that is, the redundant area of the memory chip 701-3, for example, can be used in place of the defective row of the memory chip 701-1.

Accordingly, as in the case described with reference to FIG. 7, it becomes possible to minimize a yield loss due to lamination of chips and realize lowering of chip costs.

It should be noted that although the case where 8 memory chips 701 are laminated is exemplified in the descriptions above, the present technology can be applied even when laminated in layers other than 8 layers, and the application range of the present technology is not limited to 8 layers. For example, the present technology is also applicable to a configuration in which 10 memory chips 701 are laminated and multiplexed by 2, and 5 data signal lines are provided or a configuration in which 9 memory chips 701 are laminated and multiplexed by 3, and 3 data signal lines are provided.

As described above, according to this embodiment, by laminating the array device portions, it becomes possible to cope with scale expansion, and by separating a wafer of a built-in logic circuit, support of a product mask in which a function modification of only the logic circuit portion is performed becomes easy. Further, the specification of the array device portion can be made a standardized arrangement that can be used in common by difference devices.

Further, input/output pins, protection devices, input switch selection devices, and the like can be used in common even when the number of laminated array devices increases/changes. These may be formed in a wafer different from the array devices and connected to the array devices via penetrating electrodes.

Even without arranging a general ESD protection circuit on the arrays device side, as long as a compact protection diode as a countermeasure for process damages of a through-hole portion is connected, it is sufficient as a device protection function.

By forming a semiconductor device by the method as described above, devices that enable the same mask set to support various functions and specifications can be produced, and a mounting area can be reduced by miniaturization of chips. Accordingly, a reduction of costs, a reduction of development times, and the like can be realized.

<Configuration of Electronic Apparatus>

For example, the image sensor 600 described with reference to FIG. 15 is applicable to general electronic apparatuses that use an image pickup device in an image capturing unit (photoelectric conversion unit), such as an image pickup apparatus such as a digital still camera and a video camera, a mobile terminal apparatus including an image pickup function, such as a cellular phone, and a copy machine that uses an image pickup apparatus in an image reading unit.

Figure 26:
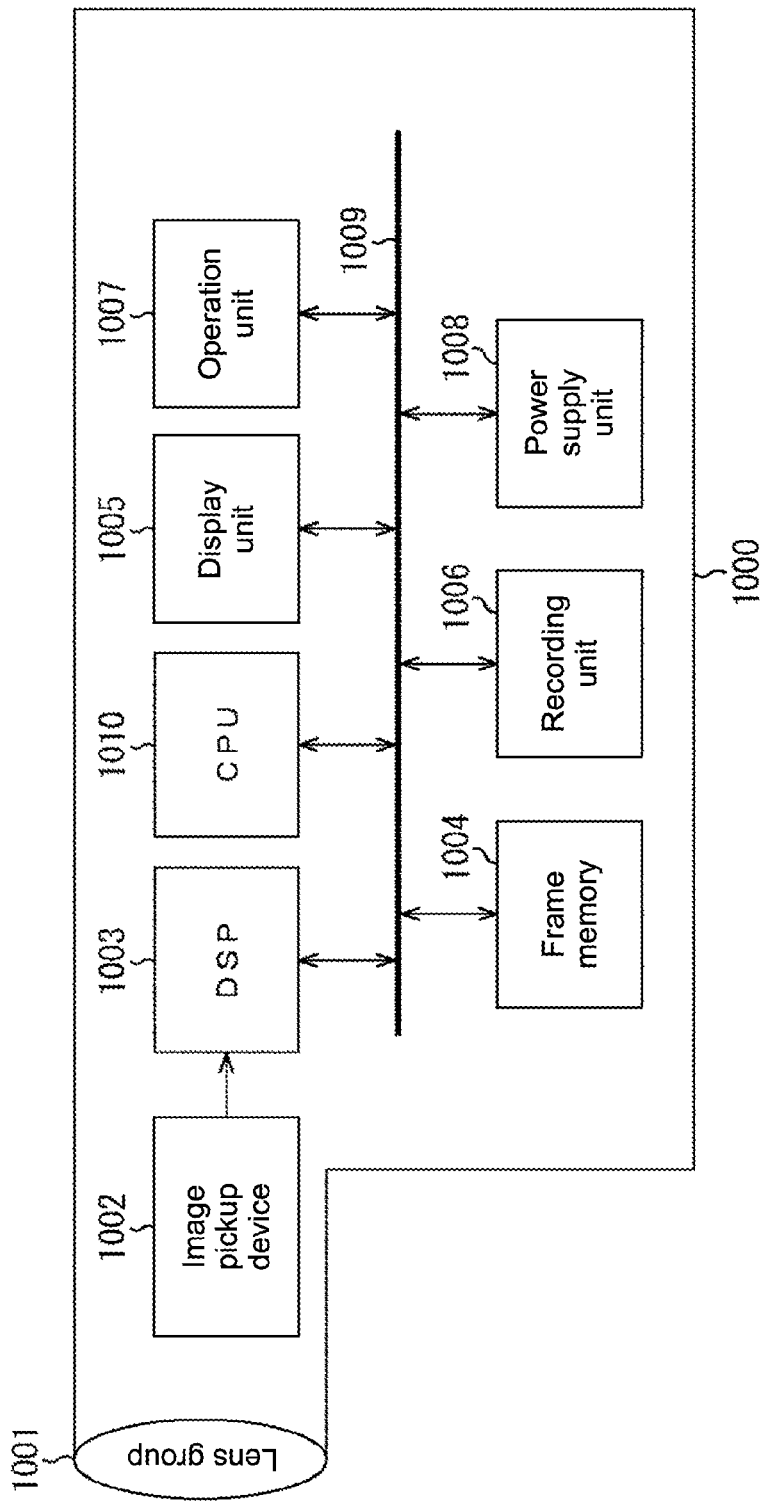
FIG. 26 A diagram for explaining an electronic apparatus.

FIG. 26 is a block diagram showing a configuration example of an electronic apparatus according to the present technology, such as an image pickup apparatus. As shown in FIG. 26, an image pickup apparatus 1000 according to the present technology includes an optical system including a lens group 1001 and the like, an image pickup device 1002, a DSP circuit 1003, a frame memory 1004, a display apparatus 1005, a recording apparatus 1006, an operation system 1007, a power supply system 1008, and the like. The DSP circuit 1003, the frame memory 1004, the display apparatus 1005, the recording apparatus 1006, the operation system 1007, and the power supply system 1008 are connected to one another via a bus line 1009.

The lens group 1001 takes in incident light (image light) from a subject and images it on an image pickup surface of the image pickup device 1002. The image pickup device 1002 converts an amount of incident light imaged on the image pickup surface by the lens group 1001 into electric signals in a pixel unit and outputs the signals as pixel signals.

The display apparatus 1005 is constituted of a panel-type display apparatus such as a liquid crystal display apparatus and an organic EL (electro luminescence) display apparatus and displays a moving image or a still image captured by the image pickup device 1002. The recording apparatus 1006 records the moving image or still image captured by the image pickup device 1002 onto a recording medium such as a DVD (Digital Versatile Disk) and an HDD (Hard disk drive).

The operation system 1007 outputs operation instructions on various functions of the image pickup apparatus on the basis of user operations. The power supply system 1008 supplies various power supplies to become operation power sources of the DSP circuit 1003, the frame memory 1004, the display apparatus 1005, the recording apparatus 1006, and the operation system 1007 to the supply targets.

The image pickup apparatus having the configuration described above can be used as an image pickup apparatus such as a video camera, a digital still camera, and a camera module for mobile apparatuses such as a cellular phone. In addition, in the image pickup apparatus, the image sensor described above can be used as the image pickup device 1002. Moreover, the chips described above can be included as the image sensor.

<Usage Example of Image Pickup Apparatus>

Figure 27:
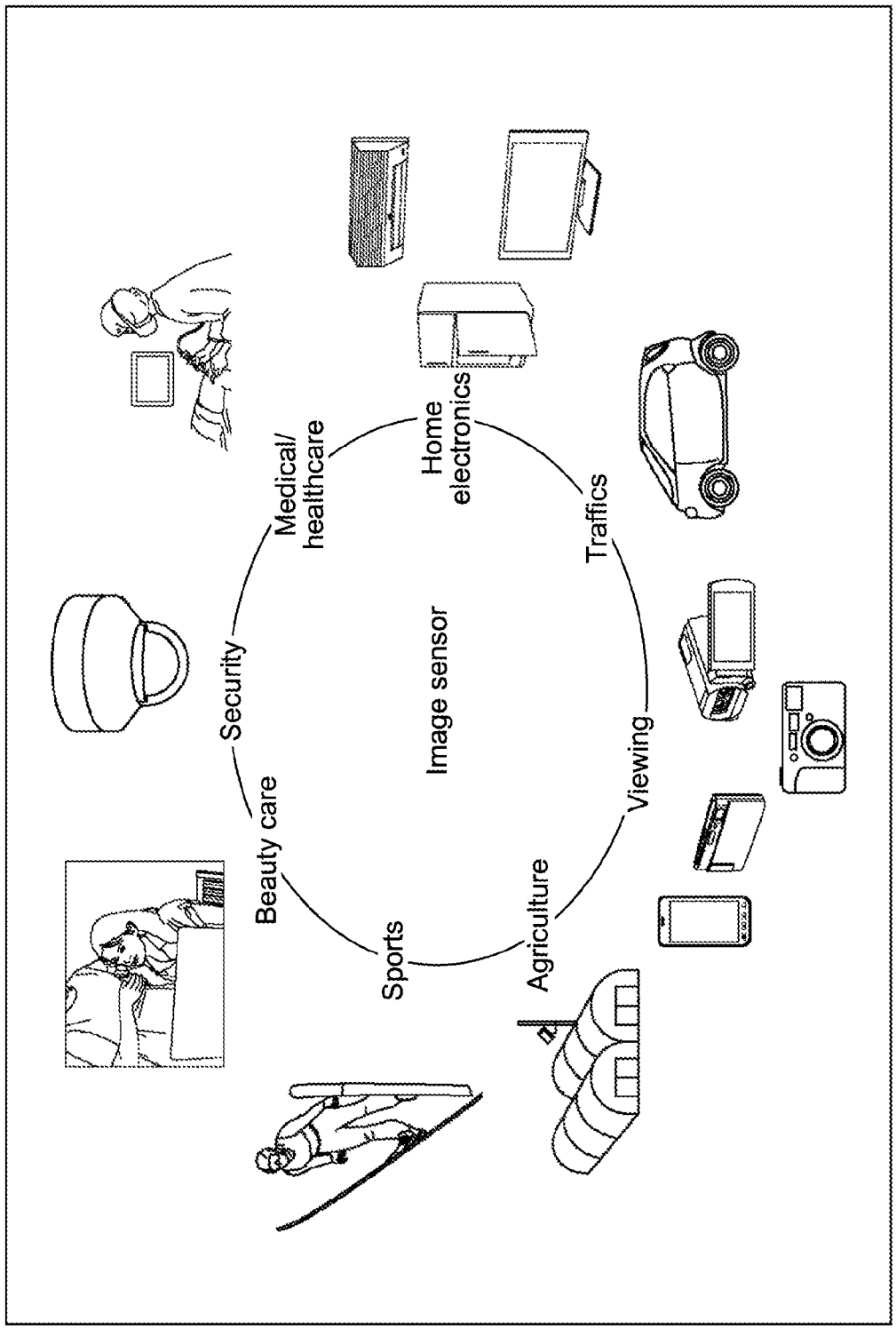
FIG. 27 A diagram for explaining a usage example.

FIG. 27 is a diagram showing a usage example that uses the image sensor 600 (image pickup device) described above or an electronic apparatus including the image pickup device.

The image pickup device described above can be used in various cases of sensing light such as visible light, infrared light, ultraviolet light, and X-rays as follows.

- An apparatus for photographing images to be viewed, such as a digital camera and a camera-equipped mobile apparatus
- An apparatus used for traffic purposes, such as a car-mounted camera that photographs front/rear/periphery/inside of an automobile, a surveillance camera that monitors running vehicles and roads, and a distance measurement sensor that measures distances among vehicles, for safe driving such as automatic stop, recognition of a driver's state, and the like
- An apparatus used in home electronics such as a TV, a refrigerator, and an air conditioner, for photographing gestures of users and executing apparatus operations according to the gestures
- An apparatus used for medical and healthcare purposes, such as an endoscope and an apparatus that performs blood vessel photographing by receiving infrared light
- An apparatus used for security purposes, such as a surveillance camera for crime-prevention purposes and a camera for person authentication purposes
- An apparatus used for beauty care purposes, such as a skin measurement apparatus that photographs skins and a microscope that photographs scalps
- An apparatus used for sports purposes, such as an action camera and a wearable camera for sports purposes
- An apparatus for agriculture purposes, such as a camera for monitoring a state of fields and crops It should be noted that the effects described in the specification are mere examples and are not limited thereto, any other effects may be obtained.

It should be noted that the embodiment of the present technology is not limited to the embodiment described above and can be variously modified without departing from the gist of the present technology.

It should be noted that the present technology may also take the following configurations.

(1) A semiconductor apparatus that is laminated and integrated with a plurality of semiconductor apparatuses, including:
  a first penetrating electrode for connecting with the other semiconductor apparatuses; and
  a second penetrating electrode that connects the first penetrating electrode and an internal device,
  the second penetrating electrode being arranged at a position that differs for each of the laminated semiconductor apparatuses.

(2) The semiconductor apparatus according to (1), in which
  the second penetrating electrode indicates a lamination position at a time of lamination.

(3) The semiconductor apparatus according to (1) or (2), in which
  an address of each of the laminated semiconductor apparatuses in a lamination direction is identified by writing using external signals after lamination.

(4) The semiconductor apparatus according to any one of (1) to (3), in which
  an address in a lamination direction is written by external signals using a combination of a fuse or anti-fuse device of the semiconductor apparatus and the second penetrating electrode.

(5) The semiconductor apparatus according to any one of (1) to (4), in which
  the semiconductor apparatus is laminated in a wafer state and segmentalized after the first penetrating electrode and the second penetrating electrode are formed.

(6) The semiconductor apparatus according to any one of (1) to (5), in which
  the semiconductor apparatus is a memory, and
  a bit position is identified by a combination of a Z address indicating a lamination position of each of the laminated semiconductor apparatuses and an XY address used in the memory.

(7) The semiconductor apparatus according to (6), in which
  a storage area and a redundant area are shared by the plurality of laminated semiconductor apparatuses.

(8) The semiconductor apparatus according to any one of (1) to (5), in which
  the semiconductor apparatus is an FPGA (Programmable Logic Array), and
  an arrangement of logic elements for writing a circuit function is specified by an XY address for specifying a position in the semiconductor apparatus and a Z address for specifying a position among the semiconductor apparatuses.

(9) The semiconductor apparatus according to (8), in which
  wiring arrays in a lamination direction are connected via a penetrating electrode to which a programmable selection switch is added, and a network connection in a 3D direction is configured in a logic element unit.

(10) The semiconductor apparatus according to (8), further including
  a switch that controls a flow of signals within the semiconductor apparatus, and
  a switch that controls a flow of signals among the laminated semiconductor apparatuses.

(11) The semiconductor apparatus according to any one of (1) to (10), in which
  the semiconductor apparatus is laminated with a semiconductor apparatus in which an external connection terminal and a protection device are formed,
  the laminated semiconductor apparatuses are mutually connected by the first penetrating electrode, and
  the external connection terminal and the protection device are shared by the plurality of laminated semiconductor apparatuses.

(12) The semiconductor apparatus according to any one of (1) to (10), in which
  an image pickup device is laminated,
  the semiconductor apparatus is a memory that stores data of signals captured by the image pickup device,
  the memory is laminated plurally below the image pickup device, and
  a processing unit that processes signals from the memories is laminated below the memories.

(13) A semiconductor apparatus, including
  a plurality of planar configurable logic arrays laminated in a direction orthogonal to the plane,
  the configurable logic arrays each including
    a logic element,
    a unit wiring arranged in a longitudinal direction and a lateral direction within the plane, and
    a first switch that connects and disconnects the unit wiring arranged in the longitudinal direction and the lateral direction,
  a repeating unit including the logic element, the unit wiring, and the first switch being repetitively arranged in the longitudinal direction and the lateral direction within the plane,
  in the repeating unit,
  the configurable logic array further including a second switch that connects and disconnects the unit wiring in the repeating unit and the unit wiring in the repeating unit, that is included in another configurable logic array adjacent to the configurable logic array in the orthogonal direction, and
  a logic circuit being configured in a 3D direction constituted of the plane direction and the orthogonal direction via both the first switch and the second switch.

(14) A production method for producing a semiconductor apparatus that is laminated and integrated with a plurality of semiconductor apparatuses, the method including the step of
  forming a first penetrating electrode for connecting with the other semiconductor apparatuses and a second penetrating electrode that connects the first penetrating electrode and an internal device,
  the second penetrating electrode being formed at a position that differs for each of the laminated semiconductor apparatuses.

(15) An electronic apparatus, including
  a semiconductor apparatus that is laminated and integrated with a plurality of semiconductor apparatuses, the semiconductor apparatus including
    a first penetrating electrode for connecting with the other semiconductor apparatuses; and
    a second penetrating electrode that connects the first penetrating electrode and an internal device,
    the second penetrating electrode being arranged at a position that differs for each of the laminated semiconductor apparatuses.

(16) A semiconductor apparatus, including:
  a plurality of laminated semiconductor apparatuses;
  a data signal line used to transmit/receive data to/from the semiconductor apparatuses; and a control signal line used to transmit/receive an address to/from the semiconductor apparatuses, the data signal line and the control signal line being multiplexed, and a multiplex degree of the data signal line being lower than that of the control signal line.

(17) The semiconductor apparatus according to (16), further including a chip designation signal line used to transmit/receive a selection signal for selecting a semiconductor apparatus to perform data transmission/reception out of the plurality of semiconductor apparatuses, in which the chip designation signal line is multiplexed, and a multiplex degree of the chip designation signal line is equal to or lower than that of the control signal line.

(18) The semiconductor apparatus according to (17), in which each of the plurality of semiconductor apparatuses stores an address in a lamination direction allocated thereto, and the chip designation signal line is used to transmit/receive the decoded address in the lamination direction.

(19) The semiconductor apparatus according to (16) or (17), in which the semiconductor apparatus is a memory, the memory is laminated in 8 layers, and the memories are each multiplexed by 4, and the memories of 2 layers out of the memories of 8 layers are driven at the same time.

(20) The semiconductor apparatus according to any one of (16) to (19), further including for the data signal line, a first penetrating electrode for connecting with the other semiconductor apparatuses, and a second penetrating electrode for connecting with the first penetrating electrode, the second penetrating electrode being arranged at a position that differs for each of the semiconductor apparatuses to which different data are supplied.

REFERENCE SIGNS LIST 10 logic circuit chip
20, 30 memory chip
51-54 penetrating electrode
60 chip
61 penetrating electrode
62 surface wiring
63 back-surface wiring
64 device
65 penetrating electrode
66 surface wiring
67 penetrating electrode
68 back-surface wiring
69 device
70 chip
71 penetrating electrode
72 surface wiring
73 penetrating electrode
74 back-surface wiring
75 device
76 penetrating electrode
77 surface wiring
78 back-surface wiring
79 device
80 chip
81 penetrating electrode
82 surface wiring
83 back-surface wiring
84 device
85 penetrating electrode
86 surface wiring
87 back-surface wiring
88 device
301-304 FPGA chip
311 selection switch
312 CLB
313 Z-axis direction selection switch
321 selection switch
322 CLB
323 Z-axis direction selection switch
324 Z-axis direction selection switch
700 laminated memory
701 memory
711 data signal line
721 control signal line
731 chip designation signal line

What is claimed is:

1. A semiconductor apparatus, comprising:
a first chip, including:
a plurality of first penetrating electrodes; and
a second penetrating electrode, wherein the second penetrating electrode connects a first one of the first penetrating electrodes and an internal device of the first chip; and
a second chip, including:
a plurality of first penetrating electrodes; and
a second penetrating electrode, wherein the second penetrating electrode connects a second one of the first penetrating electrodes and an internal device of the second chip,
wherein the first chip is directly connected to, laminated on and integrated with the second chip,
wherein the first one of the first penetrating electrodes of the first chip is connected to a first one of the first penetrating electrodes of the second chip,
wherein a second one of the first penetrating electrodes of the first chip is connected to the second one of the first penetrating electrodes of the second chip,
wherein the second one of the first penetrating electrodes of the second chip is not connected to the first one of the first penetrating electrodes of the first chip,
wherein the first one of the first penetrating electrodes of the first chip and the first one of the first penetrating electrodes of the second chip taken together are connected to no more than one of the second penetrating electrodes,
wherein the second penetrating electrode of the first chip and the second penetrating electrode of the second chip are arranged at different positions, and
wherein no more than one second penetrating electrode that connects to an internal device is provided in each of the first chip and the second chip in a cross-sectional view.

2. The semiconductor apparatus according to claim 1, wherein
the second penetrating electrode of the first chip indicates a lamination position at a time of lamination.

3. The semiconductor apparatus according to claim 1, wherein
an address of each of the laminated chips in a lamination direction is identified by writing using external signals after lamination.

4. The semiconductor apparatus according to claim 1, wherein an address in a lamination direction is written by external signals using a combination of a fuse or anti-fuse device of the semiconductor apparatus and the second penetrating electrode.

5. The semiconductor apparatus according to claim 1, wherein
the semiconductor apparatus is laminated in a wafer state and segmentalized after the first penetrating electrodes and the second penetrating electrodes are formed.

6. The semiconductor apparatus according to claim 1, wherein
the semiconductor apparatus is a memory, and
a bit position is identified by a combination of a Z address indicating a lamination position of each of the laminated chips and an XY address used in the memory.

7. The semiconductor apparatus according to claim 1, wherein
the semiconductor apparatus is an FPGA (Programmable Logic Array), and
an arrangement of logic elements for writing a circuit function is specified by an XY address for specifying a position in the semiconductor apparatus and a Z address for specifying a position among the chips.

8. The semiconductor apparatus according to claim 7, wherein
wiring arrays in a lamination direction are connected via a penetrating electrode to which a programmable selection switch is added, and a network connection in a 3D direction is configured in a logic element unit.

9. The semiconductor apparatus according to claim 7, further comprising
a switch that controls a flow of signals within the semiconductor apparatus, and
a switch that controls a flow of signals among the chips.

10. The semiconductor apparatus according to claim 1, wherein
the semiconductor apparatus is laminated with a semiconductor apparatus in which an external connection terminal and a protection device are formed,
the laminated semiconductor apparatuses are mutually connected by the first penetrating electrode, and
the external connection terminal and the protection device are shared by the plurality of laminated semiconductor apparatuses.

11. The semiconductor apparatus according to claim 1, wherein
an image pickup device is laminated,
the semiconductor apparatus is a memory that stores data of signals captured by the image pickup device,
the memory is laminated plurally below the image pickup device, and
a processing unit that processes signals from the memories is laminated below the memories.

12. The semiconductor apparatus according to claim 1, wherein each of the first chip and the second chip has only one secondary electrode.

13. The semiconductor apparatus according to claim 1, wherein an arrangement of the first chip is asymmetrical with an arrangement of the second chip.

14. The semiconductor apparatus according to claim 1, wherein the second penetrating electrode of the first chip and the second penetrating electrode of the second chip each contacts an underside of the internal devices.

15. A production method for producing a semiconductor apparatus, the method comprising:
forming a plurality of first penetrating electrodes in a first chip for directly connecting with a second chip and a second penetrating electrode that connects a first one of the first penetrating electrodes and an internal device of the first chip;
forming a plurality of first penetrating electrodes in the second chip for connecting with the first chip and a second penetrating electrode that connects a second one of the first penetrating electrodes and an internal device of the second chip,
wherein the first one of the first penetrating electrodes of the first chip and a first one of the first penetrating electrodes of the second chip taken together are connected to no more than one of the second penetrating electrodes,
wherein the second penetrating electrodes are formed at positions that differ for each of the first and second chips, and
wherein no more than one second penetrating electrode that connects to an internal device is provided in each of the first chip and the second chip in a cross-sectional view.

16. The production method for producing a semiconductor apparatus according to claim 15, wherein each of the first chip and the second chip has only one secondary electrode.

17. The production method for producing a semiconductor apparatus according to claim 15, wherein an arrangement of the first chip is asymmetrical with an arrangement of the second chip.

18. An electronic apparatus, comprising
a semiconductor apparatus, including:
a first chip, including:
a plurality of first penetrating electrodes; and
a second penetrating electrode, wherein the second penetrating electrode connects a first one of the first penetrating electrodes and an internal device of the first chip; and
a second chip, including:
a plurality of first penetrating electrodes; and
a second penetrating electrode, wherein the second penetrating electrode connects a second one of the first penetrating electrodes and an internal device of the second chip,
wherein the first chip is directly connected to, laminated on and integrated with the second chip,
wherein the first one of the first penetrating electrodes of the first chip is connected to a first one of the first penetrating electrodes of the second chip,
wherein a second one of the first penetrating electrodes of the first chip is connected to the second one of the first penetrating electrodes of the second chip,
wherein the second one of the first penetrating electrodes of the second chip is not connected to the first one of the first penetrating electrodes of the first chip,
wherein the first one of the first penetrating electrodes of the first chip and the first one of the first penetrating electrodes of the second chip taken together are connected to no more than one of the second penetrating electrodes,
wherein the second penetrating electrode of the first chip and the second penetrating electrode of the second chip are arranged at different positions, and
wherein no more than one second penetrating electrode that connects to an internal device is provided in each of the first chip and the second chip in a cross-sectional view.

19. The electronic apparatus according to claim 18, wherein each of the first chip and the second chip has only one secondary electrode.

20. The electronic apparatus according to claim 18, wherein an arrangement of the first chip is asymmetrical with an arrangement of the second chip.

* * * * *